(12) United States Patent
Kono et al.

(10) Patent No.: US 9,780,526 B2
(45) Date of Patent: *Oct. 3, 2017

(54) SEMICONDUCTOR-LASER-DEVICE ASSEMBLY

(71) Applicant: Sony Corporation, Tokyo (JP)

(72) Inventors: Shunsuke Kono, Kanagawa (JP); Masaru Kuramoto, Kanagawa (JP); Rintaro Koda, Tokyo (JP)

(73) Assignee: Sony Corporation, Tokyo (JP)

( * ) Notice: Subject to any disclaimer, the term of this patent is extended or adjusted under 35 U.S.C. 154(b) by 46 days.

This patent is subject to a terminal disclaimer.

(21) Appl. No.: 14/933,664

(22) Filed: Nov. 5, 2015

(65) Prior Publication Data
US 2016/0111857 A1 Apr. 21, 2016

Related U.S. Application Data

(62) Division of application No. 14/264,773, filed on Apr. 29, 2014, now Pat. No. 9,184,560.

(30) Foreign Application Priority Data

May 9, 2013 (JP) .................... 2013-099177

(51) Int. Cl.
*H01S 3/098* (2006.01)
*H01S 5/065* (2006.01)
(Continued)

(52) U.S. Cl.
CPC .......... *H01S 5/0657* (2013.01); *H01S 3/2308* (2013.01); *H01S 5/0602* (2013.01);
(Continued)

(58) Field of Classification Search
CPC .... H01S 5/0657; H01S 5/065; H01S 5/34333; H01S 5/343; H01S 5/50; H01S 5/141;
(Continued)

(56) References Cited

U.S. PATENT DOCUMENTS 9,184,560 B2 * 11/2015 Kono .................... H01S 3/2308
9,219,346 B2 * 12/2015 Kono .................... B82Y 20/00
(Continued)

FOREIGN PATENT DOCUMENTS

EP 2403081 1/2012
EP 2458750 5/2012
(Continued)

OTHER PUBLICATIONS

P. J. Delfyett et al., "Generation of High-Power Femtosecond Optical Pulses from a Semiconductor Diode Laser System," OSA Proceedings on Picosecond Electronics and Optoelectronics, Proceedings of the Topical Meeting, Mar. 13-15, 1991. (4 pages).
(Continued)

*Primary Examiner* — Kinam Park
(74) *Attorney, Agent, or Firm* — K&L Gates LLP

(57) ABSTRACT

A semiconductor-laser-device assembly includes a mode-locked semiconductor-laser-element assembly including a mode-locked semiconductor laser element, and a dispersion compensation optical system, on which laser light emitted from the mode-locked semiconductor laser element is incident and from which the laser light is emitted; and a semiconductor optical amplifier having a layered structure body including a group III-V nitride-based semiconductor layer, the semiconductor optical amplifier configured to amplify the laser light emitted from the mode-locked semiconductor-laser-element assembly.

20 Claims, 41 Drawing Sheets

(51) Int. Cl.
*H01S 5/343* (2006.01)
*H01S 5/50* (2006.01)
*H01S 5/14* (2006.01)
*H01S 5/06* (2006.01)
*H01S 5/40* (2006.01)
*H01S 3/23* (2006.01)
*H01S 3/08* (2006.01)
*H01S 5/00* (2006.01)
*H01S 5/10* (2006.01)
*H01S 5/22* (2006.01)

(52) U.S. Cl.
CPC .............. *H01S 5/065* (2013.01); *H01S 5/14* (2013.01); *H01S 5/141* (2013.01); *H01S 5/343* (2013.01); *H01S 5/34333* (2013.01); *H01S 5/40* (2013.01); *H01S 5/50* (2013.01); *H01S 3/08004* (2013.01); *H01S 3/08009* (2013.01); *H01S 5/0057* (2013.01); *H01S 5/0078* (2013.01); *H01S 5/101* (2013.01); *H01S 5/1085* (2013.01); *H01S 5/143* (2013.01); *H01S 5/22* (2013.01)

(58) Field of Classification Search
CPC ...... H01S 5/14; H01S 3/2308; H01S 3/08004; H01S 3/08009
USPC .............. 372/18, 102, 101, 100, 99, 92
See application file for complete search history.

(56) References Cited

U.S. PATENT DOCUMENTS

| | | | |
|---|---|---|---|
| 2004/0190567 A1* | 9/2004 | Lutgen | H01S 3/1118 372/25 |
| 2011/0134433 A1 | 6/2011 | Yamada | |
| 2011/0150010 A1 | 6/2011 | Huang et al. | |
| 2012/0002696 A1 | 1/2012 | Oki et al. | |
| 2012/0134011 A1* | 5/2012 | Fujiwara | H01S 3/0057 359/326 |

FOREIGN PATENT DOCUMENTS

| | | |
|---|---|---|
| JP | 2004-253800 | 9/2004 |
| JP | 2012-094622 | 5/2012 |
| JP | 2012-118270 | 6/2012 |
| JP | 2012-204372 | 10/2012 |
| JP | 2013-074001 | 4/2013 |
| JP | 2013-074002 | 4/2013 |
| JP | 2013-105813 | 5/2013 |
| JP | 2014-006438 | 1/2014 |

OTHER PUBLICATIONS

Bojan Resan et al., "Up or down chirping—a recipe to generate sub-200 fs pulses from a dispersion-managed semiconductor laser," Conference on Lasers and Electro-Optics San Francisco, CA, US, May 16, 2004. (3 pages).

Shunsuke Kono, et al.,"200-fs pulse generation from a GaInN semiconductor laser diode passively mode-locked in a dispersion-compensated external cavity," American Institute of Physics, Applied Physics Letters 101, 081121 (2012). (4 pages).

Mo Xia et al., External-Cavity Mode-Locked Quantum-Dot Laser Diodes for Low Repetition Rate, Sub-Picosecond Pulse Generation, IEEE Journal of Selected Topics in Quantum Electronics, vol. 17, No. 5, Sep./Oct. 2011. (8 pages).

A. Garnache et al., "Sub-500-fs soliton-like pulse in a passively mode-locked broadband surface-emitting laser with 100 mW average power," Applied Physics Letters, vol. 80, No. 21, May 27, 2002. (3 pages).

Rintaro Koda et al., "High peak power picoseconds optical pulse generation from GaInN semiconductor diode lasers," Invited Paper, Proceedings of SPIE, vol. 7953. (7 pages).

European Patent Office, Extended European Search Report issued in connection with European Patent Application No. 14001533.0, dated Oct. 9, 2014. (13 pages).

Tsung-Yuan Yang et al., "Femtosecond laser pulse compression using volume phase transmission holograms," Applied Optics, vol. 24, No. 13, pp. 2021-2023, Jul. 1, 1985. (3 pages).

S. Hughes and T. Kobayashi, "Ultrafast carrier-carrier scattering in wide-gap GaN semiconductor laser devices," Semiconductor Science and Technology, vol. 12, No. 6, pp. 733-736. (4 pages).

Tobias Schlauch, et al.,"Femtosecond passively modelocked diode laser with intracavity dispersion management," Optics Express, vol. 18, No. 23, pp. 24316-24324, Nov. 8, 2010. (9 pages).

Japanese Office Action issued Nov. 22, 2016 in corresponding Japanese Application No. 2013-099177.

Japanese Office Action issued Feb. 1, 2017 in corresponding Japanese Application No. 2013-099177.

* cited by examiner

TOTAL REFLECTION

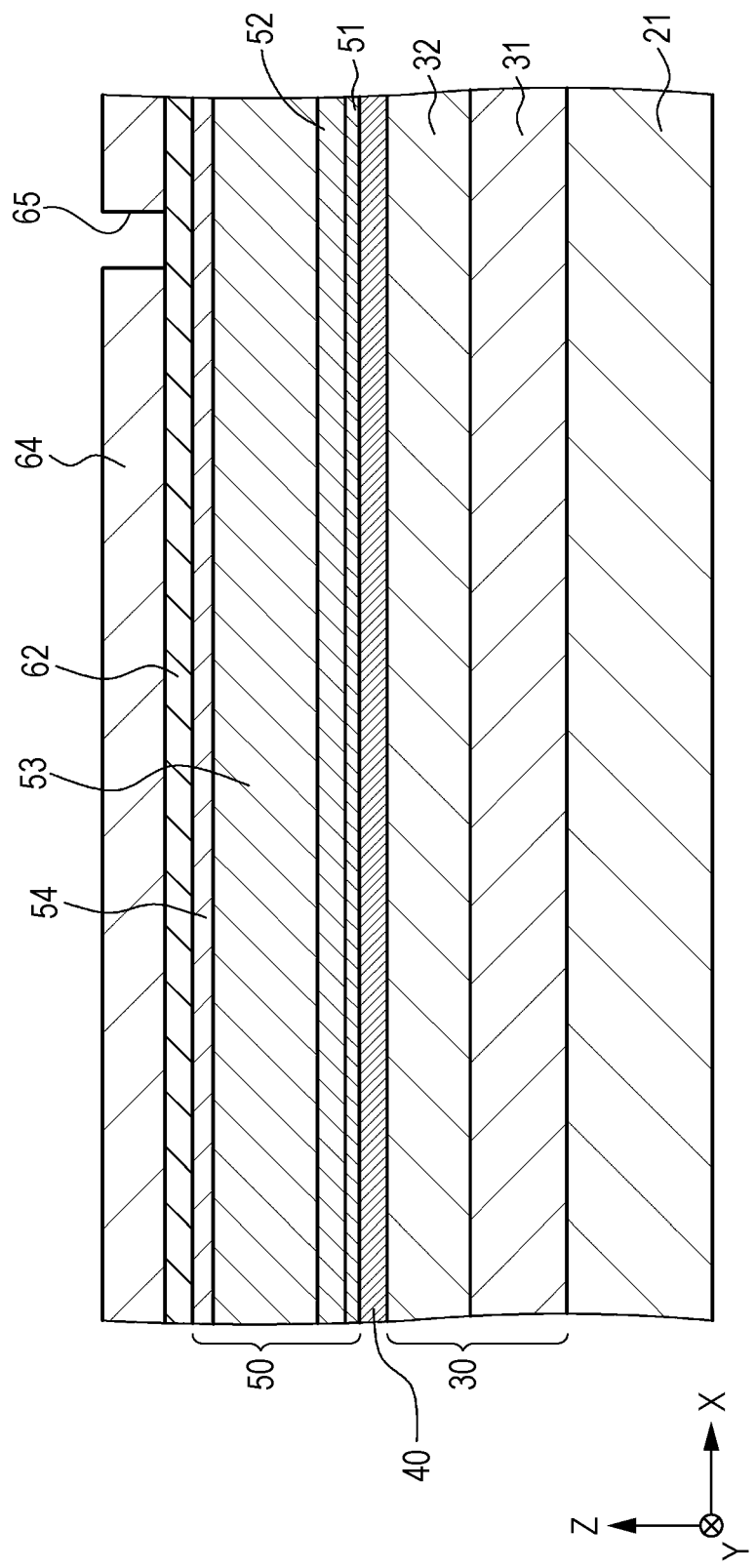

SEMICONDUCTOR-LASER-DEVICE ASSEMBLY

CROSS REFERENCES TO RELATED APPLICATIONS

The present application is a divisional of U.S. application Ser. No. 14/264,773, filed Apr. 29, 2014, which claims priority to Japanese Priority Patent Application JP 2013-099177 filed in the Japan Patent Office on May 9, 2013, the entire content of which is hereby incorporated by reference.

BACKGROUND

The present disclosure relates to a semiconductor-laser-device assembly including a semiconductor laser element and a semiconductor optical amplifier.

A laser device that generates pulsed laser light with a time width in the picosecond or femtosecond order is called ultrashort optical pulse laser device. In the following description, "laser light" represents pulsed laser light unless otherwise noted. The energy of light is concentrated in an extremely short period of time in case of laser light generated by such a laser device. Hence, the energy provides a high steepled-shape power (peak power), which may not be provided by continuous laser light. The laser light with the high peak power exhibits a nonlinear interaction with respect to a substance. Accordingly, application, which may not be provided by normal continuous laser light, is available. An example is application to a nonlinear optical effect. For specific example, application may be made on three-dimensional microscopic measurement or micromachining by using a multiphoton absorption effect.

In the past, a solid-state laser device represented by a titanium-sapphire laser device has been mainly used as an ultrashort optical pulse laser device. A solid-state laser device of related art frequently uses a large resonator as about 1 m. Also, another solid-state laser device has to be used for oscillating continuous laser light for excitation, resulting in low energy efficiency. In addition, it is difficult to keep mechanical strength for a large resonator, and maintenance expects professional knowledge.

As an ultrashort light pulse laser device that addresses the problems of the solid-state laser device, a semiconductor laser element, which uses a semiconductor as a gain medium, is developed. Since a semiconductor is used, the resonator can be easily decreased in size. Also, mechanical stableness can be easily attained as the result of the decrease in size. Accordingly, maintenance, which expects high technical skill, can be facilitated. Also, since a semiconductor can be directly excited by current injection, the energy efficiency can be increased.

There is provided a mode-locking method as a method of generating laser light with a time width of about several picoseconds by using a semiconductor laser element. The mode-locking method includes active mode-locking that modulates a gain or a loss with the same period as a periodic time of a resonator, and passive mode-locking that enables operation by providing an element indicating a nonlinear optical response such as a saturable absorber in a resonator. Among these methods, the passive mode-locking is suitable for generating laser light with a time width of about several picoseconds. To generate an ultrashort pulse by the passive mode-locking, a saturable absorber is provided typically in a laser resonator. In a mode-locked semiconductor laser element based on the passive mode-locking (hereinafter, merely referred to as "mode-locked semiconductor laser element"), a p-side electrode of the mode-locked semiconductor laser element is divided into a gain portion and a saturable absorption portion (SA portion). Such a mode-locked semiconductor laser element is called "multi-electrode mode-locked semiconductor laser element." When a forward bias current flows to the p-side electrode in the gain portion, a gain of a laser oscillator is generated. In contrast, when a reverse bias voltage is applied to the p-side electrode of the saturable absorption portion, the saturable absorption portion is operated as a saturable absorber. Then, when the reverse bias voltage is controlled, a recovery time for saturated absorption can be adjusted. Accordingly, the pulse width of laser light to be generated can be controlled. As described above, the multi-electrode mode-locked semiconductor laser element has an advantage in which the gain portion and the saturable absorption portion can be electrically controlled. The saturable absorption portion is made of a gain medium in a waveguide. Hence, as the result of that laser light is efficiently confined in the waveguide, absorption can be easily saturated with small energy. Therefore, it is difficult to obtain a large output with the multi-electrode mode-locked semiconductor laser element.

In this situation, a system called "master oscillator power amplifier (MOPA)" is effective. MOPA amplifies an ultrashort pulse output from the mode-locked semiconductor laser element by using a semiconductor optical amplifier (SOA). The semiconductor optical amplifier mentioned herein does not convert an optical signal into an electric signal, but directly amplifies light. The semiconductor optical amplifier has a laser structure from which a resonator effect is eliminated as possible, and amplifies incident light based on an optical gain of the semiconductor optical amplifier. With this method, laser light with a time width of several picoseconds emitted from the mode-locked semiconductor laser element is amplified by the semiconductor optical amplifier, and hence the pulse energy is increased.

SUMMARY

To obtain a higher peak power, laser light incident on the semiconductor optical amplifier has to be compressed and output. In the past, the pulse time width of laser light is compressed and the peak power is increased by using a pulse compressor including a diffraction grating etc. (for example, see T. Schlauch et al., Optics Express, Vol. 18, p 24136 (2010)). However, with such a method, since the pulse compressor is used, the semiconductor-laser-device assembly may be complicated, and the manufacturing cost may be increased.

Accordingly, it is desirable to provide a semiconductor-laser-device assembly which does not use a pulse compressor that compresses the pulse time width of laser light emitted from a mode-locked semiconductor laser element and being incident on a semiconductor optical amplifier.

According to an embodiment of the present disclosure, there is provided a semiconductor-laser-device assembly including a mode-locked semiconductor-laser-element assembly having a mode-locked semiconductor laser element, and a dispersion compensation optical system, on which laser light emitted from the mode-locked semiconductor laser element is incident and from which the laser light is emitted; and a semiconductor optical amplifier having a layered structure body including a group III-V nitride-based semiconductor layer, the semiconductor optical amplifier configured to amplify the laser light emitted from the mode-locked semiconductor-laser-element assembly.

Since the semiconductor-laser-device assembly of the present disclosure includes the dispersion compensation optical system, the chirp state of the laser light and the expansion state of the pulse of the laser light emitted from the mode-locked semiconductor-laser-element assembly including the mode-locked semiconductor laser element and the dispersion compensation optical system can be optimized. Also, as the result of that the laser light with the chirp state and the expansion state of the pulse being optimized is incident on the semiconductor optical amplifier having the layered structure body including the group III-V nitride-based semiconductor layer, the laser light output from the semiconductor optical amplifier is amplified and also compressed. Consequently, the semiconductor-laser-device assembly that outputs laser light with a very high peak power without the pulse compressor, that is small, and that has a simple configuration can be provided. Also, since the pulse compressor does not have to be provided, an optical loss caused by the pulse compressor is not generated. The advantageous effects described in this specification are merely examples. The advantageous effects of the present disclosure are not limited to such advantageous effects, and may have other additional advantageous effects.

Additional features and advantages are described herein, and will be apparent from the following Detailed Description and the figures.

BRIEF DESCRIPTION OF THE FIGURES

FIG. 45 is a schematic partial end view of the substrate etc. for explaining the manufacturing method of the mode-locked semiconductor laser element of Embodiment 1 continued from FIG. 44B.

DETAILED DESCRIPTION

Figure 1:
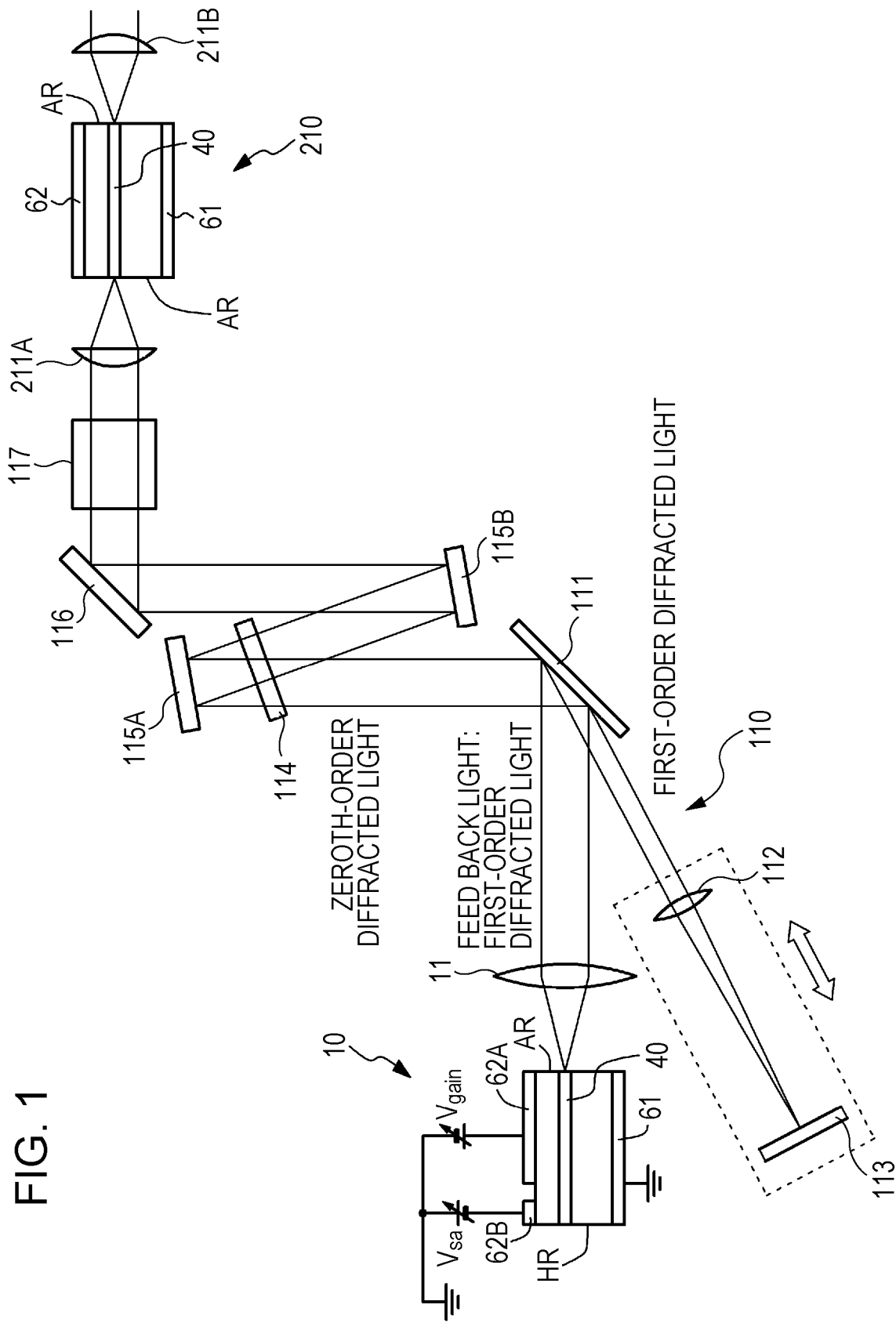
FIG. 1 is a conceptual diagram of a semiconductor-laser-device assembly of Embodiment 1.

The present disclosure is described below based on embodiments with reference to the drawings. However, the present disclosure is not limited to the embodiments, and various numerical values and materials in the embodiments are mere examples. The explanation is given in the order as follows.

1. Explanation Relating to Overview of Semiconductor-laser-device Assembly of the Present Disclosure 2. Embodiment 1 (Semiconductor-laser-device Assembly of the Present Disclosure)

3. Embodiment 2 (Modification of Embodiment 1)

4. Embodiment 3 (Modification of Embodiment 1 or Embodiment 2, Modification of Dispersion Compensation Optical System)

5. Embodiment 4 (Modification of Embodiment 1 or Embodiment 2, Dispersion Compensation Optical Device According to First Form/Dispersion Compensation Optical Device etc.-A)

6. Embodiment 5 (Modification of Embodiment 4, Dispersion Compensation Optical Device etc.-B)

7. Embodiment 6 (Modification of Embodiment 4, Dispersion Compensation Optical Device etc.-C)

8. Embodiment 7 (Modification of Embodiment 4, Dispersion Compensation Optical Device etc.-D)

9. Embodiment 8 (Modification of Any of Embodiment 4, Embodiment 5, and Embodiment 7)

10. Embodiment 9 (Another Modification of Embodiment 1 or Embodiment 2, Dispersion Compensation Optical Device According to Second Form)
11. Embodiment 10 (Another Modification of Embodiment 1 or Embodiment 2, Dispersion Compensation Optical Device According to Third Form)
12. Embodiment 11 (Modification of Any of Embodiment 1 to Embodiment 10, Modification of Semiconductor Optical Amplifier)
13. Embodiment 12 (Modification of Embodiment 11)
14. Embodiment 13 (Another Modification of Embodiment 11 or Embodiment 12)
15. Embodiment 14 (Another Modification of Any of Embodiment 1 to Embodiment 10, Modification of Semiconductor Optical Amplifier)
16. Embodiment 15 (Modification of Any of Embodiment 1 to Embodiment 14, Modification of Mode-locked Semiconductor Laser Element), Other Configuration

[Explanation Relating to Overview of Semiconductor-Laser-Device Assembly of the Present Disclosure]

In a semiconductor-laser-device assembly of the present disclosure, $\tau_1 > \tau_2$ may be established where $\tau_1$ is a pulse time width of laser light incident on a semiconductor optical amplifier and $\tau_2$ is a pulse time width of the laser light output from the semiconductor optical amplifier, and a value of $\tau_2$ may decrease as a driving current value of the semiconductor optical amplifier increases. Also, in the semiconductor optical amplifier, an intraband relaxation time of a carrier is preferably 25 femtoseconds or less.

In the semiconductor-laser-device assembly of the present disclosure including the above-described preferable form, the laser light output from the semiconductor optical amplifier preferably has an optical spectrum width of 4.5 THz or larger. An optical spectrum width $\Delta SP_L$ of laser light with a wavelength $\lambda$ (unit: meter) is typically expressed by a unit of length (meter). If this is expressed by a frequency $\Delta SP_F$, when the light speed is assumed as c (unit: meter/second), a relationship is established as follows:

$$\Delta SP_F = \Delta SP_L \times c / (\lambda^2).$$

Further, in the semiconductor-laser-device assembly of the present disclosure including any of the above-described various preferable forms, the semiconductor optical amplifier preferably has a driving current density of 5☐103 amperes/cm2 or higher. The driving current density is a value obtained by dividing a current for driving the semiconductor optical amplifier by an area of a portion, in which a driving current flows, of the semiconductor optical amplifier.

Further, in the semiconductor-laser-device assembly of the present disclosure including any of the above-described various preferable forms, the semiconductor optical amplifier preferably has an optical confinement factor of 3% or smaller, or more preferably, 1% or smaller. Accordingly, the output of the semiconductor optical amplifier can be further increased. It is to be noted that a unit that causes the optical confinement factor of the semiconductor optical amplifier to be 3% or smaller or more preferably 1% or smaller is described later in detail.

Further, in the semiconductor-laser-device assembly of the present disclosure including any of the above-described various preferable forms, an optical spectrum width of the laser light output from the semiconductor optical amplifier is preferably increased with respect to an optical spectrum width of the laser light incident on the semiconductor optical amplifier by 2.5 THz or larger.

Further, in the semiconductor-laser-device assembly of the present disclosure including any of the above-described various preferable forms, the mode-locked semiconductor laser element is preferably a current-injection mode-locked semiconductor laser element having a light density of a peak power of $1 \times 10^{10}$ watts/cm$^2$ or higher or more preferably $1.4 \times 10^{10}$ watts/cm$^2$ or higher, and a carrier density of $1 \times 10^{19}$/cm$^3$ or higher. As described above, since the light density of the peak power of the laser light emitted from the mode-locked semiconductor laser element is determined and the value of the carrier density of the mode-locked semiconductor laser element is determined, if self-phase modulation is generated with the high light power density and the high carrier density and a proper group-velocity dispersion value is given thereto, pulsed laser light in the subpicosecond order can be reliably generated. Also, in addition to the decrease in pulse time width of such pulsed laser light in the subpicosecond order, since the mode-locked semiconductor laser element is the current-injection type, energy efficiency is higher than that of photoexcitation mode-locked semiconductor laser element.

Further, in the semiconductor-laser-device assembly of the present disclosure including any of the above-described various preferable forms, the dispersion compensation optical system preferably has a group-velocity dispersion value being negative. The group-velocity dispersion value is generally determined based on the configuration and structure of the mode-locked semiconductor laser element, the configuration, structure, and driving method (for example, an amount of current applied to a carrier injection region (gain region), a reverse bias voltage applied to a saturable absorption region (carrier non-injection region), driving temperature, etc.) of the semiconductor-laser-device assembly, etc. Alternatively, the semiconductor-laser-device assembly is preferably operated with a group-velocity dispersion value that causes the pulse time width of the laser light emitted to the semiconductor optical amplifier to be a minimum value, or is preferably operated with a value around the group-velocity dispersion value. It is to be noted that the "value around the group-velocity dispersion value" is equivalent to a value around a group-velocity dispersion minimum value GVDmin."

Alternatively, when a group-velocity dispersion value in the dispersion compensation optical system is monotonically changed from a first predetermined value GVD1 to a second predetermined value GVD2, if |GVD1|<|GVD2|, a pulse time width of the laser light emitted from the mode-locked semiconductor-laser-element assembly and being incident on the semiconductor optical amplifier is preferably decreased, preferably exceeds a minimum value PWmin, and is preferably increased. As described above, since the relationship between the group-velocity dispersion value in the dispersion compensation optical system and the pulse time width of the laser light emitted from the mode-locked semiconductor-laser-element assembly to the semiconductor optical amplifier is determined, stable pulsed laser light in the subpicosecond order can be reliably generated, and a noise in generated laser light can be decreased. Also, in this case, for example, an expression is satisfied as follows:

$$(PW_1 - PW_{min})/|GVD_{min} - GVD_1| \geq 2 \times (PW_2 - PW_{min})/|GVD_2 - GVD_{min}|,$$

if $$|GVD_1/GVD_{min}| = 0.5, \text{ and}$$

$$|GVD_2/GVD_{min}| = 2,$$

where GVDmin is a group-velocity dispersion minimum value of the dispersion compensation optical system when the pulse time width of the laser light emitted to the semiconductor optical amplifier is the minimum value PWmin, PW1 is a pulse time width of the laser light when the group-velocity dispersion value in the dispersion compensation optical system is the first predetermined value GVD1 being negative, and PW2 is a pulse time width of the laser light when the group-velocity dispersion value in the dispersion compensation optical system is the second predetermined value GVD2 being negative. Further, in this case, the semiconductor-laser-device assembly is preferably operated with a group-velocity dispersion minimum value GVDmin that causes the pulse time width of the laser light emitted to the semiconductor optical amplifier to be the minimum value PWmin, or is preferably operated with a value around the group-velocity dispersion minimum value GVDmin. Further, in this case, the laser light incident on the semiconductor optical amplifier preferably has a noise component, with respect to a main oscillation frequency, of −60 dB or lower, or more preferably, −70 dB or lower. It is to be noted that monotonic change represents monotonic increase in case of GVD1<GVD2, and represents monotonic decrease in case of GVD1>GVD2. Also, although it will be described later, as the group-velocity dispersion value decreases (the absolute value of the group-velocity dispersion value increases), the number of sub-pulses other than the main pulses at the time of zero decreases. If the upper limit value of the group-velocity dispersion value when a sub-pulse is no longer observed, the "value around the group-velocity dispersion minimum value GVDmin" is defined as follows:

$$GVD_S \pm |GVD_{min} - GVD_S|.$$

Further, in the semiconductor-laser-device assembly of the present disclosure including any of the above-described various preferable forms and configurations, the laser light output from the mode-locked semiconductor-laser-element assembly preferably has a frequency chirp being negative and a pulse time width of 0.5 picoseconds or smaller. Herein, the expression a frequency chirp being negative (that is, being down-chirp) represents that the frequency is high at the beginning of the pulse time and the frequency decreases with time.

Further, in the semiconductor-laser-device assembly of the present disclosure including any of the above-described various preferable forms and configurations, the mode-locked semiconductor laser element preferably has a repetition frequency of the laser light of 1 GHz or lower.

Further, in the semiconductor-laser-device assembly of the present disclosure including any of the above-described various preferable forms and configurations, the mode-locked semiconductor laser element may have a saturable absorption region. In an photoexcitation mode-locked semiconductor laser element of related art, the temperature characteristic of a semiconductor saturable absorber (SESAME) is used to control the oscillation characteristic. In the form including the saturable absorption region, the oscillation characteristic can be controlled based on the reverse bias voltage Vsa to the saturable absorption region and the group-velocity dispersion value in the dispersion compensation optical system. Accordingly, the oscillation characteristic can be easily controlled.

Further, in the semiconductor-laser-device assembly of the present disclosure including any of the above-described various preferable forms and configurations, the mode-locked semiconductor laser element may have a layered structure body formed by successively stacking layers, the layers including
a first compound semiconductor layer made of a GaN-based compound semiconductor and having a first conductivity type,
a third compound semiconductor layer (active layer) made of a GaN-based compound semiconductor, and
a second compound semiconductor layer made of a GaN-based compound semiconductor and having a second conductivity type which is different from the first conductivity type.

The first compound semiconductor layer is formed on a substrate or a base member.

Also, in the semiconductor-laser-device assembly of the present disclosure including any of the above-described various preferable forms and configurations, the semiconductor optical amplifier may include
a layered structure body formed by successively stacking layers, the layers including
    a first compound semiconductor layer made of a GaN-based compound semiconductor and having a first conductivity type,
    a third compound semiconductor layer (active layer) made of a GaN-based compound semiconductor, and
    a second compound semiconductor layer made of a GaN-based compound semiconductor and having a second conductivity type which is different from the first conductivity type,
a second electrode formed on the second compound semiconductor layer, and
a first electrode electrically connected with the first compound semiconductor layer.

The first compound semiconductor layer is formed on a substrate or a base member.

Further, in the semiconductor-laser-device assembly of the present disclosure including any of the above-described various preferable forms and configurations, the laser light emitted from the mode-locked semiconductor laser element may be incident on the dispersion compensation optical system, part of the laser light incident on the dispersion compensation optical system may be emitted from the dispersion compensation optical system and may be fed back to the mode-locked semiconductor laser element, and the residual part of the laser light incident on the dispersion compensation optical system may be incident on the semiconductor optical amplifier.

With the form, an external resonator structure is formed by the dispersion compensation optical system. Specifically, the dispersion compensation optical system may include a diffraction grating, light collecting means (specifically, lens), and a reflecting mirror (plane reflecting mirror, specifically, for example, dielectric multilayer reflecting mirror). The diffraction grating may be configured to allow diffracted light of first-order or higher to be incident on the dispersion compensation optical system from among laser light emitted from the mode-locked semiconductor laser element, and cause zeroth-order diffracted light to be emitted to the semiconductor optical amplifier. Herein, collimating means (specifically, lens) for collimating the laser light from the mode-locked semiconductor laser element may be arranged between the mode-locked semiconductor laser element and the diffraction grating. The number of grating patterns of the diffraction grating included in the laser light being incident (colliding with) the diffraction grating may be, for example, in a range from 1200 patterns/mm to 3600 patterns/mm, or preferably in a range from 2400 patterns/ mm to 3600 patterns/mm. One end of the external resonator is formed of a reflecting mirror. The laser light emitted from the mode-locked semiconductor laser element collides with the diffraction grating, first-order or higher diffracted light is incident on the light collecting means, the light is reflected by the reflecting mirror, the light passes through the light collecting means and the diffraction grating, and the light is fed back to the mode-locked semiconductor laser element. Also, zeroth-order diffracted light is emitted to the semiconductor optical amplifier. By changing the distance between the diffraction grating and the light collecting means while the distance between the light collecting means and the reflecting mirror is fixed, the group-velocity dispersion value in the dispersion compensation optical system can be changed.

Alternatively, in this form, the external resonator structure includes the dispersion compensation optical system and a partially reflecting mirror (also called partially transmissive mirror, semi-transmissive mirror, or half mirror). Specifically, the dispersion compensation optical system may include a pair of diffraction gratings. In this case, the laser light emitted from the mode-locked semiconductor laser element collides with the first diffraction grating, first-order or higher diffracted light is emitted, the light collides with the second diffraction grating, first-order or higher diffracted light is emitted, and the light reaches the partially reflecting mirror. Then, part of the laser light, which has reached the partially reflecting mirror, passes through the partially reflecting mirror, and is emitted to the semiconductor optical amplifier. In contrast, the residual part of the laser light, which has collided with the partially reflecting mirror, is fed back to the mode-locked semiconductor laser element through the second diffraction grating and the first diffraction grating. By changing the distance between the first diffraction grating and the second diffraction grating, the group-velocity dispersion value in the dispersion compensation optical system can be changed. Alternatively, the dispersion compensation optical system may include a pair of prisms. In this case, the laser light emitted from the mode-locked semiconductor laser element passes through the first prism, passes through the second prism, and reaches the partially reflecting mirror. Then, part of the laser light, which has reached the partially reflecting mirror, passes through the partially reflecting mirror, and is emitted to the semiconductor optical amplifier. In contrast, the residual part of the laser light, which has reached the partially reflecting mirror, passes through the second prism and the first prism, and is fed back to the mode-locked semiconductor laser element. By changing the distance between the first prism and the second prism, the group-velocity dispersion value in the dispersion compensation optical system can be changed. Still alternatively, the dispersion compensation optical system may include an interferometer. Specifically, for example, a Gires-Tournois interferometer may be used as the interferometer. The Gires-Tournois interferometer includes a reflecting mirror with a reflectivity of 1 and a partially reflecting mirror with a reflectivity smaller than 1, and can change the phase without changing the intensity spectrum of reflected light. By controlling the distance between the reflecting mirror and the partially reflecting mirror, or by adjusting the incidence angle of incident laser light, the group-velocity dispersion value in the dispersion compensation optical system can be changed.

Yet alternatively, the dispersion compensation optical system may include a first transmission volume hologram diffraction grating and a second transmission volume hologram diffraction grating arranged to face each other. In each transmission volume hologram diffraction grating, the sum of an incidence angle $\phi_{in}$ of the laser light and an emission angle $\phi_{out}$ of the first-order diffracted light may be 90 degrees as follows:

$$\phi_{in}+\phi_{out}=90 \text{ degrees.}$$

Herein, the incidence angle and the emission angle are each an angle formed by the laser light of the transmission volume hologram diffraction grating and the normal to the incidence surface. This will be also applied to the following description. It is to be noted that such a dispersion compensation optical system is called "dispersion compensation optical device according to a first form" for convenience of the description.

Yet alternatively, the dispersion compensation optical system may include a first transmission volume hologram diffraction grating and a second transmission volume hologram diffraction grating arranged to face each other. In each transmission volume hologram diffraction grating, an incidence angle $\phi_{in}$ of the laser light may be substantially equal to an emission angle $\phi_{out}$ of the first-order diffracted light. In particular, for example, an expression is established as follows:

$$0.95 \leq \phi_{in}/\phi_{out} \leq 1.00.$$

It is to be noted that such a dispersion compensation optical system is called "dispersion compensation optical device according to a second form" for convenience of the description. Also, the dispersion compensation optical devices according to the first form and the second form may be occasionally collectively called "dispersion compensation optical device etc."

Yet alternatively, the dispersion compensation optical system may include a transmission volume hologram diffraction grating and a reflecting mirror.

In the transmission volume hologram diffraction grating, the sum of an incidence angle $\phi_{in}$ of the laser light and an emission angle $\phi_{out}$ of the first-order diffracted light may be 90 degrees, or the incidence angle $\phi_{in}$ of the laser light may be substantially equal to the emission angle $\phi_{out}$ of the first-order diffracted light.

The laser light emitted from the mode-locked semiconductor laser element may be incident on the transmission volume hologram diffraction grating, may be diffracted, and may be emitted as first-order diffracted light, may collide with the reflecting mirror, and may be reflected by the reflecting mirror. The first-order diffracted light reflected by the reflecting mirror may be incident on the transmission volume hologram diffraction grating again, may be diffracted, and may be emitted to the semiconductor optical amplifier. It is to be noted that such a dispersion compensation optical system is called "dispersion compensation optical device according to a third form" for convenience of the description.

In the dispersion compensation optical device according to the first form, the sum of the incidence angle $\phi_{in}$ of the laser light and the emission angle $\phi_{out}$ of the first-order diffracted light is 90 degrees. In the dispersion compensation optical device according to the second form, the incidence angle $\phi_{in}$ of the laser light is substantially equal to the emission angle $\phi_{out}$ of the first-order diffracted light. The dispersion compensation optical device according to the third form includes the transmission volume hologram diffraction grating and the reflecting mirror. Accordingly, a small dispersion compensation optical system having a high throughput because of high diffraction efficiency can be provided. Also, since the diffraction angle can be designed at any angle, the degree of freedom for optical design of the dispersion compensation optical system can be increased. Also, the group-velocity dispersion value (dispersion compensation amount) in the dispersion compensation optical system can be easily adjusted. The degree of freedom for arrangement of optical components included in the dispersion compensation optical system can be increased.

Regarding the dispersion compensation optical device according to the first form, in the first transmission volume hologram diffraction grating on which the laser light is incident from the mode-locked semiconductor laser element, the emission angle $\phi_{out}$ of the first-order diffracted light is preferably larger than the incidence angle $\phi_{in}$ of the laser light, to increase the angular dispersion by the transmission volume hologram diffraction grating. Also, in this case, in the second transmission volume hologram diffraction grating on which the first-order diffracted light is incident from the first transmission volume hologram diffraction grating, the emission angle $\phi_{out}$ of the first-order diffracted light may be smaller than the incidence angle $\phi_{in}$ of the laser light. The incidence angle $\phi_{in}$ of the laser light at the first transmission volume hologram diffraction grating is preferably equal to the emission angle (diffraction angle) $\phi_{out}$ of the first-order diffracted light at the second transmission volume hologram diffraction grating, and the emission angle (diffraction angle) $\phi_{out}$ of the first-order diffracted light at the first transmission volume hologram diffraction grating is preferably equal to the incidence angle of the first-order diffracted light at the second transmission volume hologram diffraction grating. This is also applied to a dispersion compensation optical device etc.-A to a dispersion compensation optical device etc.-D (described later).

Also, in the dispersion compensation optical device according to the second form, the sum of the incidence angle $\phi_{in}$ of the laser light and the emission angle $\phi_{out}$ of the first-order diffracted light is preferably 90 degrees, to allow the group-velocity dispersion value (dispersion compensation amount) in the dispersion compensation optical device to be easily adjusted.

In the dispersion compensation optical device etc. including any of the above-described preferable configurations, a form may be provided in which the laser light incident on the first transmission volume hologram diffraction grating is diffracted by the first transmission volume hologram diffraction grating, is emitted as the first-order diffracted light, is further incident on the second transmission volume hologram diffraction grating, is diffracted by the second transmission volume hologram diffraction grating, and is emitted to the semiconductor optical amplifier as the first-order diffracted light. Such a form is called "dispersion compensation optical device etc.-A" for convenience of the description. The laser light incident on the first transmission volume hologram diffraction grating is preferably substantially parallel to the laser light emitted from the second transmission volume hologram diffraction grating (that is, being parallel by a certain degree so that the laser light emitted from the first transmission volume hologram diffraction grating can be incident on the second transmission volume hologram diffraction grating), to allow the dispersion compensation optical device to be easily arranged in and inserted to an existing optical system. This is also applied to a dispersion compensation optical device etc.-B and a dispersion compensation optical device etc.-C (described later).

Then, the dispersion compensation optical device etc.-A further includes a first reflecting mirror and a second reflecting mirror arranged in parallel to each other, and the laser light emitted from the second transmission volume hologram diffraction grating may collide with and be reflected by the first reflecting mirror, and then may collide with and be reflected by the second reflecting mirror. Such a form is called "dispersion compensation optical device etc.-B" for convenience of the description. Further, the laser light reflected by the second reflecting mirror may be substantially located on the extension line of the laser light incident on the first transmission volume hologram diffraction grating. Alternatively, the laser light incident on the first transmission volume hologram diffraction grating may be substantially parallel to the laser light emitted from the second transmission volume hologram diffraction grating. Accordingly, the dispersion compensation optical device can be easily arranged in and inserted to the existing optical system. The dispersion compensation optical device etc.-B is a single-path dispersion compensation optical device. Herein, the expression "being substantially located on" represents that the center of the second reflecting mirror is located on the extension line of the angle at which the wavelength center of the optical spectrum of the laser light incident on the first transmission volume hologram diffraction grating is diffracted.

Alternatively, the dispersion compensation optical device etc. including any of the above-described preferable configurations includes a first transmission volume hologram diffraction grating on a first surface of a base member, and a second transmission volume hologram diffraction grating on a second surface of the base member opposite to the first surface. Such a form is called "dispersion compensation optical device etc.-C" for convenience of the description. The dispersion compensation optical device etc.-C is a single-path dispersion compensation optical device. The base member may be made of glass, which may be any of silica glass and optical glass such as BK7, or a plastic material (for example, PMMA, polycarbonate resin, acrylic resin, amorphous polypropylene resin, styrenic resin including AS resin).

Alternatively, the dispersion compensation optical device etc. including any of the above-described preferable configurations may further include a reflecting mirror, the laser light incident on the first transmission volume hologram diffraction grating is diffracted by the first transmission volume hologram diffraction grating, is emitted as first-order diffracted light, and is further incident on the second transmission volume hologram diffraction grating, is diffracted by the second transmission volume hologram diffraction grating, is emitted as first-order diffracted light, and collides with the reflecting mirror, the laser light reflected by the reflecting mirror is incident on the second transmission volume hologram diffraction grating again, is diffracted by the second transmission volume hologram diffraction grating, is emitted as first-order diffracted light, is incident on the first transmission volume hologram diffraction grating again, is diffracted by the first transmission volume hologram diffraction grating, and is emitted to the semiconductor optical amplifier. Such a form is called "dispersion compensation optical device etc.-D" for convenience of the description. The dispersion compensation optical device etc.-D is a double-path dispersion compensation optical device.

The material (diffraction grating member) forming the transmission volume hologram diffraction grating may be a photopolymer material. The configuration material and basic structure of the transmission volume hologram diffraction grating may be similar to the configuration material and structure of a transmission volume hologram diffraction grating of related art. The transmission volume hologram diffraction grating represents a hologram diffraction grating that diffracts and reflects only +first-order diffracted light. The diffraction grating member has an interference pattern formed from the inside to the front surface. The interference pattern may be formed by a forming method of related art. Specifically, for example, the diffraction grating member (for example, photopolymer material) may be irradiated with object light from a first predetermined direction on one side, and simultaneously, the diffraction grating member may be irradiated with reference light from a second predetermined direction on the other side, and the interference pattern formed by the object light and the reference light may be recorded in the diffraction grating. By properly selecting the first predetermined direction, the second predetermined direction, and the wavelengths of the object light and the reference light, a desirable period (pitch) of the interference pattern (refractive-index modulation ratio Δn) in the diffraction grating member and a desirable inclination angle (slant angle) of the interference pattern can be obtained. The inclination angle of the interference pattern represents the angle formed by the front surface of the transmission volume hologram diffraction grating and the interference pattern.

In the dispersion compensation optical device etc. including any of the above-described various preferable configurations and forms, by changing the distance (including optical distance) between the two transmission volume hologram diffraction gratings, the group-velocity dispersion value (dispersion compensation amount) can be changed. Herein, in the dispersion compensation optical device etc.-C, the thickness of the base member may be changed to change the distance between the two transmission volume hologram diffraction gratings. However, the group-velocity dispersion value (dispersion compensation amount) is actually a fixed value. Also, in the dispersion compensation optical device etc.-D, the distance between the second transmission volume hologram diffraction grating and the reflecting mirror may be changed. Further, in the dispersion compensation optical device according to the third form, by changing the distance between the transmission volume hologram diffraction grating and the reflecting mirror, the group-velocity dispersion value (dispersion compensation amount) can be changed. To change the distance, an existing moving mechanism may be used. The group-velocity dispersion value to be used depends on the characteristic of the laser light emitted from the mode-locked semiconductor laser element. The characteristic of the laser light is generally determined based on the configuration and structure of the mode-locked semiconductor laser element, the configuration, structure, and driving method (for example, the amount of current applied to a carrier injection region (gain region), a reverse bias voltage applied to a saturable absorption region (carrier non-injection region), driving temperature) of the semiconductor-laser-device assembly, etc. Based on the group-velocity dispersion value (dispersion compensation amount), any of an up-chirp phenomenon [phenomenon in which the wavelength is changed from a long wave to a short wave (frequency is increased) within a duration of a pulse], and a down-chirp phenomenon [phenomenon in which the wavelength is changed from a short wave to a long wave (frequency is decreased) within a duration of a pulse] may be generated. It is to be noted that no-chirp represents a phenomenon in which the wavelength is not changed within a duration of a pulse [phenomenon in which the frequency is not changed]. Then, by properly selecting the group-velocity dispersion value in the dispersion compensation optical device, the pulse time width of the laser light can be expanded/compressed. Specifically, for example, if the group-velocity dispersion value is set at a positive/negative value with respect to the laser light indicating the up-chirp phenomenon, the pulse time width of the laser light can be expanded/compressed, and if the group-velocity dispersion value is set at a positive/negative value with respect to the laser light indicating the down-chirp phenomenon, the pulse time width of the laser light can be compressed/expanded. Regarding the first-order diffracted light diffracted by the transmission volume hologram diffraction grating and emitted, the optical-path length of a long-wavelength component differs from the optical-path length of a short-wavelength component. If the optical path of the long-wavelength component is longer than the optical path of the short-wavelength component, negative group-velocity dispersion is formed. That is, the group-velocity dispersion value becomes negative. In contrast, if the optical path of the long-wavelength component is shorter than the optical path of the short-wavelength component, positive group-velocity dispersion is formed. That is, the group-velocity dispersion value becomes positive. Hence, optical elements may be arranged so that such a length relationship between the optical-path length of the long-wavelength component and the optical-path length of the short-wavelength component can be established. More specifically, in the semiconductor-laser-device assembly of the present disclosure, the optical elements may be arranged so that the group-velocity dispersion value becomes negative.

The relationship between the up-chirp phenomenon etc. and the group-velocity dispersion value is exemplarily shown in Table 1. In Table 1, laser light having the up-chirp phenomenon is expressed as "up-chirp laser light," laser light having the down-chirp phenomenon is expressed as "down-chirp laser light," and laser light with no-chirp is expressed as "no-chirp laser light."

TABLE 1

| Chirp phenomenon | Group-velocity dispersion value | Pulse time width of laser light |
|---|---|---|
| Up-chirp laser light | Positive | Expanded |
| Up-chirp laser light | Negative | Compressed |
| Down-chirp laser light | Positive | Compressed |
| Down-chirp laser light | Negative | Expanded |
| No-chirp laser light | Positive | Expanded |
| No-chirp laser light | Negative | Expanded |

More specifically, in the dispersion compensation optical device etc.-B, the dispersion compensation optical device etc.-C, the dispersion compensation optical device etc.-D, and the dispersion compensation optical device according to the second form, the group-velocity dispersion value is negative. In contrast, in the dispersion compensation optical device according to the third form, the dispersion compensation optical device takes either of positive and negative values. Hence, as described above, in the semiconductor-laser-device assembly of the present disclosure, the optical elements may be arranged so that the group-velocity dispersion value becomes negative.

In the semiconductor-laser-device assembly including any of the dispersion compensation optical device etc.-A, the dispersion compensation optical device etc.-B, and the dispersion compensation optical device etc.-C, an external resonator structure is formed by a second end surface (light-emission end surface) of the mode-locked semiconductor laser element and the dispersion compensation optical device, or by arranging a partially reflecting mirror between the second end surface of the mode-locked semiconductor laser element and the dispersion compensation optical device, an external resonator structure is formed by a first end surface (end surface opposite to the second end surface and serving as a laser-light reflection end surface) of the mode-locked semiconductor laser element and the partially reflecting mirror. Also, in the semiconductor-laser-device assembly including the dispersion compensation optical device etc.-D, an external resonator structure is formed by the dispersion compensation optical device and the first end surface.

Further, the semiconductor-laser-device assembly including any of the above-described various preferable forms and configurations may further include optical spectrum shaping means (optical spectrum shaping portion) for shaping an optical spectrum of the laser light emitted from the mode-locked semiconductor-laser-element assembly. Laser light after shaping may be incident on the semiconductor optical amplifier. In this case, the optical spectrum shaping means may be formed of a band pass filter having a dielectric multilayer film. The laser light emitted form the mode-locked semiconductor-laser-element assembly may pass through the band pass filter a plurality of times. For example, the band pass filter may be obtained by stacking a dielectric thin film with a low dielectric constant and a dielectric thin film with a high dielectric constant. In this way, by causing the laser light emitted from the mode-locked semiconductor-laser-element assembly to pass through the optical spectrum shaping means, the proper pulse expansion state can be further reliably obtained.

As described above, the semiconductor optical amplifier preferably has the optical confinement factor of 3% or smaller, or more preferably, 1% or smaller. To attain this, the semiconductor optical amplifier may preferably have a form in which, the first compound semiconductor layer has a layered structure including a first cladding layer and a first optical guide layer staked from a base-member side, the layered structure body has a ridge-stripe structure including the second compound semiconductor layer, the third compound semiconductor layer (active layer), and a portion in a thickness direction of the first optical guide layer, an expression is satisfied as follows:

$$6 \times 10^{-7}\ m < t_1,$$

or more preferably, $$8 \times 10^{-7}\ m \leq t_1,$$

where $t_1$ is a thickness of the first optical guide layer, and $t_1'$ is a thickness of the portion of the first optical guide layer forming the ridge-stripe structure, and an expression is satisfied as follows:

$$0\ (m) < t_1' \leq 0.5 \cdot t_1,$$

or more preferably, $$0\ (m) < t_1' \leq 0.3 \cdot t_1.$$

It is to be noted that the semiconductor optical amplifier of such a form is called "semiconductor optical amplifier with a first configuration" for convenience of the description. In this way, since the thickness $t_1$ of the first optical guide layer is determined, the optical confinement factor can be decreased. Also, since the peak of the optical-field intensity distribution is shifted from the third compound semiconductor layer (active layer) to the first optical guide layer, the light density at a position near the third compound semiconductor layer can be decreased during high-output operation. Not only an optical damage can be prevented, but also, in the semiconductor optical amplifier, the saturated energy of the amplified laser light is increased, and the high output can be obtained. In addition, since the thickness $t_1'$ of the portion of the first optical guide layer forming the ridge-stripe structure is determined, a light beam to be output can become a single-mode light beam. Also, since the width of a slab waveguide is substantially equal to the thickness of the first optical guide layer, a light beam cross-sectional shape approximate to the perfect circle can be obtained. A problem, in which the light collecting characteristic is decreased in application with use of a lens or an optical fiber, does not occur. Alternatively, a relationship is preferably satisfied as follows:

$$0.2 \times W < t_1 < 1.2 \times W,$$

or more preferably, $$0.2 \times W < t_1 \leq W,$$

where W is a width of the ridge-stripe structure (for example, width of the ridge-stripe structure at the light-emission end surface).

Also, an expression is preferably satisfied as follows:

$$t_1 \leq 3 \times 10^{-6}\ m.$$

If crystal is grown such that the thickness $t_1$ of the first guide layer is $3 \times 10^{-6}$ m or smaller, the crystal-growth surface morphology does not become rough, and the characteristic of laser light emitted from the semiconductor optical amplifier or the electric characteristic can be prevented from being deteriorated.

In the semiconductor optical amplifier with the first configuration, the semiconductor optical amplifier may have a form that outputs a single-mode light beam. Also, in this case, an expression is preferably satisfied as follows:

$$0.2 \leq LB_Y/LB_X \leq 1.2,$$

or more preferably, $$0.2 \leq LB_Y/LB_X \leq 1.0,$$

where $LB_X$ is a dimension in a width direction of the ridge-stripe structure of the light beam output from the light-emission end surface of the layered structure body, and $LB_Y$ is a dimension in the thickness direction of the ridge-stripe structure.

Further, at the light-emission end surface of the layered structure body, a distance $Y_{CC}$ from the central point of the active layer in the layered structure body to the central point of the light beam output from the layered structure body along the thickness direction of the ridge-stripe structure preferably satisfies an expression as follows:

$$t_1' \leq Y_{CC} \leq t_1,$$

or more preferably, $$t_1' \leq Y_{CC} \leq 0.5 \cdot t_1.$$

Also, in the semiconductor optical amplifier with the first configuration, a high-refractive-index layer made of a compound semiconductor material having a higher refractive index than a refractive index of a compound semiconductor material forming the first optical guide layer may be formed in the first optical guide layer.

Specifically, the semiconductor optical amplifier with the first configuration may have a form that satisfies an expression as follows:

$$0.01 \leq n_{HR} - n_{G\text{-}1} \leq 0.1,$$

or more preferably, $$0.03 \leq n_{HR} - n_{G\text{-}1} \leq 0.1,$$

where $n_{G\text{-}1}$ is a refractive index of the compound semiconductor material forming the first optical guide layer, and $n_{HR}$ is a refractive index of the compound semiconductor material forming the high-refractive-index layer.

Also, an expression is preferably satisfied as follows:

$$n_{HR} \leq n_{Ac},$$

where $n_{Ac}$ is an average refractive index of a compound semiconductor material forming the third compound semiconductor layer (active layer).

Further, the second compound semiconductor layer may have a layered structure including a second optical guide layer and a second cladding layer from the base-member side, and the first optical guide layer may have a larger thickness than a thickness of the second optical guide layer.

Alternatively, as described above, the semiconductor optical amplifier preferably has the optical confinement factor of 3% or smaller, or more preferably, 1% or smaller. To attain this, the semiconductor optical amplifier may preferably have a form in which, the layered structure body has a ridge-stripe structure including at least a portion in the thickness direction of the second compound semiconductor layer, the first compound semiconductor layer has a thickness larger than 0.6 μm (for example, 10 μm may be exemplified as the upper limit value of the thickness), and a high-refractive-index layer made of a compound semiconductor material having a higher refractive index than a refractive index of a compound semiconductor material forming the first compound semiconductor layer may be formed in the first compound semiconductor layer. It is to be noted that the semiconductor optical amplifier of such a form is called "semiconductor optical amplifier with a second configuration" for convenience of the description.

In this way, in the semiconductor optical amplifier with the second configuration, since the first compound semiconductor layer has the thickness larger than 0.6 μm, the optical confinement factor can be decreased. Also, since the peak of the optical-field intensity distribution is shifted from the third compound semiconductor layer (active layer) to the first compound semiconductor layer, the light density at a position near the third compound semiconductor layer can be decreased during high-output operation. Not only an optical damage can be prevented, but also, in the semiconductor optical amplifier, the saturated energy of the amplified laser light is increased, and the high output can be obtained. In addition, the high-refractive-index layer made of the compound semiconductor material having a higher refractive index than the refractive index of the compound semiconductor material forming the first compound semiconductor layer is formed in the first compound semiconductor layer. Accordingly, as compared with a case without the high-refractive-index layer, the condition of single-mode in the thickness direction of the compound semiconductor layer can be satisfied in a wide range. The cut-off condition can be eased, and a single-mode light beam can be output.

Also, in the semiconductor optical amplifier with the second configuration may have a form in which the first compound semiconductor layer has a layered structure including a first cladding layer and a first optical guide layer staked from the base-member side, the first optical guide layer has a thickness larger than 0.6 μm, and a high-refractive-index layer may be formed in the first optical guide layer. That is, in this form, the first optical guide layer has a configuration in which a first portion of the first optical guide layer, the high-refractive-index layer, and a second portion of the first optical guide layer are stacked from the base-member side. Herein, the first portion of the first optical guide layer is called "first-A optical guide layer" for convenience of the description, and the second portion of the first optical guide layer is called "first-B optical guide layer" for convenience of the description.

Then, in this case, a distance from the interface between the third compound semiconductor layer (active layer) and the first optical guide layer (interface between the third compound semiconductor layer and the first-B optical guide layer) to the interface between the portion of the first optical guide layer (first-B optical guide layer) located at the third-compound-semiconductor-layer side and the high-refractive-index layer (that is, thickness of the first-B optical guide layer) is preferably 0.25 μm or larger. It is to be noted that 5 μm can be exemplified for the upper limit value for a value when the thickness of the high-refractive-index layer is subtracted from the thickness of the first optical guide layer.

Also, an expression may be satisfied as follows:

$$0 < n_{HR} - n_{G\text{-}1} \leq 0.3,$$

or more preferably, $$0.02 \leq n_{HR} - n_{G\text{-}1} \leq 0.2,$$

where $n_{G\text{-}1}$ is a refractive index of a compound semiconductor material forming the first optical guide layer, and $n_{HR}$ is a refractive index of a compound semiconductor material forming the high-refractive-index layer.

Also, an expression is preferably satisfied as follows:

$$n_{HR} \leq n_{Ac},$$

where $n_{Ac}$ is an average refractive index of a compound semiconductor material forming the third compound semiconductor layer (active layer).

In the semiconductor optical amplifier with the second configuration, the semiconductor optical amplifier may output a single-mode light beam. Also, in this case, an expression is preferably satisfied as follows:

$$3 \times 10^0 \leq LB_Y / LB_X \leq 1 \times 10^3,$$

or more preferably, $$1 \times 10^1 \leq LB_Y / LB_X \leq 1 \times 10^2,$$

where $LB_X$ is a dimension in a width direction of the ridge-stripe structure of the light beam output from the light-emission end surface of the layered structure body, and $LB_Y$ is a dimension in the thickness direction of the ridge-stripe structure.

Further, at the light-emission end surface of the layered structure body, a distance $Y_{CC}$ from the central point of the active layer in the layered structure body to the central point of the light beam output from the layered structure body along the thickness direction of the ridge-stripe structure preferably satisfies an expression as follows:

$$0\text{ m} < Y_{CC} \le (\text{thickness of first optical guide layer})$$

or more preferably, $$0\text{ m} < Y_{CC} \le (\text{thickness of first-}B\text{ optical guide layer}).$$

Further, the second compound semiconductor layer may have a layered structure including a second optical guide layer and a second cladding layer from the base-member side, and the first optical guide layer may have a larger thickness than a thickness of the second optical guide layer.

The light density of the peak power of the laser light emitted from the mode-locked semiconductor laser element can be obtained by dividing the power of the laser light (unit being watt, peak power since pulse is used) by a cross-sectional area of a near-field pattern in an end surface of the mode-locked semiconductor laser element (region being $1/e^2$ with respect to peak intensity). Also, the carrier density can be obtained by measuring the carrier life, and multiplying a value, which is obtained by dividing an injection current amount by an area of an electrode (for example, a first portion of a second electrode, described later) of the gain portion by the carrier life. Further, the group-velocity dispersion value can be obtained by measuring a change in pulse time width observed after a measurement-target light pulse passes through a medium having a predefined dispersion amount, or obtained by frequency resolved optical gating, FROG). Also, the pulse time width of about 1 picosecond or smaller can be measured by using a second harmonic generation (SHG) intensity correlation measuring device.

In the semiconductor-laser-device assembly of the present disclosure including any of the above-described various preferable forms and configurations, the mode-locked semiconductor laser element may have a form including a bi-section mode-locked semiconductor laser element in which an emitting region and a saturable absorption region are arranged in parallel to each other in a resonator direction.

The bi-section mode-locked semiconductor laser element may include (a) a layered structure body in which a first compound semiconductor layer having a first conductivity type and made of a GaN-based compound semiconductor, a third compound semiconductor layer (active layer) made of a GaN-based compound semiconductor and forming an emitting region and a saturable absorption region, and a second compound semiconductor layer having a second conductivity type different from the first conductivity type and made of a GaN-based compound semiconductor are successively stacked, (b) a second electrode formed on the second compound semiconductor layer, and (c) a first electrode electrically connected with the first compound semiconductor layer, and the second electrode is separated into a first portion which obtains a forward bias state when a direct current flows to the first electrode through the emitting region, and a second portion for applying an electric field to the saturable absorption region, by a separation groove.

The electrical resistance value between the first portion and the second portion of the second electrode is preferably $1\times10$ times or larger, more preferably, $1\times10^2$ times or larger, or further preferably, $1\times10^3$ times or larger the electrical resistance value between the second electrode and the first electrode. Such a mode-locked semiconductor laser element is called "mode-locked semiconductor laser element with a first configuration" for convenience of the description. Alternatively, the electrical resistance value between the first portion and the second portion of the second electrode is preferably $1\times10^2\Omega$ or larger, more preferably $1\times10^3\Omega$ or larger, or further preferably $1\times10^4\Omega$ or larger. Such a mode-locked semiconductor laser element is called "mode-locked semiconductor laser element with a second configuration" for convenience of the description.

In the mode-locked semiconductor laser element with the first configuration or the second configuration, the direct current flows from the first portion of the second electrode to the first electrode through the emitting region, so that the bias state becomes the forward bias state. Also, the voltage (reverse bias voltage $V_{sa}$) is applied between the first electrode and the second portion of the second electrode. Accordingly, by applying an electric field to the saturable absorption region, mode-locking operation can be provided.

In the mode-locked semiconductor laser element with the first configuration or the second configuration, since the electrical resistance value between the first portion and the second portion of the second electrode is 10 times or larger the electrical resistance value between the second electrode and the first electrode, or $1\times10^2\Omega$ or larger, the flow of leaked current from the first portion to the second portion of the second electrode can be reliably restricted. That is, since the reverse bias voltage $V_{sa}$ which is applied to the saturable absorption region (carrier non-injection region) can be increased, the mode-locking operation with pulsed laser light having a shorter pulse time width can be provided. Also, the high electrical resistance value between the first portion and the second portion of the second electrode can be provided only by separating the second electrode into the first portion and the second portion by the separation groove.

Also, the mode-locked semiconductor laser element with any of the first configuration and the second configuration, although it is not limited thereto, may have a form in which the third compound semiconductor layer has a quantum well structure including a quantum well layer and a barrier layer, the quantum well layer preferably has a thickness in a range from 1 nm to 10 nm, or more preferably, in a range from 1 nm to 8 nm, and the barrier layer has an impurity doping concentration preferably in a range from $2\times10^{18}$ cm$^{-3}$ to $1\times10^{20}$ cm$^{-3}$, or more preferably, in a range from $1\times10^{19}$ cm$^{-3}$ to $1\times10^{20}$ cm$^{-3}$. Such a mode-locked semiconductor laser element may be occasionally called "mode-locked semiconductor laser element with a third configuration" for convenience of the description. Since the active layer employs the quantum well structure, the injection current amount can be large and high output can be easily obtained as compared with a quantum dot structure.

In this way, since the thickness of the quantum well layer forming the third compound semiconductor layer is determined in the range from 1 nm to 10 nm, and further the impurity doping concentration of the barrier layer forming the third compound semiconductor layer is determined in the range from $2\times10^{18}$ cm$^{-3}$ to $1\times10^{20}$ cm$^{-3}$, that is, since the thickness of the quantum well layer is decreased and the carrier of the third compound semiconductor layer is increased, influence of piezoelectric polarization can be reduced, and a laser light source that can generate laser light, which has a small pulse time width, which has a less sub-pulse component, and which is unimodal, can be obtained. Also, mode-locked driving can be attained with a low reverse bias voltage $V_{sa}$, and a pulse train of laser light synchronized with an external signal (electric signal and optical signal) can be generated. The impurity doped in the barrier layer may be silicon (Si); however, it is not limited thereto, and may be oxygen (O).

Herein, the mode-locked semiconductor laser element may be formed of a semiconductor laser element having a ridge-stripe separate confinement heterostructure (SCH structure). Alternatively, the mode-locked semiconductor laser element may be formed of a semiconductor laser element having an inclined ridge-stripe separate confinement heterostructure. That is, the axis line of the mode-locked semiconductor laser element may intersect with the axis line of the ridge-stripe structure at a predetermined angle. Herein, as a predetermined angle θ, for example, 0.1 degrees≤θ≤10 degrees may be satisfied. The axis line of the ridge-stripe structure is a straight line connecting a bisecting point between both ends of the ridge-stripe structure at a light-emission end surface (occasionally called "second end surface" for convenience) and a bisecting point between both ends of the ridge-stripe structure in an end surface of the layered structure body opposite to the light-emission end surface (the second end surface) (occasionally called "first end surface" for convenience). Also, the axis line of the mode-locked semiconductor laser element represents an axis line orthogonal to the first end surface and the second end surface. The ridge-stripe structure may have a straight plane shape or a curved plane shape.

Alternatively, $W_1=W_2$ may be satisfied or $W_2>W_1$ may be satisfied where $W_2$ is a width of the ridge-stripe structure in the second end surface and $W_1$ is a width of the ridge-stripe structure in the first end surface. $W_2$ may be 5 μm or larger, and the upper limit value of $W_2$ may be, for example, $4\times10^2$ μm, although the value is not limited thereto. Also, $W_1$ may be in a range from 1.4 μm to 2.0 μm. Each end portion of the ridge-stripe structure may be formed of a single segment or two or more segments. In the former case, for example, the width of the ridge-stripe structure may be gradually monotonically expanded in a tapered manner from the first end surface to the second end surface. In contrast, in the latter case, the width of the ridge-stripe structure is the same width first from the first end surface to the second end surface, and then is gradually monotonically expanded in a tapered manner. Alternatively, the width of the ridge-stripe structure may be expanded first from the first end surface to the second end surface, and then may be narrowed after the width exceeds the maximum width.

In the mode-locked semiconductor laser element, the second end surface of the layered structure body from which a laser light beam (pulsed laser beam) is emitted preferably has an optical reflectivity of 0.5% or lower. Specifically, the second end surface may have a low-reflection coat layer thereon. Herein, the low-reflection coat layer may have, for example, a layered structure body including at least two kinds of layers selected from a group including a titanium oxide layer, a tantalum oxide layer, a zirconium oxide layer, a silicon oxide layer, and an aluminum oxide layer. The value of the optical reflectivity is markedly lower than the optical reflectivity (generally, in a range from 5% to 19%) of one end surface of a layered structure body, from which a laser light beam (pulsed laser light) is emitted, in a semiconductor laser element of related art. Also, the first end surface preferably has a high optical reflectivity of, for example, 85% or higher, or more preferably, 95% or higher.

The external resonator preferably has an external-resonator length (X', unit: mm) which satisfies an expression as follows:

$0<X'<1500$, or more preferably, $30\le X'\le 500$.

Herein, the external resonator includes the first end surface of the mode-locked semiconductor laser element, the reflecting mirror or the partially reflecting mirror forming the external resonator structure, and the dispersion compensation optical device. The external-resonator length is a distance between the first end surface of the mode-locked semiconductor laser element, and the reflecting mirror or the partially reflecting mirror forming the external resonator structure, and the dispersion compensation optical device.

In the mode-locked semiconductor laser element, the layered structure body has the ridge-stripe structure including at least the portion in the thickness direction of the second compound semiconductor layer. The ridge-stripe structure may include only the second compound semiconductor layer, may include the second compound semiconductor layer and the third compound semiconductor layer (active layer), or may include the second compound semiconductor layer, the third compound semiconductor layer (active layer), and a portion in the thickness direction of the first compound semiconductor layer.

The mode-locked semiconductor laser element with the first configuration or the second configuration, although it is not limited thereto, may have a form in which the second electrode preferably has a width in a range from 0.5 μm to 50 μm, or more preferably, 1 μm to 5 μm, the ridge-stripe structure preferably has a height in a range from 0.1 μm to 10 μm, or more preferably, 0.2 μm to 1 μm, and the separation groove that separates the second electrode into the first portion and the second portion has a width of 1 μm or larger and 50% or less of the resonator length in the mode-locked semiconductor laser element (hereinafter, merely called "resonator length,") or more preferably 10 μm or larger and 10% or less of the resonator length. The resonator length may be, for example, 0.6 mm; however, it is not limited thereto. A distance d from a top surface of a portion of the second compound semiconductor layer located at the outside of both side surfaces of the ridge-stripe structure to the third compound semiconductor layer (active layer) is preferably $1.0\times10^{-7}$ m (0.1 μm) or larger. By determining the distance d in this way, the saturable absorption region can be reliably formed at both sides (in the Y direction) of the third compound semiconductor layer. The upper limit of the distance d may be determined depending on an increase in threshold current, the temperature characteristic, deterioration in current increase ratio for long-term driving, etc. In the following description, it is assumed that the resonator length direction is the X direction and the thickness direction of the layered structure body is the Z direction.

Further, in semiconductor optical amplifier included in the mode-locked semiconductor laser element with the first configuration or the second configuration having the above-described various preferable forms or the semiconductor-laser-device assembly of the present disclosure, the second electrode may be formed of a palladium (Pd) monolayer, a nickel (Ni) monolayer, a platinum (Pt) monolayer, a layered structure of a palladium layer/a platinum layer in which the palladium layer contacts the second compound semiconductor layer, or a layered structure formed of a palladium layer/a nickel layer in which the palladium layer contacts the second compound semiconductor layer. If the lower metal layer is made of palladium and the upper metal layer is made of nickel, the upper metal layer preferably has a thickness of 0.1 µm or larger, or more preferably, 0.2 µm or larger. Alternatively, the second electrode is preferably formed of a palladium (Pd) monolayer. In this case, the palladium monolayer preferably has a thickness of 20 nm or larger, or more preferably, 50 nm or larger. Alternatively, the second electrode preferably has a layered structure formed of a palladium (Pd) monolayer, a nickel (Ni) monolayer, a platinum (Pt) monolayer, or a layered structure formed of a lower metal layer, which contacts the second compound semiconductor layer, and an upper metal layer (in this case, the lower metal layer is made of a kind of metal selected from a group including palladium, nickel, and platinum, and the upper metal layer is made of a metal with an etching rate when the separation groove is formed in the second electrode in step (D) (described later) is equal to, substantially equal to, or higher than an etching rate of the lower metal layer). Also, an etching solution when the separation groove is formed in the second electrode in step (D) (described later) is preferably selected from aqua regia, nitric acid, sulfuric acid, and hydrochloric acid, or a mixed solution of at least two kinds of these acids (specifically, mixed solution of nitric acid and sulfuric acid, mixed solution of sulfuric acid and hydrochloric acid).

In the semiconductor laser element including any of the above-described various preferable forms and configurations, the saturable absorption region may have a smaller length than a length of the emitting region. Alternatively, the second electrode may have a smaller length (total length of the first portion and the second portion) than a length of the third compound semiconductor layer (active layer). Specifically, arrangement states of the first portion and the second portion of the second electrode are as follows:

(1) a state in which a single first portion of the second electrode and a single second portion of the second electrode are provided, and the first portion of the second electrode and the second portion of the second electrode are arranged with the separation groove interposed therebetween;

(2) a state in which a single first portion of the second electrode and two second portions of the second electrode are provided, one end of the first portion faces one of the second portions with one of separation grooves interposed therebetween, and the other end of the first portion faces the other of the second portions with the other of the separation grooves interposed therebetween; and (3) a state in which two first portions of the second electrode and a single second portions of the second electrode are provided, one end of the second portion faces one of the first portions with one of separation grooves interposed therebetween, and the other end of the second portion faces the other of the first portions with the other of the separation grooves interposed therebetween (that is, the second electrode has a structure in which the second portion is arranged between the first portions).

Also, in a broad sense, arrangement states are provided as follows:

(4) a state in which a number N of first portions of the second electrode and a number (N−1) of second portions of the second electrode are provided, and each second portion of the second electrode is arranged between corresponding first portions of the second electrode; and (5) a state in which a number N of second portions of the second electrode and a number (N−1) of first portions of the second electrode are provided, and each first portion of the second electrode is arranged between corresponding second portions of the second electrode.

The states (4) and (5) can be expressed in other words as follows:

(4') a state in which a number N of emitting regions [carrier injection regions, gain regions] and a number (N−1) of saturable absorption regions [carrier non-injection regions] are provided, and each saturable absorption region is arranged between corresponding emitting regions; and (5') a state in which a number N of saturable absorption regions [carrier non-injection regions] and a number (N−1) of emitting regions [carrier injection regions, gain regions] are provided, and each emitting region is arranged between corresponding saturable absorption regions.

By employing any structure of (3), (5), and (5'), the light-emission end surface of the mode-locked semiconductor laser element is hardly damaged.

The mode-locked semiconductor laser element can be manufactured, for example, by the following method. That is, the mode-locked semiconductor laser element may be manufactured by a manufacturing method including steps of:

(A) forming a layered structure body, in which a first compound semiconductor layer having a first conductivity type and made of a GaN-based compound semiconductor, a third compound semiconductor layer made of a GaN-based compound semiconductor and forming an emitting region and a saturable absorption region, and a second compound semiconductor layer having a second conductivity type different from the first conductivity type and made of a GaN-based compound semiconductor, successively on a base member; then (B) forming a strip-shaped second electrode on the second compound semiconductor layer; then (C) forming a ridge-stripe structure as an etching mask by etching at least a portion of the second compound semiconductor layer; and then (D) forming a resist layer for forming a separation groove in the second electrode, then forming the separation groove in the second electrode by wet etching while using the resist layer as a wet etching mask, and hence separating the second electrode into a first portion and a second portion by the separation groove.

Since such a manufacturing method is employed, that is, since the ridge-stripe structure is formed by etching at least a portion of the second compound semiconductor layer while using the strip-shaped second electrode as the etching mask, in other words, since the ridge-stripe structure is formed by self-alignment method while using the patterned second electrode as the etching mask, the second electrode is not shifted from the ridge-stripe structure. Also, the separation groove is formed in the second electrode by wet etching. In this way, since wet etching is employed, unlike dry etching, the second compound semiconductor layer can be prevented from being deteriorated in terms of optical and electrical characteristics. Thus, the light emission characteristic can be reliably prevented from being deteriorated.

In the step (C), the second compound semiconductor layer may be etched partly in the thickness direction, the second compound semiconductor layer may be etched entirely in the thickness direction, the second compound semiconductor layer and the third compound semiconductor layer may be etched in the thickness direction, or the second compound semiconductor layer and the third compound semiconductor layer may be etched and also the first compound semiconductor layer may be etched partly in the thickness direction.

Further, in the step (D), $ER_0/ER_1 \geq 1 \times 10$, or more preferably, $ER_0/ER_1 \geq 1 \times 10^2$ is preferably satisfied, where $ER_0$ is an etching rate of the second electrode and $ER_1$ is an etching rate of the layered structure body. Since $ER_0/ER_1$ satisfies the relationship, the second electrode can be reliably etched while the layered structure body is not etched (or even if the layered structure body is etched, the amount is very small).

In the mode-locked semiconductor laser element or the semiconductor optical amplifier (hereinafter, occasionally collectively called "mode-locked semiconductor laser element etc.," specifically, the layered structure body may be made of an AlGaInN-based compound semiconductor. The high-refractive-index layer in the semiconductor optical amplifier with the first configuration or the second configuration may be made of the AlGaInN-based compound semiconductor. Herein, the AlGaInN-based compound semiconductor may be, for specific example, GaN, AlGaN, GaInN, or AlGaInN. Further, any of these compound semiconductors may contain boron (B) atoms, thallium (Tl) atoms, arsenic (As) atoms, phosphorus (P) atoms, or antimony (Sb) atoms, if desired. Also, the third compound semiconductor layer (active layer) preferably has a quantum well structure. Specifically, the third compound semiconductor layer may have a single quantum well structure [QW structure], or a multiple quantum well structure [MQW structure]. The third compound semiconductor layer (active layer) having the quantum well structure has a structure in which at least a single quantum well layer and at least a single barrier layer are stacked. For example, combination of a compound semiconductor forming a quantum well layer and a compound semiconductor forming a barrier layer may be $(In_yGa_{(1-y)}N, GaN)$, $(In_yGa_{(1-y)}N, In_zGa_{(1-z)}N)$ [where y>z], or $(In_yGa_{(1-y)}N, AlGaN)$.

Further, in the mode-locked semiconductor laser element etc., the second compound semiconductor layer may have a superlattice structure in which p-type GaN layers and p-type AlGaN layers are alternately stacked, and the superlattice structure may have a thickness of 0.7 μm or smaller. By employing such a superlattice structure, the series resistance component of the mode-locked semiconductor laser element etc. can be decreased while the refractive index for the cladding layer is held, and hence the operating voltage of the mode-locked semiconductor laser element etc. can be decreased. The lower limit value of the thickness of the superlattice structure may be, for example, 0.3 μm, although it is not limited thereto. The p-type GaN layer forming the superlattice structure may have a thickness in a range from 1 nm to 5 nm. The p-type AlGaN layer forming the superlattice structure may have a thickness in a range from 1 nm to 5 nm. The total number of layers of the p-type GaN layers and the p-type AlGaN layers may be in a range from 60 layers to 300 layers. Also, the distance from the third compound semiconductor layer to the second electrode may be 1 μm or smaller, or more preferably, 0.6 μm or smaller. By determining the distance from the third compound semiconductor layer to the second electrode in this way, the thickness of the p-type second compound semiconductor layer with a high resistance is decreased, and hence the operating voltage of the mode-locked semiconductor laser element etc. can be decreased. The lower limit value of the distance from the third compound semiconductor layer to the second electrode may be, for example, 0.3 μm, although it is not limited thereto. Also, Mg is doped in the second compound semiconductor layer by $1 \times 10^{19}$ cm$^{-3}$ or more; and the second compound semiconductor layer may have an absorption coefficient of at least 50 cm$^{-1}$ for light with a wavelength of 405 nm from the third compound semiconductor layer. The atomic concentration of Mg is derived from the material property in which the positive hole concentration becomes maximum with a value of $2 \times 10^{19}$ cm$^{-3}$. The atomic concentration of Mg is the result of design such that the maximum positive hole concentration is obtained, that is, the specific resistance of the second compound semiconductor layer is minimized. The absorption coefficient of the second compound semiconductor layer is determined to decrease the resistance of the mode-locked semiconductor laser element etc. as much as possible. Consequently, the absorption coefficient for light of the third compound semiconductor layer is typically 50 cm$^{-1}$. However, to increase the absorption coefficient, the Mg doping amount may be intentionally set to a concentration of $2 \times 10^{19}$ cm$^{-3}$ or higher. In this case, the upper limit Mg doping amount while a practical positive hole concentration can be obtained is, for example, $8 \times 10^{19}$ cm$^{-3}$. Also, the second compound semiconductor layer may include a non-doped compound semiconductor layer and a p-type compound semiconductor layer from the third-compound-semiconductor-layer side; and the distance from the third compound semiconductor layer to the p-type compound semiconductor layer may be $1.2 \times 10^{-7}$ m or smaller. By determining the distance from the third compound semiconductor layer to the p-type compound semiconductor layer in this way, the internal loss can be restricted within a range that the internal quantum efficiency is not decreased. Accordingly, the threshold current density with which laser oscillation is started can be decreased. The lower limit value of the distance from the third compound semiconductor layer to the p-type compound semiconductor layer may be, for example, $5 \times 10^{-8}$ m, although it is not limited thereto. Also, a layered insulating film having a SiO$_2$/Si layered structure body may be formed on both side surfaces of the ridge-stripe structure; and a difference between the effective refractive index of the ridge-stripe structure and the effective refractive index of the layered insulating film may be in a range from $5 \times 10^{-3}$ to $1 \times 10^{-2}$. By using such a layered insulating film, a single fundamental transverse mode can be held even with high-output operation exceeding 100 milliwatts. Also, the second compound semiconductor layer may have a structure including, for example, a non-doped GaInN layer (p-side optical guide layer), a Mg-doped AlGaN layer (electronic barrier layer), a superlattice structure (superlattice cladding layer) having a GaN layer (Mg doped)/a AlGaN layer, and a Mg-doped GaN layer (p-side contact layer), these layers being stacked from the third-compound-semiconductor-layer side. A compound semiconductor layer forming a quantum well layer in the third compound semiconductor layer preferably has a band gap of 2.4 eV or larger. Also, laser light emitted or output from the third compound semiconductor layer (active layer) has a wavelength preferably in a range from 360 nm to 500 nm, or more preferably, in a range from 400 nm to 410 nm. Of course, the above-described configurations may be properly combined.

In the mode-locked semiconductor laser element etc., while the various kinds of GaN-based compound semiconductor layers forming the mode-locked semiconductor laser element etc. are successively formed on a substrate or a base member, in this case, the substrate or the base member is not limited to a sapphire substrate, and may be a GaAs substrate, a GaN substrate, a SiC substrate, an alumina substrate, a ZnS substrate, a ZnO substrate, a AN substrate, a LiMgO substrate, a LiGaO$_2$ substrate, a MgAl$_2$O$_4$ substrate, an InP substrate, a Si substrate, or a structure in which a base layer or a buffer layer is formed on the front surface (principal surface) of any of the above-listed substrates. If a GaN-based compound semiconductor layer is formed on a substrate, a GaN substrate is preferable because of a low defect density. However, the characteristic of the GaN substrate may be changed among polar, non-polar, and semi-polar depending on the growth surface. Also, a forming method of any of the various kinds of compound semiconductor layers forming the mode-locked semiconductor laser element etc. (for example, GaN-based compound semiconductor layer) may be metal-organic chemical vapor deposition (MOCVD) or metal-organic vapor phase epitaxy (MOVPE); molecular beam epitaxy (MBE); or hydride vapor phase epitaxy in which halogen contributes to transport or reaction.

Herein, organic gallium source gas for MOCVD may be trimethylgallium (TMG) gas or triethylgallium (TEG) gas, and nitrogen source gas may be ammonia gas or hydrazine gas. Also, a GaN-based compound semiconductor layer having an n-type conductivity type may be formed by adding silicon (Si) as an n-type impurity (n-type dopant). A GaN-based compound semiconductor layer having a p-type conductivity type may be formed by adding magnesium (Mg) as a p-type impurity (p-type dopant). Also, if aluminum (Al) or indium (In) is contained as configuration atoms of a GaN-based compound semiconductor layer, an Al source may use trimethylaluminum (TMA) gas, and an In source may use trimethylindium (TMI) gas. Further, a Si source may use monosilane gas ($SiH_4$ gas). A Mg source may use cyclopentadienyl magnesium gas, methylcyclopentadienyl magnesium, or biscyclopentadienyl magnesium ($Cp_2Mg$). The n-type impurity (n-type dopant) is not limited to Si, and may be Ge, Se, Sn, C, Te, S, O, Pd, or Po. Also, the p-type impurity (p-type dopant) is not limited to Mg, and may be Zn, Cd, Be, Ca, Ba, C, Hg, or Sr.

In the mode-locked semiconductor laser element etc., when the first conductivity type is the n-type, the first electrode, which is electrically connected with the first compound semiconductor layer having the n-type conductivity type, preferably has a monolayer configuration or a multilayer configuration containing at least one metal selected from a group including gold (Au), silver (Ag), palladium (Pd), aluminum (Al), titanium (Ti), tungsten (W), copper (Cu), zinc (Zn), tin (Sn), and indium (In). For example, the first electrode may be made of Ti/Au, Ti/Al, or Ti/Pt/Au may be used. While the first electrode is electrically connected with the first compound semiconductor layer, a form in which the first electrode is formed on the first compound semiconductor layer, and a form in which the first electrode is connected with the first compound semiconductor layer through a conductive material layer, a conductive substrate, or a conductive base member are included. The first electrode and the second electrode may be each, for example, a film formed by physical vapor deposition (PVD) such as vacuum deposition or sputtering.

A pad electrode may be provided on the first electrode or the second electrode for electrical connection with an external electrode or a circuit. The pad electrode preferably has a monolayer configuration or a multilayer configuration containing at least one kind of metal selected from a group including titanium (Ti), aluminum (Al), platinum (Pt), gold (Au), and nickel (Ni). Alternatively, the pad electrode may have a multilayer configuration exemplified by a multilayer configuration of Ti/Pt/Au or a multilayer configuration of Ti/Au.

In the mode-locked semiconductor laser element with the first configuration or the second configuration, as described above, the reverse bias voltage $V_{sa}$ is preferably applied between the first electrode and the second electrode (that is, a configuration in which the first electrode has a positive polarity and the second portion has a negative polarity). A pulse current, which is applied to the first portion of the second electrode, a pulse current synchronized with a pulse voltage, or a pulse voltage may be applied to the second portion of the second electrode; or a direct-current bias may be applied. Also, a current may flow to the first electrode from the second electrode through the emitting region, and an external electric signal may be superposed on the first electrode from the second electrode through the emitting region. Accordingly, the laser light and the external electric signal can be synchronized with each other. Alternatively, an optical signal may be incident on one end surface of the layered structure body. Accordingly, the laser light and the external electric signal can be synchronized with each other. Also, in the second compound semiconductor layer, a non-doped compound semiconductor layer (for example, non-doped GaInN layer or non-doped AlGaN layer) may be formed between the third compound semiconductor layer and the electronic barrier layer. Further, a non-doped GaInN layer as an optical guide layer may be formed between the third compound semiconductor layer and the non-doped compound semiconductor layer. The top layer of the second compound semiconductor layer may be occupied by a Mg-doped GaN layer (p-side contact layer).

The mode-locked semiconductor laser element is not limited to the bi-section (two-electrode) semiconductor laser element, and may employ a multi-section (multi-electrode) semiconductor layer element, a saturable absorber layer (SAL) in which the emitting region and the saturable absorption region are arranged in the perpendicular direction, or a weakly index guide (WI) semiconductor laser element having the saturable absorption region provided along the ridge-stripe structure.

The semiconductor-laser-device assembly of the present disclosure may be applied to, for example, an optical disc system, a data communication field, an optical information field, an optical electronic integrated circuit, a field applied with a non-linear optical phenomenon, an optical switch, a laser measurement field and various analysis fields, a superspeed spectroscopic field, a multiphoton excitation spectroscopic field, a mass spectrometric field, a microspectroscopic field using multiphoton absorption, quantum control for chemical reaction, a three-dimensional nanomachining field, various machining fields applied with multiphoton absorption, a medical field, a bioimaging field, a quantum information communication field, and a quantum information processing field.

Embodiment 1

Figure 2:
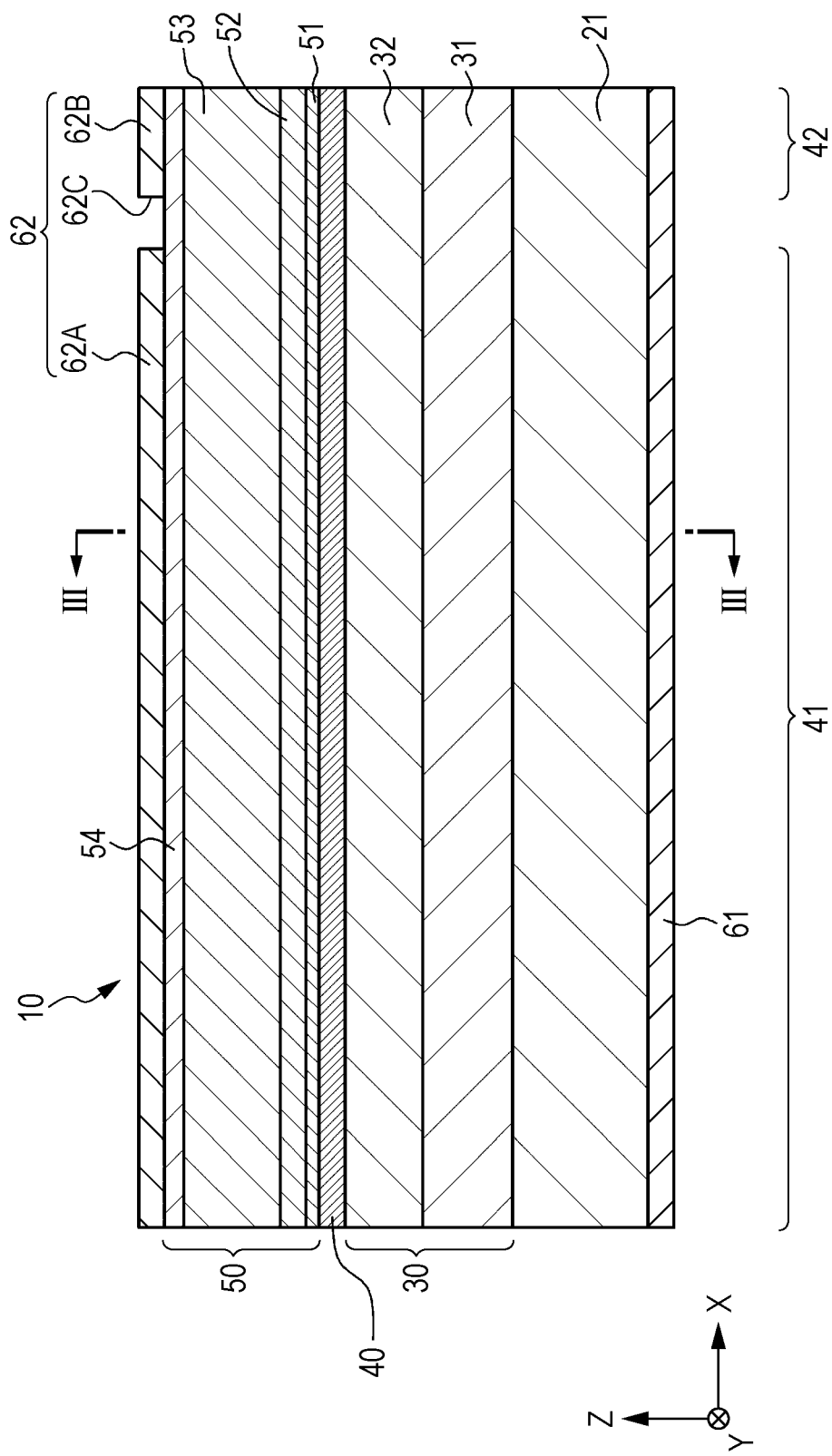
FIG. 2 is a schematic end view along an extending direction of a resonator of a mode-locked semiconductor laser element included in the semiconductor-laser-device assembly of Embodiment 1.
Figure 3:
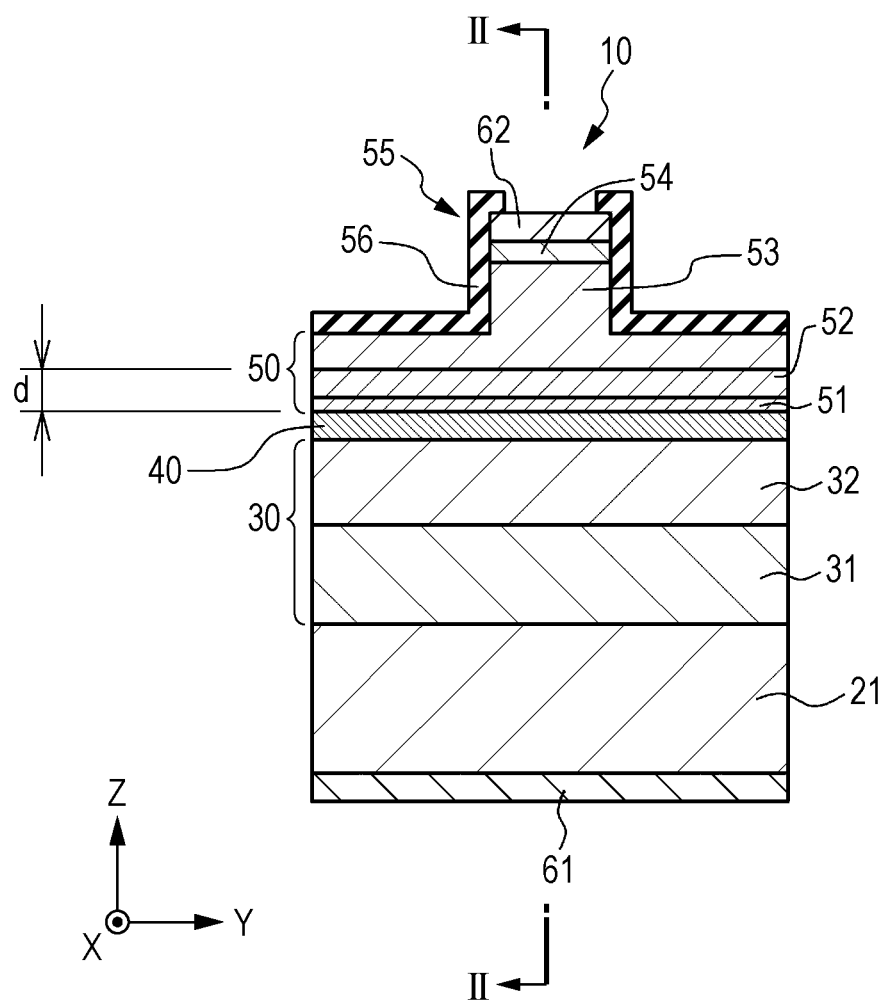
FIG. 3 is a schematic cross-sectional view along a direction orthogonal to the extending direction of the resonator of the mode-locked semiconductor laser element included in the semiconductor-laser-device assembly of Embodiment 1.

Embodiment 1 relates to a semiconductor-laser-device assembly of the present disclosure. FIG. 1 is a conceptual diagram of the semiconductor-laser-device assembly of Embodiment 1. FIG. 2 is a schematic end view along an extending direction of a resonator of a mode-locked semiconductor laser element 10 (that is, along arrow II-II in FIG. 3). FIG. 3 is a schematic cross-sectional view along a direction orthogonal to the extending direction of the resonator of the mode-locked semiconductor laser element (that is, along arrow III-III in FIG. 2).

A semiconductor-laser-device assembly of Embodiment 1 or any of Embodiment 2 to Embodiment 15 (described later) includes a mode-locked semiconductor-laser-element assembly including the mode-locked semiconductor laser element 10, and a dispersion compensation optical system 110, on which laser light emitted from the mode-locked semiconductor laser element 10 is incident and from which the laser light is emitted, and a semiconductor optical amplifier 210 having a layered structure body including a group III-V nitride-based semiconductor layer, the semiconductor optical amplifier configured to amplify the laser light emitted from the mode-locked semiconductor-laser-element assembly.

Herein, the mode-locked semiconductor laser element 10 of Embodiment 1 or any of Embodiment 2 to Embodiment 15 (described later) includes a saturable absorption region. Specifically, the mode-locked semiconductor laser element 10 is formed of a bi-section mode-locked semiconductor laser element in which an emitting region and a saturable absorption region are arranged in parallel to each other in a resonator direction. Alternatively, the mode-locked semiconductor laser element 10 of Embodiment 1 or any of Embodiment 2 to Embodiment 15 (described later) has a layered structure body formed by successively stacking layers, the layers including a first compound semiconductor layer 30 made of a GaN-based compound semiconductor and having a first conductivity type (in an embodiment, n-type conductivity type), a third compound semiconductor layer (active layer) 40 made of a GaN-based compound semiconductor, and a second compound semiconductor layer 50 made of a GaN-based compound semiconductor and having a second conductivity type (in an embodiment, p-type conductivity type) which is different from the first conductivity type.

The first compound semiconductor layer 30 is formed on a base member (specifically, substrate 21).

According to Embodiment 1 or any of Embodiment 2 to Embodiment 15 (described later), the mode-locked semiconductor laser element 10 is a current-injection passive mode-locked semiconductor laser element having a light density of a peak power of $1 \times 10^{10}$ watts/cm$^2$ or higher, or more preferably $1.4 \times 10^{10}$ watts/cm$^2$ or higher, and a carrier density of $1 \times 10^{19}$/cm$^{-3}$ or higher. More specifically, the bi-section mode-locked semiconductor laser element 10 with an emission wavelength range of 405 nm is the mode-locked semiconductor laser element with the first configuration or the second configuration, and as shown in FIGS. 2 and 3, the mode-locked semiconductor laser element 10 includes (a) a layered structure body, in which the first compound semiconductor layer 30 having the first conductivity type (specifically, the n-type conductivity type) and made of the GaN-based compound semiconductor, the third compound semiconductor layer (active layer) 40 made of the GaN-based compound semiconductor and forming an emitting region (gain region) 41 and a saturable absorption region 42, and the second compound semiconductor layer 50 having the second conductivity type (specifically, the p-type conductivity type) different from the first conductivity type and made of the GaN-based compound semiconductor, are successively stacked, (b) a strip-shaped second electrode 62 formed on the second compound semiconductor layer 50, and (c) a first electrode 61 electrically connected with the first compound semiconductor layer 30.

The second electrode 62 is separated by a separation groove 62C into a first portion 62A that causes a direct current to flow to the first electrode 61 through the emitting region (gain region) 41 to obtain a forward bias state, and a second portion 62B that applies an electric field to the saturable absorption region 42 (a second portion 62B that applies a reverse voltage $V_{sa}$ to the saturable absorption region 42). Herein, the electrical resistance value (occasionally called "separation resistance value") between the first portion 62A and the second portion 62B of the second electrode 62 is preferably $1 \times 10$ times or larger, or more preferably, $1.5 \times 10^3$ times or larger the electrical resistance value between the second electrode 62 and the first electrode 61. Also, the electrical resistance value (separation resistance value) between the first portion 62A and the second portion 62B of the second electrode 62 is $1 \times 10^2 \Omega$ or larger, or specifically $1.5 \times 10^4 \Omega$ or larger. In the mode-locked semiconductor laser element 10, the length of a resonator is 600 μm. Also the lengths of the first portion 62A, the second portion 62B, and the separation groove 62C of the second electrode 62 are 560 μm, 30 μm, and 10 μm, respectively. Also, a ridge-stripe structure 55 has a width of 1.4 μm. The ridge-stripe structure 55 is curved toward a light-emission end surface (second end surface) to reduce end-surface reflection.

In Embodiment 1, laser light emitted from the mode-locked semiconductor laser element 10 is incident on the dispersion compensation optical system 110, part of the laser light incident on the dispersion compensation optical system 110 is emitted from the dispersion compensation optical system 110 and fed back to the mode-locked semiconductor laser element 10, and the residual part of the laser light incident on the dispersion compensation optical system 110 is incident on the semiconductor optical amplifier 210 through optical spectrum shaping means 114 and an optical isolator 117 (described later). The optical isolator 117 is arranged to prevent feedback light from the semiconductor optical amplifier 210 from being directed to the mode-locked semiconductor laser element 10. Specifically, the dispersion compensation optical system 110 includes a holographic diffraction grating 111, light collecting means (specifically, lens) 112, and a reflecting mirror (plane reflecting mirror, specifically, for example, dielectric multilayer reflecting mirror) 113. An external resonator structure is formed by the dispersion compensation optical system 110. That is, specifically, an external resonator includes the reflecting mirror 113, and a first end surface of the mode-locked semiconductor laser element 10. The diffraction grating 111 allows diffracted light of first-order or higher to be incident on the light collecting means 112 from among the laser light emitted from the mode-locked semiconductor laser element 10, and causes zeroth-order diffracted light (reflected light) to be emitted to the semiconductor optical amplifier 210. An aspherical convex lens with a focal length of 4.0 mm, which serves as collimating means 11 for collimating the laser light from the mode-locked semiconductor laser element 10, is arranged between the mode-locked semiconductor laser element 10 and the diffraction grating 111. The number of grating patterns of the diffraction grating 111 included in the laser light being incident (colliding with) the diffraction grating 111 is, for example, 2400 patterns/mm in Embodiment 1. The laser light emitted from the mode-locked semiconductor laser element 10 collides with the diffraction grating 111, first-order or higher diffracted light is incident on the light collecting means (lens) 112, the light is reflected by the reflecting mirror 113, the light passes through the light collecting means 112, the diffraction grating 111, and the collimating means 11, and the light is fed back to the mode-locked semiconductor laser element 10. Also, the zeroth-order diffracted light (reflected light) is emitted to the semiconductor optical amplifier 210.

By changing the distance between the diffraction grating 111, and the light collecting means 112 and the reflecting mirror 13 while the distance between the light collecting means 112 and the reflecting mirror 113 is fixed, a group-velocity dispersion value (dispersion compensation amount)

of the dispersion compensation optical system 110 can be changed. Specifically, by moving the light collecting means 112 and the reflecting mirror 113 together on the optical axis of the light collecting means 112 (on the optical path of the first-order diffracted light), a change in dispersion is generated between the laser light incident on the dispersion compensation optical system 110 and the laser light emitted from the dispersion compensation optical system 110. In Embodiment 1, the distance between the light collecting means 112 and the reflecting mirror 113 is 150 mm, and the focal length of the light collecting means (lens) 112 having convex power is 150 mm. That is, the distance between the light collecting means 112 and the reflecting mirror 113 is equal to the focal length of the light collecting means (lens) 112 having convex power. An image of the laser light is formed in a focused manner at the reflecting mirror 113 by the light collecting means 112. The light incident on the light collecting means 112 and the light emitted from the light collecting means 112 has a relationship of incident laser light and emitted laser light of a telescope with a magnification of 1.0.

For example, if the distance between the diffraction grating 111 and the light collecting means 112 is equal to the focal length of the light collecting means 112, the angular dispersion of the laser light directed from the diffraction grating 111 to the light collecting means 112 and the laser light reflected by the reflecting mirror 113 and being incident on the diffraction grating 111 through the light collecting means 112 is not changed. Hence, in this case, the dispersion compensation amount given by the dispersion compensation optical system 110 is zero. In contrast, if the distance between the diffraction grating 111 and the light collecting means 112 is larger than the focal length of the light collecting means 112, the optical path of a long-wavelength component from among the laser light diffracted by the diffraction grating 111 becomes longer than the optical path of a short-wavelength component. In this case, negative group-velocity dispersion is formed. That is, the group-velocity dispersion value becomes negative. In the following description, the distance between the diffraction grating 111 and the light collecting means 112 is called "distance $L_0$." Distance $L_0=0$ mm represents that the distance between the diffraction grating 111 and the light collecting means 112 is equal to the focal length of the light collecting means 112. A value of the distance $L_0$ ($L_0>0$) represents that the distance between the diffraction grating 111 and the light collecting means 112 is larger than the focal length of the light collecting means 112 by $L_0$ mm. The dispersion compensation amount is an amount proportional to the distance $L_0$. Dispersion given by the dispersion compensation optical system 110 when the distance $L_0$ is a positive value is negative group-velocity dispersion.

Figure 46:
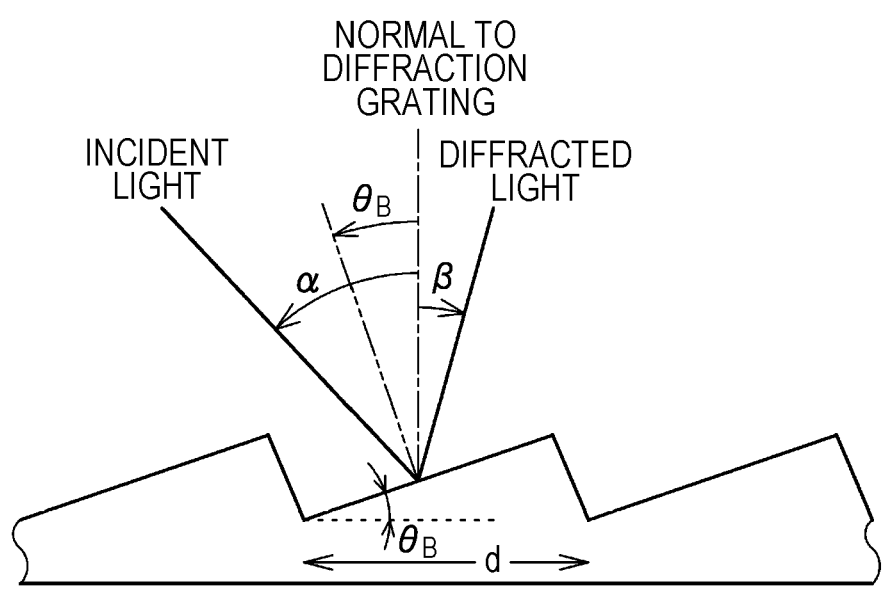
FIG. 46 is a schematic partial cross-sectional view of a diffraction grating.

It is assumed that light with a wavelength $\lambda$ is incident on a reflective diffraction grating at an angle $\alpha$ and is diffracted at an angle $\beta$ as shown in FIG. 46. Herein, the angles $\alpha$ and $\beta$ are angles with respect to the normal to the diffraction grating, and counterclockwise represents positive. Then, a grating equation is as follows:

$$d_G \times \{\sin(\alpha)+\sin(\beta)\}=m\cdot\lambda \quad (A),$$

where $d_G$ is an interval of grooves of the diffraction grating, and m is an order of diffraction (m=0, ±1, ±2, . . . ).

When incident laser light and m-th-order diffracted light have the relationship of mirror reflection with respect to an inclined surface of the groove, a major portion of energy is concentrated at the m-th-order diffracted light. The inclination of the groove at this time is called blaze angle. When the blaze angle is expressed by $\theta_B$, an expression is established as follows:

$$\theta_B=(\alpha+\beta)/2.$$

Also, the wavelength at this time is called blaze wavelength. When the blaze wavelength is expressed by $\lambda_B$, an expression is established as follows:

$$\lambda_B=\{2d_G/m\}\sin(\theta_B)\cdot\cos(\alpha-\theta_B).$$

In Embodiment 1 or any of Embodiment 2 to Embodiment 15 (described later), the group-velocity dispersion value in the dispersion compensation optical system is set to be negative. That is, the distance between the diffraction grating 111 and the light collecting means 112 is set to be larger than the focal length of the light collecting means 112. Alternatively, operation is made with a group-velocity dispersion value that causes the pulse time width of the laser light emitted to the semiconductor optical amplifier 210 to be a minimum value, or a value around the group-velocity dispersion value. Alternatively, when the group-velocity dispersion value in the dispersion compensation optical system is monotonically changed from a first predetermined value $GVD_1$ to a second predetermined value $GVD_2$, if $|GVD_1|<|GVD_2|$, the pulse time width of the laser light emitted from the mode-locked semiconductor-laser-element assembly and being incident on the semiconductor optical amplifier 210 is decreased, exceeds a minimum value $PW_{min}$, and is increased. The group-velocity dispersion value in the dispersion compensation optical system is negative. That is, since $0>GVD_1>GVD_2$, the group-velocity dispersion value in the dispersion compensation optical system is monotonically decreased from the first predetermined value $GVD_1$ to the second predetermined value $GVD_2$. Also, in this case, for example, an expression is satisfied as follows:

$$(PW_1-PW_{min})/|GVD_{min}-GVD_1|\geq 2\times(PW_2-PW_{min})/|GVD_2-GVD_{min}|,$$

if $$|GVD_1/GVD_{min}|=0.5, \text{ and}$$

$$|GVD_2/GVD_{min}|=2,$$

where $GVD_{min}$ is a group-velocity dispersion minimum value of the dispersion compensation optical system when the pulse time width of the laser light emitted to the semiconductor optical amplifier 210 is the minimum value $PW_{min}$, $PW_1$ is a pulse time width of the laser light when the group-velocity dispersion value in the dispersion compensation optical system is the first predetermined value $GVD_1$ being negative, and $PW_2$ is a pulse time width of the laser light when the group-velocity dispersion value in the dispersion compensation optical system is the second predetermined value $GVD_2$ being negative.

Further, operation is made with the group-velocity dispersion minimum value $GVD_{min}$ that causes the pulse time width of the laser light emitted to the semiconductor optical amplifier 210 to be the minimum value $PW_{min}$, or a value around the group-velocity dispersion minimum value $GVD_{min}$. Accordingly, a pulse time width of laser light with several hundreds of femtoseconds can be obtained.

Hereinafter, a state of generated pulsed laser light in the subpicosecond order is described. In the following description, unlike the above-described semiconductor-laser-device assembly of Embodiment 1, a dispersion compensation optical system, in which the distance between the light collecting means 112 and the reflecting mirror 113 is 100 mm and the focal length of the light collecting means (lens) 112 having convex power is 100 mm, was used. Also, laser light emitted from the mode-locked semiconductor-laser-element assembly passed through a band pass filter (transmission band Δλ=1.3 nm) one time.

The measurement principle for intensity correlation measurement of laser light, a kind of correlation function, a pulse time width, and a deriving method are described in detail in A. Yariv et al., "Foundations of Optical Electronics, Third Edition," Maruzen Co., Ltd., pp 183-196, or Vasil'ev, "Ultrafast diode lasers," Artech House, pp 39-43.

Figure 4A:
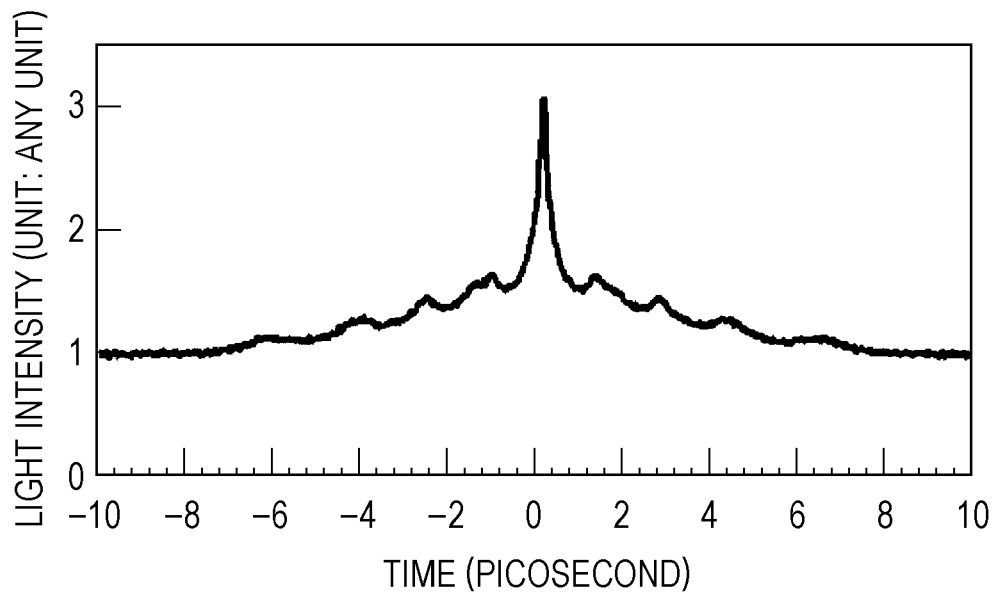
FIGS. 4A and 4B are an illustration showing a correlated waveform (time waveform) of pulsed laser light and an illustration showing an optical spectrum of the pulsed laser light obtained in a mode-locked semiconductor-laser-element assembly forming the semiconductor-laser-device assembly of the present disclosure.

In the semiconductor-laser-device assembly, FIG. 4A shows a correlated waveform (time waveform) of laser light emitted from the mode-locked semiconductor-laser-element assembly. In FIG. 4A, the horizontal axis plots the time (unit: picosecond) and the vertical axis plots the light intensity (unit: any unit). Herein, as driving conditions of the mode-locked semiconductor laser element, a direct current (gain current I) flowing from the second electrode 62 to the first electrode 61 through the emitting region (gain region) 41 was 130 milliamperes and a reverse bias voltage $V_{sa}$ to be applied to the saturable absorption region 42 was −7 volts, and $L_0$=7.28 mm. The dispersion compensation optical system has a group-velocity dispersion value of −0.0390 ps² [(picoseconds)²].

Figure 4B:
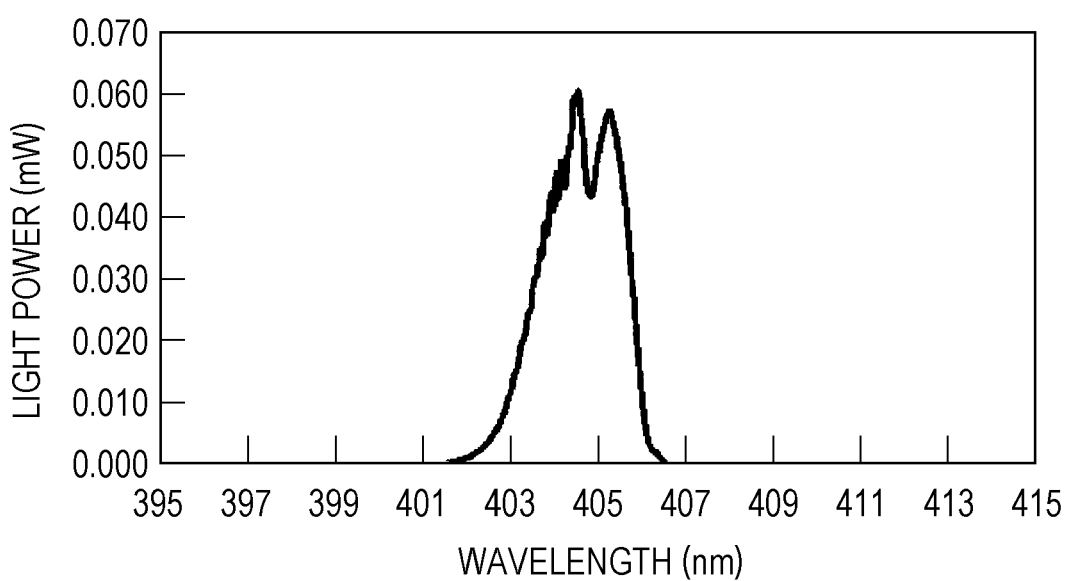
Figure 5A:
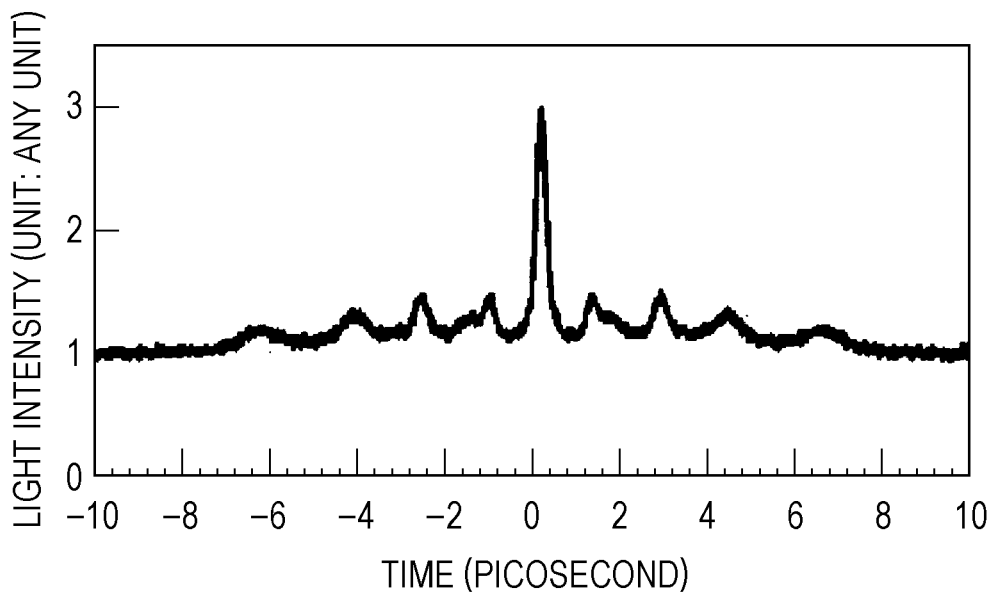
FIGS. 5A and 5B are an illustration showing a correlated waveform (time waveform) and an illustration showing an optical spectrum when the laser light shown in FIG. 4B passes through a band pass filter and a short-wavelength side of the laser light is extracted.
Figure 5B:
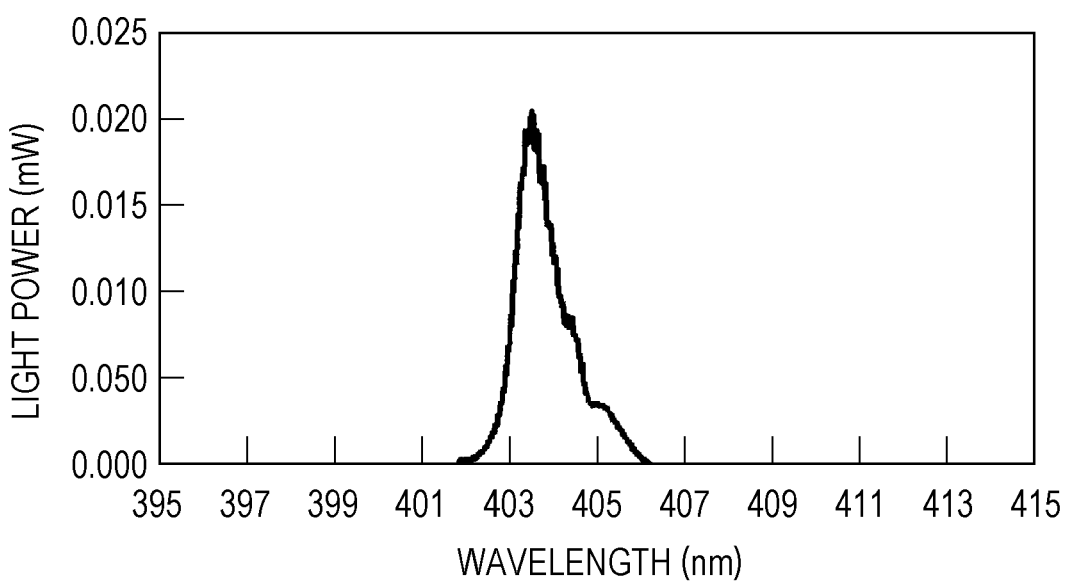

A value of the full width at half maximum (FWHM) in the correlated waveform of the laser light emitted from the mode-locked semiconductor-laser-element assembly is 0.45 picoseconds. The correlated waveform has a characteristic shape different from a correlated waveform of laser light of a gauss type or sech² type. An optical spectrum at this time is shown in FIG. 4B. In FIG. 4B, the horizontal axis plots the wavelength (unit: nm) and the vertical axis plots the light power (unit: milliwatt). FIG. 5A shows a correlated waveform (time waveform) when the thus obtained laser light passes through the band pass filter (transmission band Δλ=1.3 nm) one time and a short-wavelength side of the laser light is extracted. In FIG. 5A, the horizontal axis plots the time (unit: picosecond) and the vertical axis plots the light intensity (unit: any unit). Since the laser light passes through the band pass filter, the tail (outskirt) of the correlated waveform is eliminated, a sech² correlated waveform (called "correlated waveform of center portion" for convenience) is obtained around the time of zero, and further, a plurality of side pulses are obtained at both sides of the correlated waveform of the center portion. The full width at half maximum of the correlated waveform of the center portion is 290 femtoseconds. If a convolution factor 0.65 of an autocorrelation function of a sech² function is used, the pulse time width of generated laser light is evaluated as 190 femtoseconds. FIG. 5B shows an optical spectrum at this time. The optical spectrum width is 1.06 nm, and the time bandwidth product is calculated as 0.34, which is close to the limit 0.315 of the Fourier product of the sech² function. In FIG. 5B, the horizontal axis plots the wavelength (unit: nm) and the vertical axis plots the light power (unit: milliwatt). Also, the output power from the semiconductor-laser-device assembly was 11.46 milliwatts before passage through the band pass filter, and 3.0 milliwatts after passage through the band pass filter. The laser light has a repetition frequency of 1.03 GHz. The peak power is calculated as 10 watts in accordance with the pulse time width of the obtained laser light. It is assumed that 66% of pulse energy is concentrated at the center pulse with reference to the heights of a plurality of pulses observed in the correlated waveform.

Figure 6:
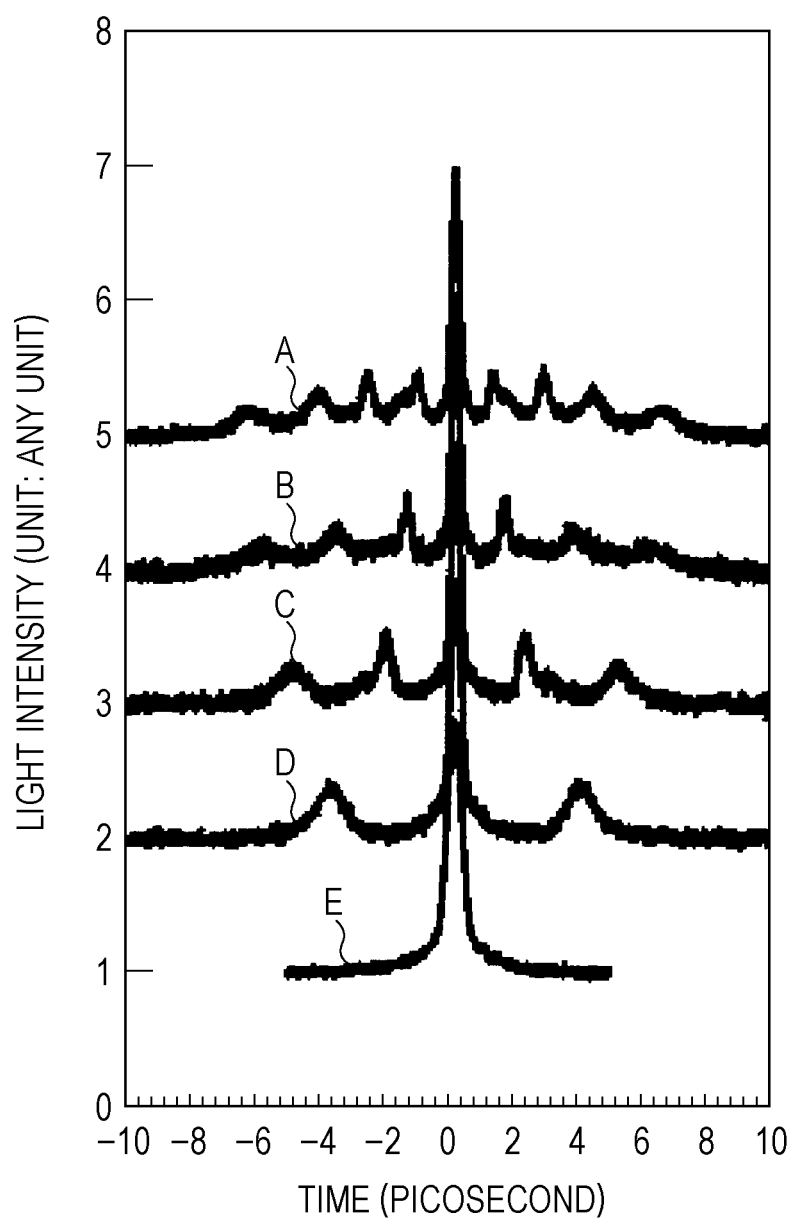
FIG. 6 is an illustration showing correlated waveforms (time waveforms) of laser light with various dispersion compensation amounts.

Such a characteristic pulse form is changed depending on the dispersion compensation amount (group-velocity dispersion value). FIG. 6 shows correlated waveforms (time waveforms) of laser light with various dispersion compensation amounts. In FIG. 6, the horizontal axis plots the time (unit: picosecond) and the vertical axis plots the light intensity (unit: any unit). Any of the correlated waveforms is a pulse waveform after passage through the band pass filter. In this case, the gain current I was 120 milliamperes and the reverse bias voltage $V_{sa}$ was −7 volts. In FIG. 6, the group-velocity dispersion value of each laser light is as follows. Referring to FIG. 6, it is found that, as the group-velocity dispersion value decreases (the absolute value of the group-velocity dispersion value increases), the number of sub-pulses other than main pulse at the time of zero decreases. Also, as the group-velocity dispersion value decreases (the absolute value of the group-velocity dispersion value increases), the pulse time width of the main pulse increases. The group-velocity dispersion value when laser light "A" is obtained is the group-velocity dispersion minimum value $GVD_{min}$, and the group-velocity dispersion value when laser "E" is obtained is $GVD_S$. The "value around the group-velocity dispersion value" is defined as follows:

$$GVD_S \pm |GVD_{min} - GVD_S|.$$

Laser light "A": −0.0390 ps²
Laser light "B": −0.0406 ps²
Laser light "C": −0.0443 ps²
Laser light "D": −0.0497 ps²
Laser light "E": −0.0630 ps²

Consequently, to obtain the smallest pulse time width, the negative group-velocity dispersion value (group-velocity dispersion value) has to be decreased within a certain range. However, in some cases, a sub-pulse may be generated. Hence, simply setting the pulse time width to be the smallest may not be desirable depending on the purpose of use of the semiconductor-laser-device assembly. For example, if a generated ultrashort pulse is amplified by the semiconductor optical amplifier, energy of the amplified pulse may be divided into sub-pulses.

Figure 7A:
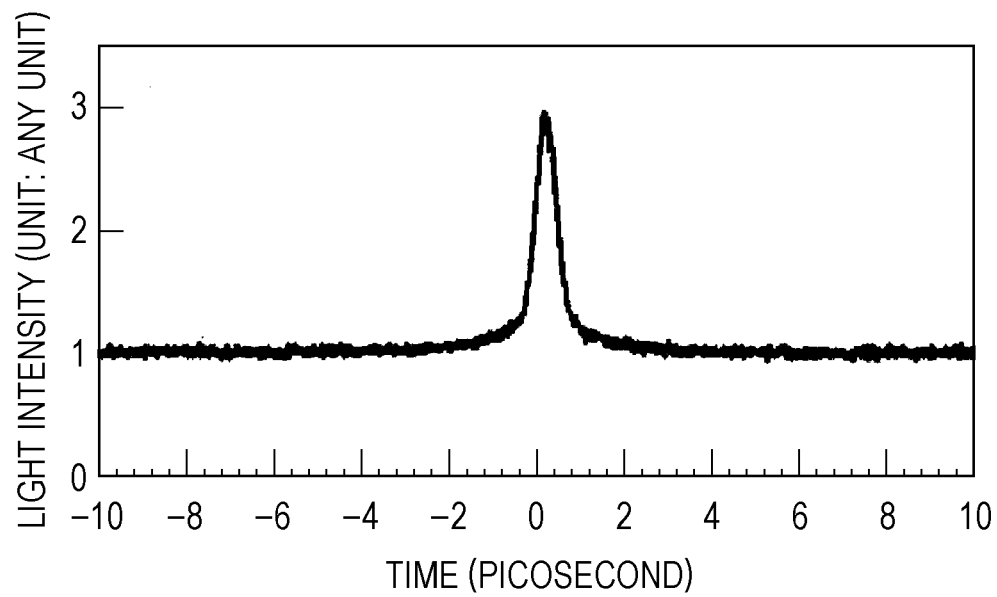
FIGS. 7A and 7B are an illustration showing a correlated waveform (time waveform) of laser light and an illustration showing an optical spectrum of the laser light when a pulse to be generated is only a main pulse and the time width of pulsed laser light is minimized in the mode-locked semiconductor-laser-element assembly forming the semiconductor-laser-device assembly of the present disclosure.
Figure 7B:
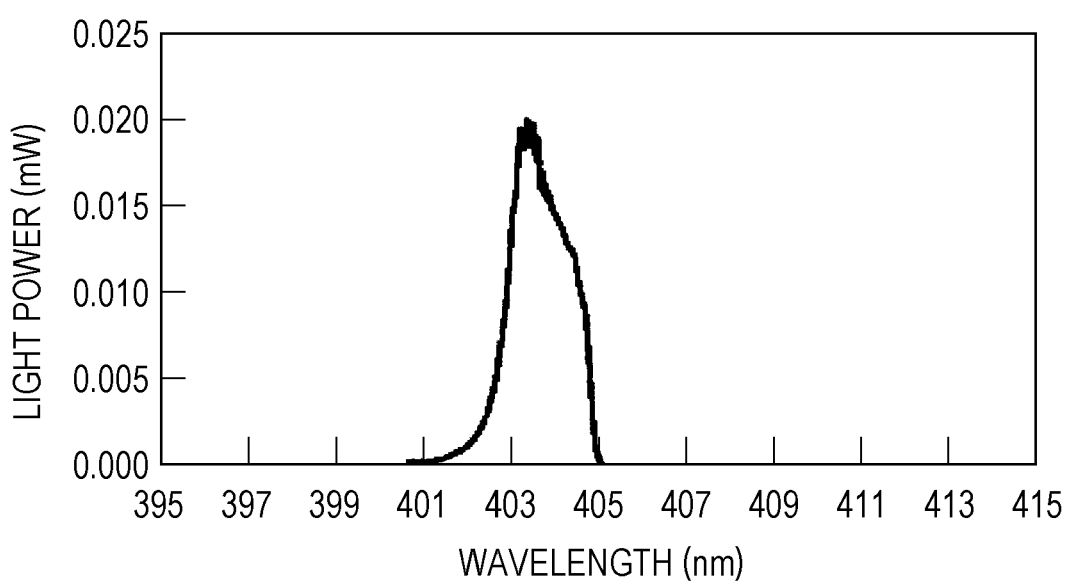

Therefore, by properly setting a dispersion compensation amount (group-velocity dispersion value), more specifically, by properly setting the distance $L_0$, pulses to be generated may be only main pulses, and the pulse time width may be decreased (narrowed) as much as possible. FIG. 7A shows a correlated waveform (time waveform) of laser light in this case. In FIG. 7A, the horizontal axis plots the time (unit: picosecond) and the vertical axis plots the light intensity (unit: any unit). Herein, the gain current I was 120 milliamperes and the reverse bias voltage $V_{sa}$ was −7 volts. The group-velocity dispersion value is −0.0630 ps², the full width at half maximum in the correlated waveform of the obtained laser light is 0.57 picoseconds, and the pulse time width of the sech² shape is 0.37 picoseconds. Also, FIG. 7B shows a corresponding optical spectrum. It is found that the optical spectrum width is 1.56 nm, and hence the time bandwidth product is calculated as 1.06, and it is found that an emitted pulse is chirped. An average power after passage through the band pass filter is 3.0 milliwatts, and the peak power of the emitted laser light can be obtained as about 8 watts.

The light density at the second end surface when such laser light is generated can be obtained as follows. The light density at the second end surface is defined by a value obtained by dividing the light power by a cross-sectional area of a near-field pattern of the laser light at the second end surface. The light power at the second end surface has to be divided by efficiency when the laser light is output from the resonator. In this configuration, the light power is about 5%. The cross-sectional area of the near-field pattern represents a cross-sectional area when the light intensity of the near-field pattern has an intensity that is $1/e^2$ times the peak power. The cross-sectional area of the near-field pattern in the mode-locked semiconductor laser element is 1.08 μm$^2$, and if the value is used, the light density is calculated as about 15 gigawatts/cm$^2$.

Described below are driving conditions when pulsed laser light in the subpicosecond order is generated.

Figure 8A:
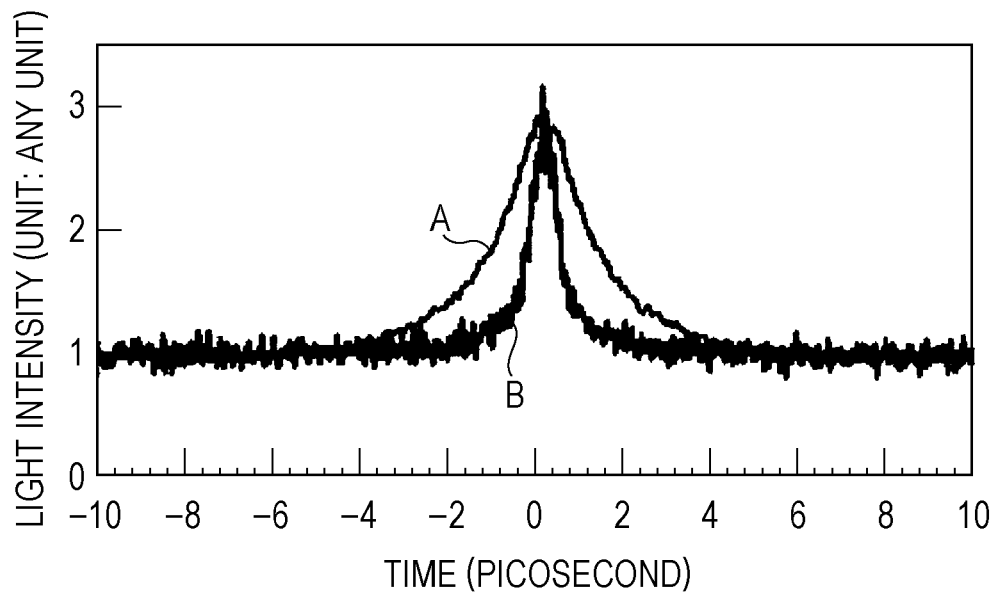
FIGS. 8A and 8B are an illustration showing a correlated waveform (time waveform) of laser light and an illustration showing an optical spectrum of the laser light under a certain driving condition of the mode-locked semiconductor-laser-element assembly forming the semiconductor-laser-device assembly of the present disclosure.
Figure 8B:
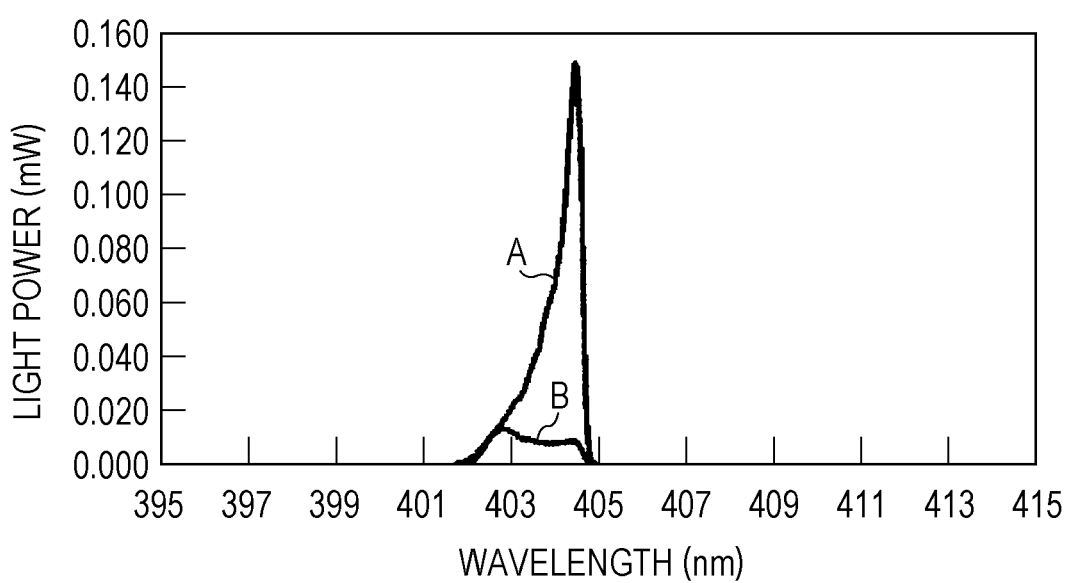

The driving conditions when pulsed laser light in the subpicosecond order depend on the gain current I, the reverse bias voltage $V_{sa}$, and the dispersion compensation amount (group-velocity dispersion value) [that is, distance $L_0$]. FIG. 8A shows a correlated waveform (time waveform) of laser light under certain driving conditions of the lowest gain current I (100 milliamperes) and the lowest reverse bias voltage $V_{sa}$ (−5.5 volts) as long as laser oscillation can be obtained, and distance $L_0$=14.1 mm. FIG. 8B shows an optical spectrum. In FIGS. 8A and 8B, "A" represents a state before passage through the band pass filter, and "B" represents a state after passage through the band pass filter. The respective light powers are 7.04 milliwatts and 1.5 milliwatts. After passage through the band pass filter, the pulse time width of the laser light is 0.42 picoseconds. Also, the group-velocity dispersion value at this time is −0.0753 ps$^2$. Since the driving conditions depend on a feedback amount of the external resonator in addition to the gain current I, the reverse bias voltage $V_{sa}$, and the dispersion compensation amount (group-velocity dispersion value), the lower limit values of the driving conditions as long as laser oscillation can be obtained are not limited to the above-described values.

Figure 9A:
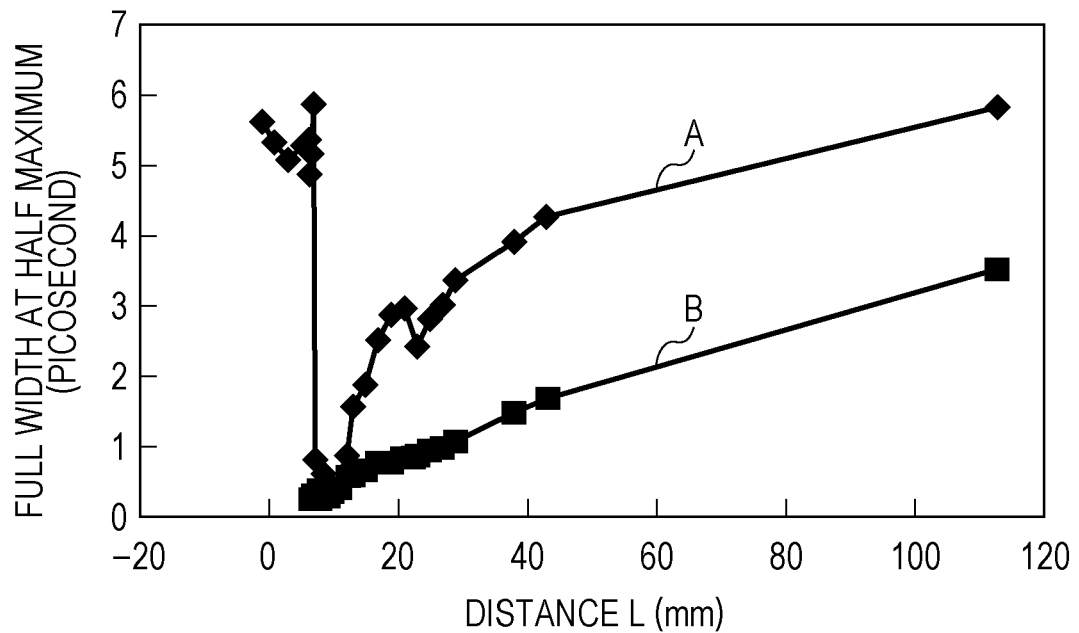
FIGS. 9A and 9B are an illustration showing a result when the relationship between a distance L0 and a full width at half maximum of laser light is obtained and an illustration showing a result when the relationship between a group-velocity dispersion value and a full width at half maximum of laser light is obtained in the mode-locked semiconductor-laser-element assembly forming the semiconductor-laser-device assembly of the present disclosure.
Figure 9B:
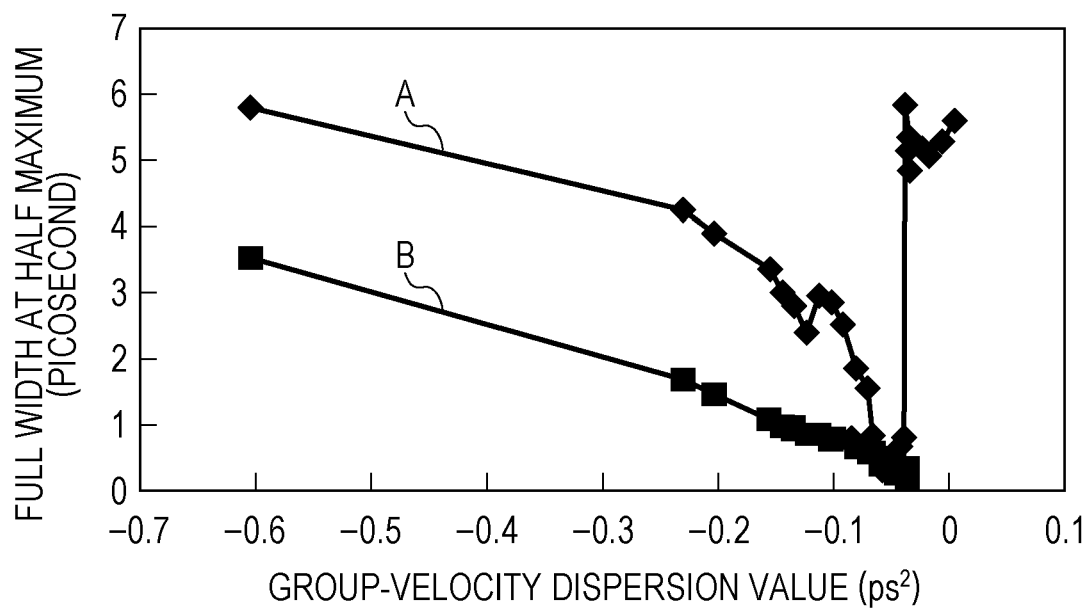

Under the conditions of reverse bias voltage $V_{sa}$=−7 volts and gain current I=130 milliamperes, FIG. 9A shows a result when the relationship between the distance $L_0$ and the full width at half maximum of laser light is obtained, and FIG. 9B shows a result when the relationship between a group-velocity dispersion value and the full width at half maximum in the correlated waveform of the laser light is obtained. FIGS. 9A and 9B are graphs created based on the same data. Also, "A" represents the state before passage through the band pass filter, and "B" represents the state after passage through the band pass filter. It is to be noted that a relationship is present between the distance $L_0$ and the group-velocity dispersion value shown in FIGS. 9A and 9B as follows:

group-velocity dispersion value (ps$^2$)=−5.352×10$^{-3}$× $L_0$ (mm).

In general, this is given as follows:

group-velocity dispersion value=−($\lambda^3$/ ($\pi \cdot c^2 \cdot d_G^2 \cdot \cos^2\theta_r$))·2·$L_0$, where
$\lambda$: a wavelength,
c: the light speed,
$d_G$: an interval between grooves of the diffraction grating, and
$\theta_r$: is an angle of diffracted light with respect to the normal to the diffraction grating.

Referring to FIG. 9A, it is found that the pulse full width at half maximum rapidly decreases toward a certain distance $L_0$, and a minimum value is obtained. It is found that the above-described side pulse appears by a slight change in dispersion compensation amount corresponding to a value around the dispersion compensation amount corresponding to the minimum value of the pulse full width at half maximum (called "dispersion compensation minimum amount," in the example shown in FIG. 9A, distance $L_0$=11.8 mm). Also, the dispersion compensation amount with a larger absolute value than the absolute value of the dispersion compensation minimum value has a smaller change in pulse full width at half maximum with respect to the dispersion compensation amount, as compared with a change in pulse full width at half maximum in a range of dispersion compensation amounts with smaller absolute values than the absolute value of the dispersion compensation minimum amount. In a range of the dispersion compensation amounts with larger absolute values than the absolute value of the dispersion compensation minimum value, a frequency chirp of a pulse to be generated can be adjusted by changing the dispersion compensation amount. When an optical pulse with a minimum value of the pulse full width at half maximum passes through the band pass filter and only a short-wavelength component is extracted, a clean correlated waveform indicating an optical pulse without an outskirt can be obtained. Further, in a range from the group-velocity dispersion value with the minimum pulse time width to the group-velocity dispersion value at the negative side, a clean correlated waveform indicating laser light without an outskirt can be obtained.

Alternatively, referring to FIG. 9B, in the state before passage through the band pass filter, an expression is satisfied as follows:

$(PW_1-PW_{min})/|GVD_{min}-GVD_1|$ ≥ $2\times(PW_2-PW_{min})/|GVD_2-GVD_{min}|$, where $GVD_{min}$ is a group-velocity dispersion minimum value of the dispersion compensation optical system when the pulse time width of the laser light emitted to the semiconductor optical amplifier 210 is the minimum value $PW_{min}$, $PW_1$ is a pulse time width of the laser light when the group-velocity dispersion value in the dispersion compensation optical system is the first predetermined value $GVD_1$ being negative, and $PW_2$ is a pulse time width of the laser light when the group-velocity dispersion value in the dispersion compensation optical system is the second predetermined value $GVD_2$ being negative, if $|GVD_1/GVD_{min}|$=0.53, and $|GVD_2/GVD_{min}|$=2.1, where
$PW_1$=5.3 picoseconds,
$PW_2$=2.9 picoseconds,
$PW_{min}$=0.4 picoseconds,
$GVD_1$=−0.0255 ps$^2$,
$GVD_2$=−0.101 ps$^2$, and
$GVD_{min}$=−0.048 ps$^2$.

In the range from the group-velocity dispersion value with the minimum pulse time width to the group-velocity dispersion value at the negative side, a correlated waveform indicating clean laser light without an outskirt can be obtained. The range of such group-velocity dispersion values can be figured out by a RF spectrum of laser light output from the mode-locked semiconductor-laser-element assembly. Specifically, when a high-speed photodiode with a band width equal to or larger than the repetition frequency receives pulsed laser light, an optical spectrum for the repetition period of the pulsed laser light can be obtained.

Figure 10A:
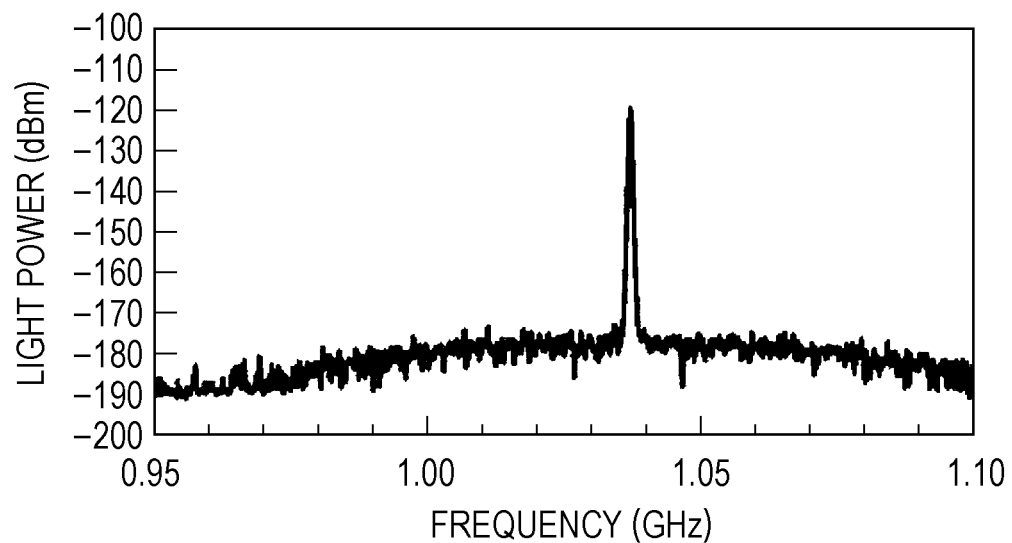
FIGS. 10A and 10B are an illustration showing a RF spectrum when the group-velocity dispersion value is $-0.0257$ ps2 and an illustration showing a RF spectrum when the group-velocity dispersion value is $-0.064$ ps2 in the mode-locked semiconductor-laser-element assembly forming the semiconductor-laser-device assembly of the present disclosure.
Figure 10B:
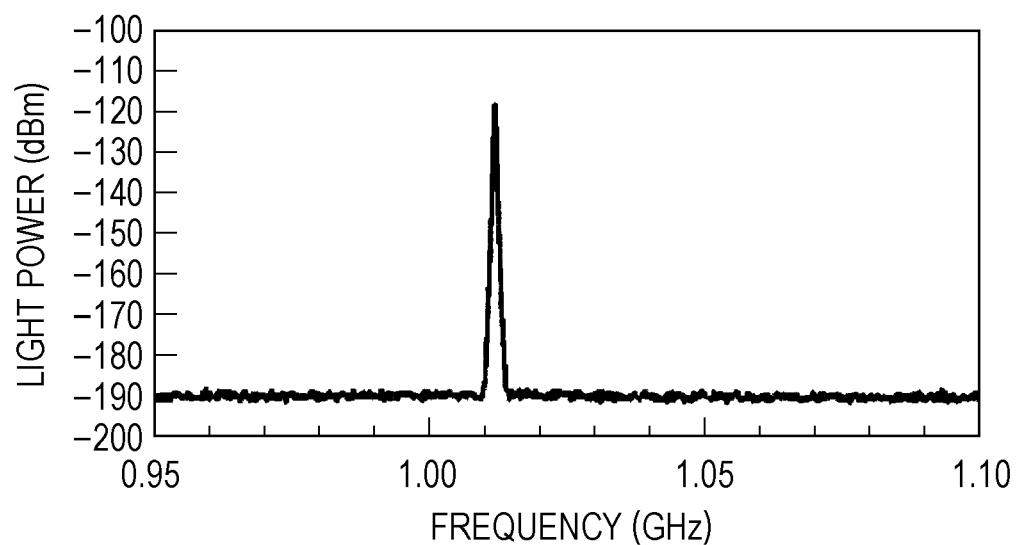

The repetition period is determined in accordance with the length X' of the external resonator. Since various kinds of dispersion media are present in the mode-locked semiconductor-laser-element assembly, a variation is typically present in the periodic time depending on the wavelength. The RF spectrum reflects the repetition frequency and the variation in repetition frequency. FIG. 10A shows a RF spectrum when the group-velocity dispersion value is −0.0257 $ps^2$. FIG. 10B shows a RF spectrum when the group-velocity dispersion value is −0.064 $ps^2$. The group-velocity dispersion value that can provide the optical spectrum in FIG. 10A is smaller than the group-velocity dispersion value at the position indicating the minimum pulse time width in FIG. 9B (the absolute value of the group-velocity dispersion value is large). As shown in FIG. 10B, a noise component indicating a fluctuation of a periodic time with respect to the main peak of the repetition frequency is suppressed by 60 dB or more depending on the group-velocity dispersion value. That is, the laser light incident on the semiconductor optical amplifier 210 has a noise component, with respect to a main oscillation frequency, of −60 dB or lower. Also, it is found that operation is preferably made with the group-velocity dispersion minimum value $GVD_{min}$ that causes the pulse time width of the laser light emitted to the semiconductor optical amplifier 210 to be the minimum value $PW_{min}$, or a value around the group-velocity dispersion minimum value $GVD_{min}$. The pulse time width that indicates the minimum value depends on the gain current I and decreases as the gain current I increases and the laser light to be generated is only a main pulse if the reverse bias voltage $V_{sa}$ is constant. Table 2 shows the pulse time width (unit: picosecond) with respect to the gain current I (unit: milliampere) indicating the minimum pulse time width. In Table 2, "pulse time width A" is a value before passage through the band pass filter (unit: picosecond) and "pulse time width B" is a value after passage through the band pass filter. Also, the reverse bias voltage $V_{sa}$ is a constant value (−7 volts). The repetition frequency of pulsed laser light is doubled from the border of gain current I=120 milliamperes. Hence, the oscillation characteristic may be changed, and the change in pulse time width B becomes discontinuous from the border of the gain current value.

TABLE 2

| Gain current I | Pulse time width A | Pulse time width B |
|---|---|---|
| 100 | 2.35 | 0.80 |
| 105 | 2.00 | 0.55 |
| 110 | 1.75 | 0.37 |
| 115 | 1.50 | 0.29 |
| 120 | 1.23 | 0.55 |
| 125 | 1.20 | 0.37 |
| 130 | 1.03 | 0.29 |

Figure 11:
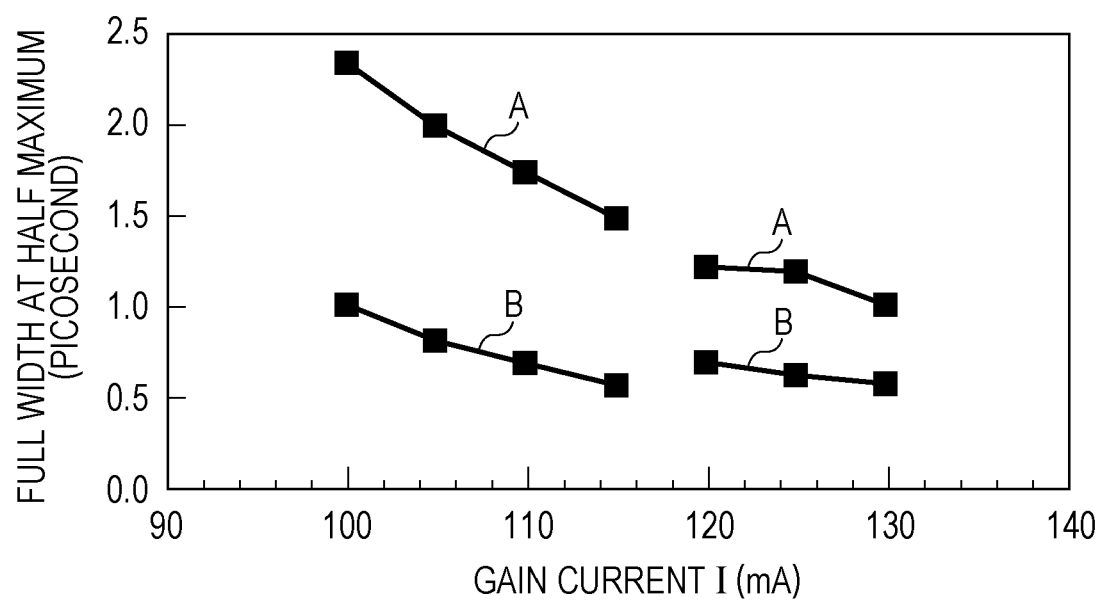
FIG. 11 is an illustration showing that a pulse time width, which becomes minimum because of an increase in gain current, is decreased in the mode-locked semiconductor-laser-element assembly forming the semiconductor-laser-device assembly of the present disclosure.

In this way, the pulse time width, which becomes minimum as the gain current I increases, of laser light tends to be narrowed. FIG. 11 shows dependence of the pulse time width of laser light with respect to the gain current I.

Meanwhile, in the mode-locked semiconductor laser element, when the light power density and the carrier density of the active layer (gain portion) exceed specific values, the carrier is consumed by stimulated emission, hence the refractive index in the active layer is actively changed, and the oscillation spectrum is expanded. Such a phenomenon is called self-phase modulation. An increase in oscillation spectrum width by the self-phase modulation causes the pulse time width to be narrowed. By giving a proper group-velocity dispersion value by the dispersion compensation optical system with respect to the self-phase modulation, a proper optical spectrum width can be obtained, and laser light pulse in the subpicosecond order can be generated. Such a characteristic is similar to a feature of soliton mode-locking which may be observed when the self-phase modulation and the proper group-velocity dispersion value interact with each other in the resonator. This is very effective as a method of narrowing the time width of the generated laser light pulse to the subpicosecond order (for example, 200 femtoseconds) or smaller.

In the semiconductor-laser-device assembly of Embodiment 1, the laser light output from the mode-locked semiconductor-laser-element assembly has a frequency chirp being negative (that is, down-chirp) and a pulse time width of 0.5 picoseconds or smaller. Also, the mode-locked semiconductor laser element 10 has a repetition frequency of the laser light of 1 GHz or lower.

Figure 12A:
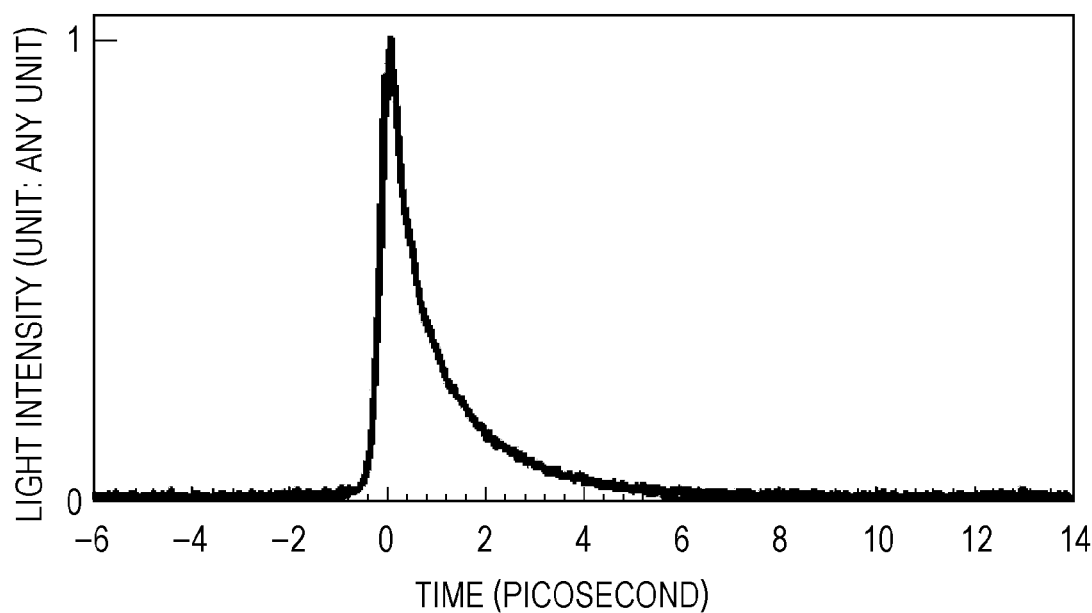
FIG. 12A is an illustration showing a correlated waveform (time waveform) of pulsed laser light emitted from the mode-locked semiconductor-laser-element assembly to the semiconductor optical amplifier when a negative group-velocity dispersion value is given by a dispersion compensation optical system in the semiconductor-laser-device assembly of Embodiment 1.

Specifically, in the semiconductor-laser-device assembly of Embodiment 1, when the negative group-velocity dispersion is given by the dispersion compensation optical system 110, as shown in FIG. 12A, the laser light emitted from the mode-locked semiconductor-laser-element assembly to the semiconductor optical amplifier 210 exhibits single exponential attenuation indicating a steep rise of about 200 femtoseconds. Meanwhile, regarding the laser light, it is found that a single pulse with a pulse time width of laser light of 300 femtoseconds or smaller can be obtained by extracting an end at the short-wavelength side of the optical spectrum.

The semiconductor-laser-device assembly of Embodiment 1 further includes optical spectrum shaping means 114 for shaping the optical spectrum of the laser light emitted from the mode-locked semiconductor-laser-element assembly. The laser light after shaping is incident on the semiconductor optical amplifier 210. Since the intensity of the optical spectrum of the laser light increases toward the long-wavelength side, the optical spectrum may not be sufficiently shaped if only the band pass filter is solely used, and a good correlated waveform (time waveform) may not be obtained. This is because the transmission function of the band pass filter using the dielectric multilayer film is approximated by a Lorentz function. Therefore, the optical spectrum shaping means 114 is preferably formed of a band pass filter made of a dielectric multilayer film, and laser light emitted from the mode-locked semiconductor-laser-element assembly preferably passes through the band pass filter a plurality of times (specifically, two times in Embodiment 1). In this way, since the laser light passes through the band pass filter a plurality of times, a late-time pulse component and an incoherent component can be eliminated.

In Embodiment 1, more specifically, the optical spectrum shaping means 114 used the band pass filter formed by stacking a dielectric thin film with a low dielectric constant and a dielectric thin film with a high dielectric constant. The band pass filter is a dielectric multilayer film resonator containing a single half-wavelength resonator. When laser light passes a plurality of times, the passing amount of a wavelength component other than that of a desirable wavelength can be properly decreased. As long as a value desired as an attenuation amount of light other than a desirable wavelength component is obtained, the band pass filter is not limited to the single half-wavelength resonator. A band pass filter formed of a plurality of resonators or a resonator with a wavelength that is an integral multiple of half-wavelength may be used. Also, as long as an optical spectrum shape for incidence on the semiconductor optical amplifier 210 is obtained and the dispersion state of laser light is not changed after optical spectrum shaping, the optical spectrum shaping means is not limited to the band pass filter.

FIG. 1 illustrates an example of an optical arrangement when transmission through the band pass filter is made two times. The laser light emitted from the mode-locked semiconductor-laser-element assembly passes through the optical spectrum shaping means 114, is reflected by a reflecting mirror 115A, passes through the optical spectrum shaping means 114 again, is reflected by reflecting mirrors 115B and 116, and is guided to the optical isolator 117. The laser light passing through the optical isolator 117 passes through light collecting means (lens) 211A, and is incident on the semiconductor optical amplifier 210. Then, the laser light output from the semiconductor optical amplifier 210 is output to the outside of the system through light collecting means (lens) 211B.

Figure 12B:
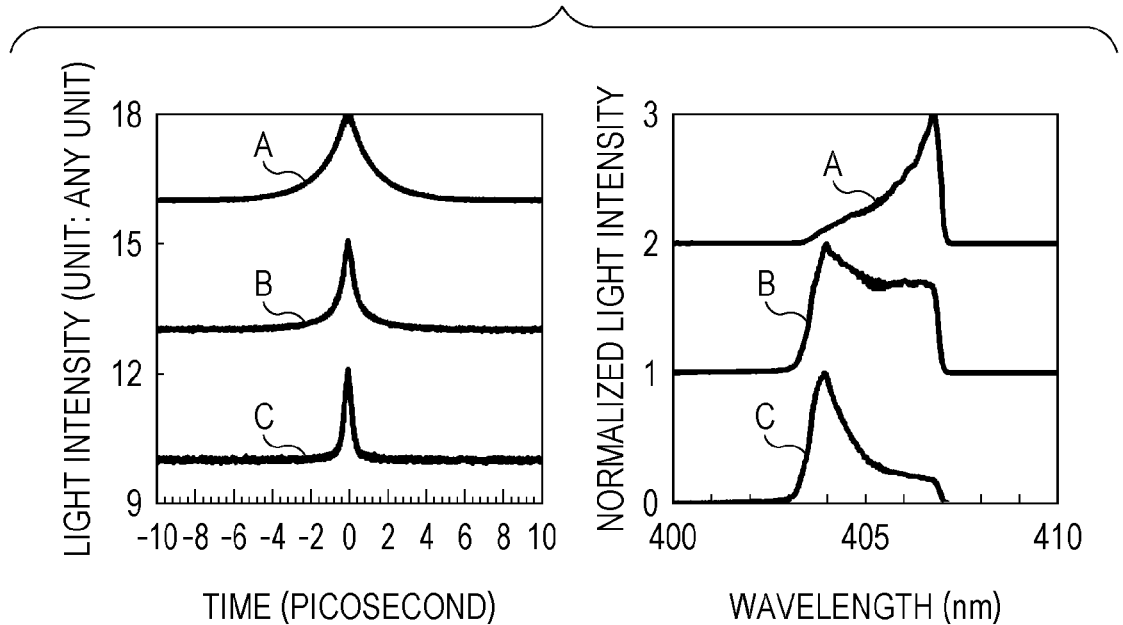
FIG. 12B is an illustration showing a change in optical spectrum of laser light in accordance with the number of times the laser light passes through optical spectrum shaping means (optical spectrum shaping portion) and an illustration showing a change in correlated waveform (time waveform) of laser light in accordance with the number of times the laser light passes through the optical spectrum shaping means in the semiconductor-laser-device assembly of Embodiment 1.

A change in optical spectrum depending on the number of times the laser light passes through the band pass filter (transmission band $\Delta\lambda=2.0$ nm) is shown at the right side in FIG. 12B, and a change in correlated waveform (time waveform) depending on the number of times the laser light passes through the band pass filter is shown at the left side in FIG. 12B. In FIG. 12B, "A" represents an optical spectrum etc. before passage through the band pass filter, "B" represents an optical spectrum etc. when the laser light passes through the band pass filter one time, and "C" represents an optical spectrum etc. when the laser light passes through the band pass filter two times. It is found that if the optical spectrum is shaped and a long-waveform-side component of the optical spectrum is eliminated from FIG. 12B, a late-time component found in an outskirt of the correlated waveform can be eliminated. In this way, when the laser light obtained from the mode-locked semiconductor-laser-element assembly is incident on the GaInN-based semiconductor optical amplifier 210, optical spectrum shaping is preferably performed.

Figure 13:
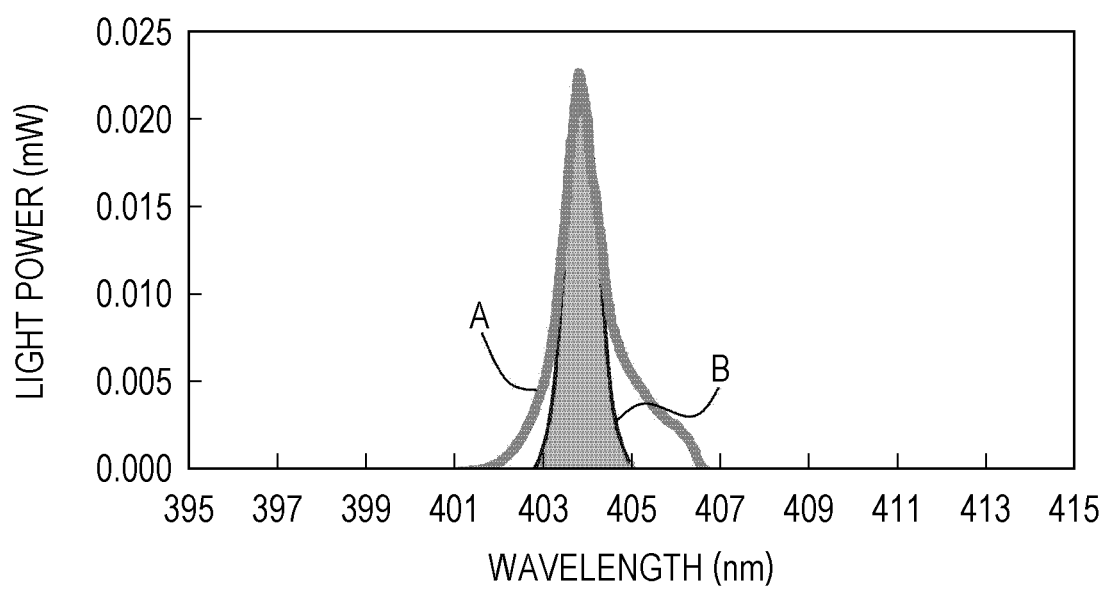
FIG. 13 is an illustration of an optical spectrum for explaining a shift of a lower optical spectrum component than a half maximum of an optical spectrum peak from a Gaussian function.

The optical spectrum shape obtained by optical spectrum shaping typically has a full width at half maximum of 1 nm or larger at a wavelength around 400 nm. A down-chirp is added by the dispersion compensation optical system 110. Also, a wavelength component separated from the optical spectrum peak is preferably decreased by a certain degree as long as a shift of the correlated waveform from an ideal pulse shape of a Gaussian function or a sech$^2$ function does not become large. For example, if the optical spectrum peak after optical spectrum shaping is approximated by the Gaussian function, as shown in FIG. 13, for an optical spectrum component lower than the half maximum of the optical spectrum peak (see "A" in FIG. 13), a shift from the Gaussian function is preferably 20% or less, or more preferably, 10% or less as compared with the area of the optical spectrum by the Gaussian function (see "B" in FIG. 13).

The mode-locked semiconductor laser element 10 in Embodiment 1 or any of Embodiment 2 to Embodiment 15 (described later) is, specifically, a semiconductor laser element having a ridge-stripe separate confinement hetero structure (SCH structure). More specifically, the mode-locked semiconductor laser element 10 is a GaN-based semiconductor laser element made of index-guide AlGaInN, and has a ridge-stripe structure. Then, the first compound semiconductor layer 30, the third compound semiconductor layer (active layer) 40, and the second compound semiconductor layer 50 are each made of an AlGaInN-based compound semiconductor, and more specifically, the layers each have a layer configuration shown in Table 3. Herein, in Table 3, a compound semiconductor layer located at the lower side is a layer close to the n-type GaN substrate 21. A compound semiconductor forming a quantum well layer in the third compound semiconductor layer 40 has a band gap of 3.06 eV. The mode-locked semiconductor laser element 10 in Embodiment 1 or any of Embodiment 2 to Embodiment 15 (described later) is provided on a (0001) surface of the n-type GaN substrate 21, and the third compound semiconductor layer 40 has a quantum well structure. The (0001) surface of the n-type GaN substrate 21 is also called "C surface" and is a crystal surface having a polarity.

TABLE 3

Second compound semiconductor layer 50
    p-type GaN contact layer (Mg doped) 54
    p-type GaN (Mg doped)/AlGaN superlattice cladding layer 53
    p-type AlGaN electronic barrier layer (Mg doped) 52
    Non-doped GaInN optical guide layer 51
Third compound semiconductor layer 40
    GaInN quantum well active layer
        (Quantum well layer: $Ga_{0.92}In_{0.08}N$/barrier layer: $Ga_{0.98}In_{0.02}N$)
First compound semiconductor layer 30
    n-type GaN cladding layer 32
    n-type AlGaN cladding layer 31
where
Quantum well layer (two layers), 8 nm, non-doped
Barrier layer (three layers), 14 nm, Si-doped Also, a portion of a p-type GaN contact layer 54 and a portion of the p-type GaN/AlGaN superlattice cladding layer 53 are removed by RIE, and hence the ridge-stripe structure 55 is formed. A layered insulating film 56 made of $SiO_2$/Si is formed on both sides of the ridge-stripe structure 55. The $SiO_2$ layer is a lower layer and the Si layer is an upper layer. Herein, the difference between the effective refractive index of the ridge-stripe structure 55 and the effective refractive index of the layered insulating film 56 is in a range from $5\times10^{-3}$ to $1\times10^{-2}$, or specifically, $7\times10^{-3}$. Also, the second electrode (p-side ohmic electrode) 62 is formed on the p-type GaN contact layer 54 corresponding to the top surface of the ridge-stripe structure 55. In contrast, the first electrode (n-side ohmic electrode) 61 made of Ti/Pt/Au is formed on the back surface of the n-type GaN substrate 21.

In the mode-locked semiconductor laser element 10 according to Embodiment 1 or any of Embodiment 2 to Embodiment 15 (described later), by arranging the p-type AlGaN electronic barrier layer 52, the p-type GaN/AlGaN superlattice cladding layer 53, and the p-type GaN contact layer 54, which are Mg-doped compound semiconductor layers, so as not to overlap the light density distribution generated from the third compound semiconductor layer 40 or around the third compound semiconductor layer 40, the internal loss can be restricted within a range that the internal quantum efficiency is not decreased. Accordingly, the threshold current density with which laser oscillation is started is decreased. Specifically, the distance d from the third compound semiconductor layer 40 to the p-type AlGaN electronic barrier layer 52 was 0.10 µm, the height of the ridge-stripe structure 55 was 0.30 µm, the thickness of the second compound semiconductor layer 50 located between the second electrode 62 and the third compound semiconductor layer 40 was 0.50 µm, and the thickness of a portion of the p-type GaN/AlGaN superlattice cladding layer 53 located below the second electrode 62 was 0.40 µm. Also, to reduce end-surface reflection, the ridge-stripe structure 55 is curved toward the second end surface. However, the shape of the ridge-stripe structure 55 is not limited to such a shape.

In the mode-locked semiconductor laser element 10 according to Embodiment 1 or any of Embodiment 2 to Embodiment 15 (described later), a non-reflection coat layer (AR) is formed on the light-emission end surface (second end surface) facing the collimating means 11. In contrast, a high-reflection coat layer (HR) is formed on an end surface (first end surface) opposite to the light-emission end surface (second end surface) of the mode-locked semiconductor laser element 10. The saturable absorption region 42 is provided at a side of the first end surface in the mode-locked semiconductor laser element 10. The non-reflection coat layer (low-reflection coat layer) may have, for example, a layered structure including at least two kinds of layers selected from a group including a titanium oxide layer, a tantalum oxide layer, a zirconium oxide layer, a silicon oxide layer, and an aluminum oxide layer.

The mode-locked semiconductor laser element 10 according to Embodiment 1 or any of Embodiment 2 to Embodiment 15 (described later) has a pulse repetition frequency of 1 GHz. A repetition frequency f of a pulse train of laser light is determined by an external-resonator length X' (the distance between the first end surface and the reflecting mirror 113), and is expressed by an equation as follows:

$$f = c/(2n \cdot X'),$$

where c is the light speed, and n is an effective refractive index of the resonator.

Meanwhile, to obtain an optical gain for laser oscillation, a high-density carrier has to be injected (excited) in the third compound semiconductor layer (active layer) 40, and an inverted distribution has to be formed. Herein, when a semiconductor laser element is made of a GaN-based compound semiconductor with large effective masses of electrons and positive holes, to obtain a positive optical gain value, the carrier density of the third compound semiconductor layer 40 has to exceed $10^{19}/cm^{-3}$ (for example, see K. Takahashi (supervisor), A. Yoshikawa (author and editor), and F. Hasegawa (author and editor), "Wide-gap Semiconductors, Light, Electronic Devices," Morikita Publishing Co., Ltd., pp 124-126). Regarding the inverted-distribution carrier density, the carrier density of injection for oscillation of a semiconductor laser element made of a GaN-based compound semiconductor may be one digit higher than, for example, that of a semiconductor laser element made of a GaAs-based compound semiconductor shown in T. Schlauch et al., Optics Express, Vol. 18, p 24136 (2010) (described above). For the mode-locked semiconductor laser element of Embodiment 1, the carrier density (inverted-distribution carrier density) is expected to be about $1.7 \times 10^{19}/cm^{-3}$.

The semiconductor optical amplifier 210 has a configuration and a structure substantially similar to those of the mode-locked semiconductor laser element 10 except that the second electrode is not divided and the ridge-stripe structure is not curved but the width of the ridge-stripe structure increases from the light-incidence end surface (first end surface) toward the light-emission end surface (second end surface). Specifically, the semiconductor optical amplifier 210 is a tapered semiconductor optical amplifier with a device length of 3.0 mm and a flare width of 15 μm. The semiconductor optical amplifier 210 has an optical confinement factor of 2.6% based on the specification of the semiconductor optical amplifier 210.

That is, the semiconductor optical amplifier 210 includes a layered structure body formed by successively stacking layers, the layers including a first compound semiconductor layer 30 made of a GaN-based compound semiconductor and having a first conductivity type, a third compound semiconductor layer (active layer) 40 made of a GaN-based compound semiconductor, and a second compound semiconductor layer 50 made of a GaN-based compound semiconductor and having a second conductivity type which is different from the first conductivity type, a second electrode 62 formed on the second compound semiconductor layer 50, and a first electrode 61 electrically connected with the first compound semiconductor layer 30.

The first compound semiconductor layer 30 is formed on a base member (specifically, substrate 21).

Figure 14A:
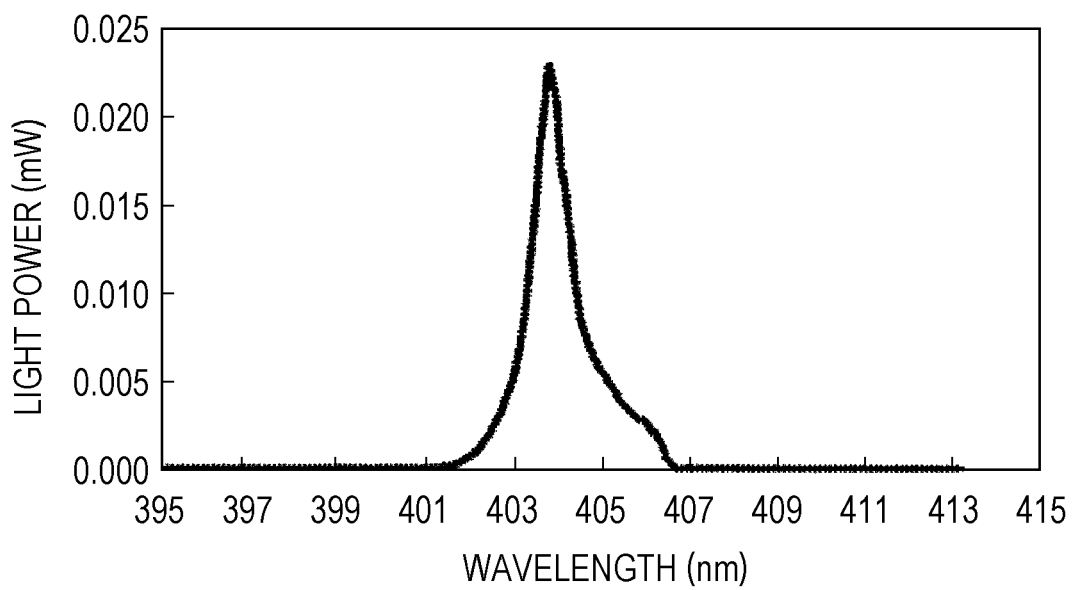
FIGS. 14A and 14B are an illustration showing an optical spectrum and an illustration showing a correlated waveform (time waveform) of laser light incident on the semiconductor optical amplifier included in the semiconductor-laser-device assembly of Embodiment 1.
Figure 14B:
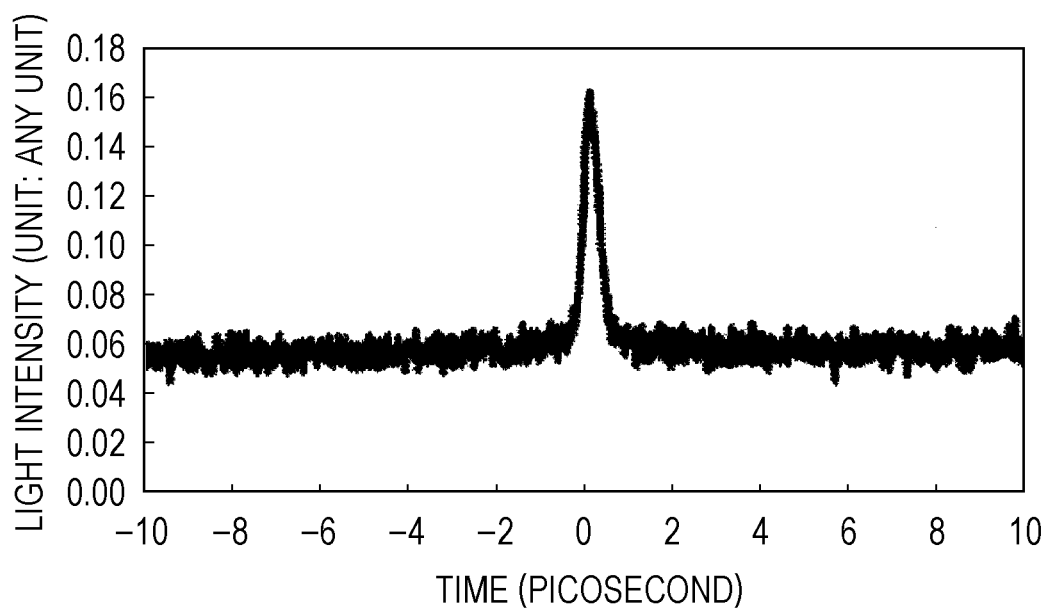

FIGS. 14A and 14B show an optical spectrum and a correlated waveform (time waveform) of laser light incident on the semiconductor optical amplifier 210. The optical spectrum width (full width at half maximum) is 1.01 nm, the pulse time width (=full width at half maximum of a correlated waveform×0.7) is 0.27 picoseconds, the pulse time width is expanded by about 1.6 times the theoretical limit value obtained by calculation, and hence the presence of a frequency chirp is indicated. Also, as the result of analysis, the frequency chirp at this time is down-chirp. This is determined by the sign of the group-velocity dispersion value in the dispersion compensation optical system 110. The driving conditions of the mode-locked semiconductor laser element 10 at this time are that gain current I=175 milliamperes flows to the first portion 62A of the second electrode, and the reverse bias voltage $V_{sa}$ that is applied to the second portion 62B of the second electrode is −7 volts. Laser light emitted from the mode-locked semiconductor-laser-element assembly and passing through the optical spectrum shaping means 114 has an average light power of 1.3 milliwatts.

Figure 15:
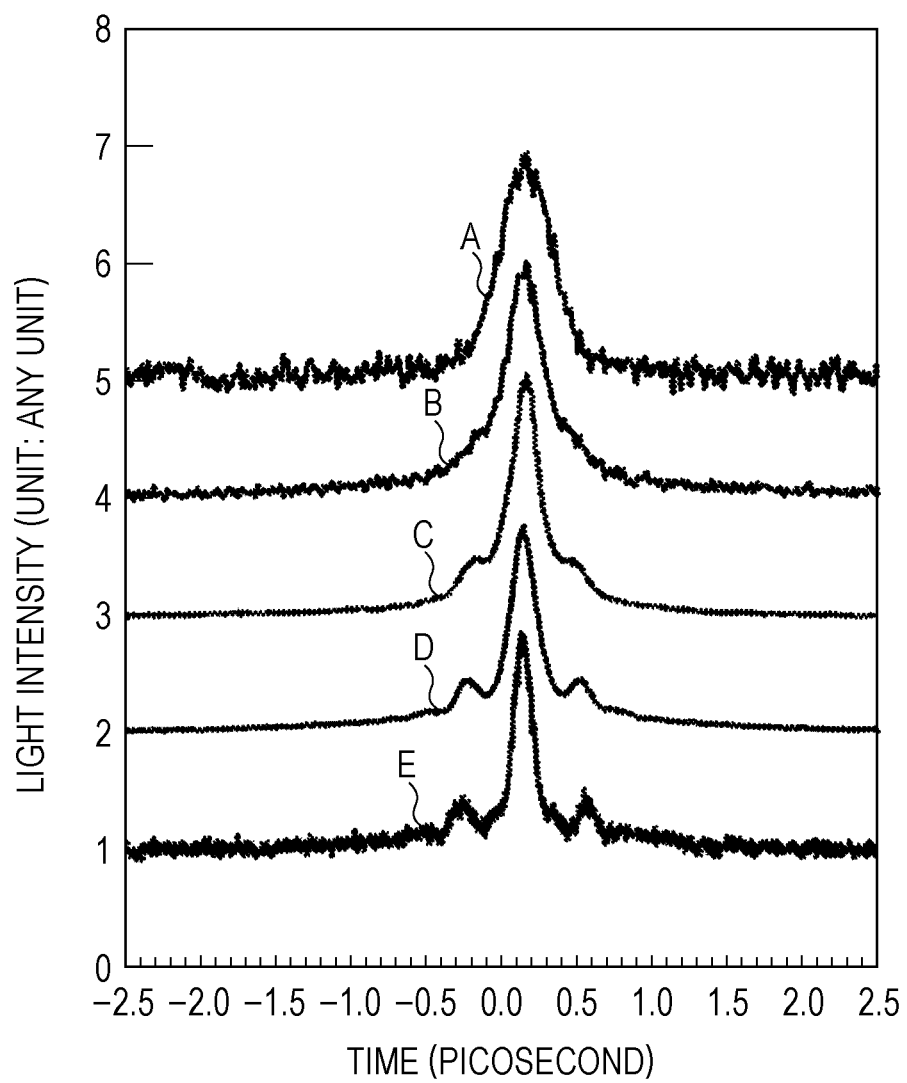
FIG. 15 is an illustration showing correlated waveforms (time waveforms) of output pulses from the semiconductor optical amplifier when laser light is incident on the semiconductor optical amplifier in the semiconductor-laser-device assembly of Embodiment 1.
Figure 16:
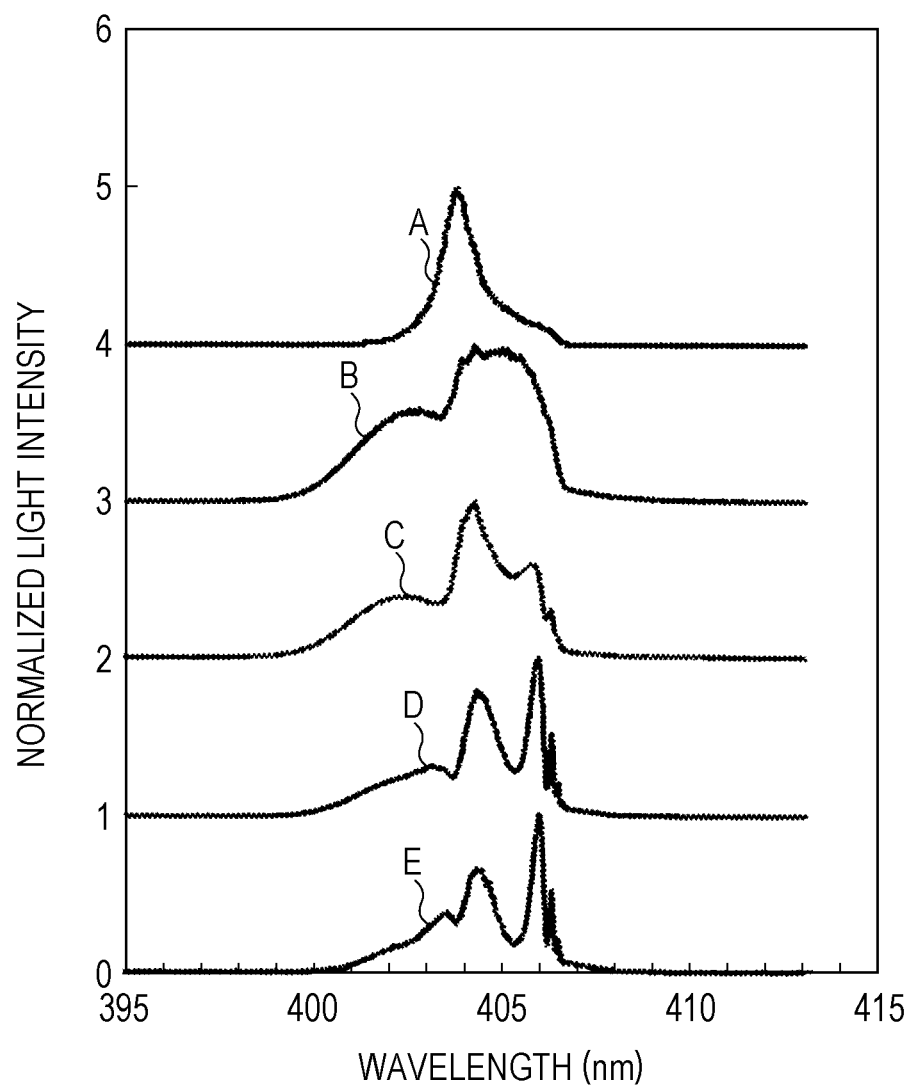
FIG. 16 is an illustration showing optical spectra of the output pulses from the semiconductor optical amplifier when laser light is incident on the semiconductor optical amplifier in the semiconductor-laser-device assembly of Embodiment 1.

FIGS. 15 and 16 show correlated waveforms (time waveforms) and optical spectra of output pulses from the semiconductor optical amplifier 210 when the laser light is incident. In FIGS. 15 and 16, "A" represents an optical spectrum and a correlated waveform of laser light incident on the semiconductor optical amplifier 210, and "B," "C," "D," and "E" are optical spectra and correlated waveforms of output pulses from the semiconductor optical amplifier 210 under driving conditions A, B, C, and D shown in Table 4 (described later).

Referring to FIGS. 15 and 16, it is found that the pulse time width of laser light output from the semiconductor optical amplifier 210 is smaller than the pulse time width of incident laser light, and, as the current density for driving the semiconductor optical amplifier 210 increases, the pulse time width of the laser light is narrowed. Also, for the output of the semiconductor optical amplifier 210, as the driving current density increases, it is recognized that the optical spectrum is markedly deformed.

That is, in the semiconductor-laser-device assembly of Embodiment 1, $\tau_1 > \tau_2$ may be established where $\tau_1$ is a pulse time width of the laser light incident on the semiconductor optical amplifier 210 and $\tau_2$ is a pulse time width of the laser light output from the semiconductor optical amplifier 210, and a value of $\tau_2$ may decrease as a driving current value of the semiconductor optical amplifier 210 increases. In the semiconductor optical amplifier 210, an intraband relaxation time of a carrier is preferably 25 femtoseconds or less. Also, the optical spectrum width of the laser light output from the semiconductor optical amplifier 210 is 4.5 THz or larger (that is, the optical spectrum width is 2.5 nm or larger, the pulse time width is 100 femtoseconds or smaller). Further, the optical spectrum width of the laser light output from the semiconductor optical amplifier 210 is increased by 2.5 THz or larger (that is, the optical spectrum width being 1 nm or larger) as compared with the optical spectrum width of the laser light incident on the semiconductor optical amplifier 210.

Table 4 shows the characteristics of amplified laser light output from the semiconductor optical amplifier 210 when laser light with a pulse time width of 270 femtoseconds is incident. In Table 4, "ASE" is a spectrum of amplified spontaneous emission (ASE), that is, a value of light power obtained when the semiconductor optical amplifier is operated while laser light is not incident, and "SOA output" is a value of light power of laser light output from the semiconductor optical amplifier when laser light is incident. Also, "pulse component" is a value obtained by an expression as follows:

{(area of light power of laser light output from semiconductor optical amplifier)−(area of light power in ASE spectrum)}/(area of light power of laser light output from semiconductor optical amplifier).

"Pulse energy" is a value obtained by an expression as follows:

(light power of laser light output from semiconductor optical amplifier)×(pulse component)/(pulse repetition frequency of mode-locked semiconductor laser element).

Further, "pulse time width" is a value obtained by an expression as follows:

(full width at half maximum of correlated waveform)×0.7.

"Peak power" is a value obtained by an expression as follows:

(value of pulse energy)/(value of pulse time width).

Figure 17:
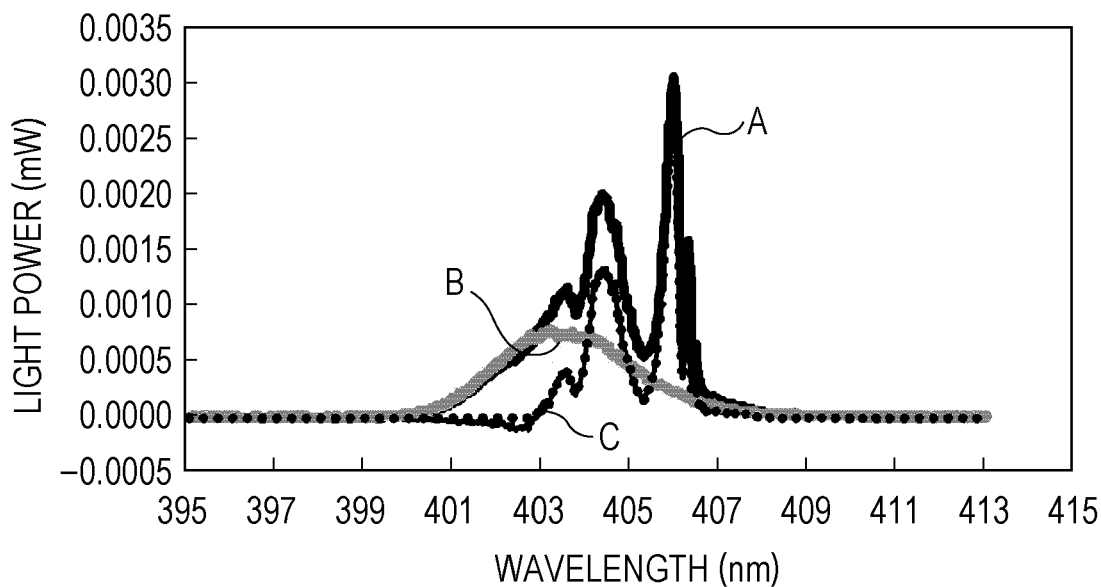
FIG. 17 is an illustration showing optical spectra for comparison between a spectrum of amplified spontaneous emission (ASE) and an optical spectrum after amplification.

When the driving current density in the semiconductor optical amplifier 210 is $11 \times 10^3$ amperes/cm$^2$ (driving current: 1.8 amperes), a semiconductor-optical-amplifier output of 240 milliwatts is obtained, and a pulse energy of 205 picojoules at maximum is obtained. This value is obtained by dividing an average output of 240 milliwatts by the repetition frequency of 1.17 GHz. It is assumed that the entire power of laser light output from the semiconductor optical amplifier becomes a light pulse. The pulse time width at this time is evaluated as 98 femtoseconds. It is found that this pulse time width is compressed to about 1/2.7 with respect to the pulse time width (0.27 picoseconds) of the laser light incident on the semiconductor optical amplifier 210. That is, the driving current density of the semiconductor optical amplifier 210 is preferably $5 \times 10^3$ amperes/cm$^2$ or higher. As shown in FIG. 17, when the ASE (amplified spontaneous emission) spectrum is compared with the optical spectrum of amplified laser light, an energy component that contributes to laser light is obtained as about 100 picojoules. The pulse repetition frequency of the mode-locked semiconductor laser element 10 at this time is 1.17 GHz. Accordingly, the peak power of the laser light can be obtained by dividing the pulse energy by the pulse time width of the laser light, as about 1 kilowatt. Also, based on the ratio of a side peak to a main peak, an effective peak power is evaluated as about 800 watts. In this way, in Embodiment 1, when the laser light with the time width of several hundreds of femtoseconds with down-chirp is incident on the semiconductor optical amplifier having the layered structure body including the group III-V nitride-based semiconductor layer, the energy of the laser light output from the semiconductor optical amplifier is amplified, the pulse time width of the laser light is compressed, and the peak power of the amplified laser light is increased.

TABLE 4

| Driving condition | Driving current mA | Driving current density kA/cm$^2$ | ASE mW | SOA light output mW | Pulse component | Pulse energy pJ | Pulse width ps | Peak power W |
|---|---|---|---|---|---|---|---|---|
| A | 820 | 5.000 | 10.5 | 14.2 | 0.550 | 6.6752 | 0.21 | 32 |
| B | 1150 | 7.012 | 46.9 | 73.6 | 0.453 | 28.4964 | 0.15 | 190 |
| C | 1480 | 9.024 | 117.0 | 180.0 | 0.478 | 73.5385 | 0.14 | 525 |
| D | 1800 | 10.970 | 141.0 | 240.0 | 0.497 | 101.9487 | 0.098 | 1040 |

In a general semiconductor optical amplifier of, for example, GaAs, the energy of laser light incident on the semiconductor optical amplifier is amplified, but the pulse time width of the laser light is not compressed by the semiconductor optical amplifier. As described above, a pulse compressor using a dispersion optical element is used after amplification by the semiconductor optical amplifier.

In contrast, in Embodiment 1, in a wide-gap semiconductor represented by a GaN-based compound semiconductor, amplification of ultrashort laser light and pulse compression can be simultaneously executed. This is because since the wide-gap semiconductor represented by the GaN-based compound semiconductor has a large exciton bound energy and a large effective mass, the carrier intraband relaxation time is shorter than that of other group III-V compound such as GaAs.

That is, in an amplification process of laser light by the semiconductor optical amplifier 210 of Embodiment 1, the contribution to energy amplification by the semiconductor optical amplifier 210 is about 90 times and the effect of pulse compression by the semiconductor optical amplifier 210 is about 2.7 times. The contribution to energy amplification by the semiconductor optical amplifier 210 being about 90 times is calculated as follows. That is, the value is obtained by dividing a pulse energy of 102 pJ in the driving condition "D" in Table 4, by a value 1.1 pJ (light power of laser light incident on the semiconductor optical amplifier 210), which is obtained by dividing an average light power of 1.3 milliwatts of laser light emitted from the mode-locked semiconductor-laser-element assembly and passing through the optical spectrum shaping means 114, by a pulse repetition frequency of 1.17 GHz of the mode-locked semiconductor laser element 10. As described above, in Embodiment 1, the pulse compression effect is simultaneously generated in addition to the increase in energy of laser light by the semiconductor optical amplifier 210. That is, since the semiconductor-laser-device assembly of Embodiment 1 includes the dispersion compensation optical system 110, the chirp state of laser light emitted from the mode-locked semiconductor-laser-element assembly, and the expansion state of the pulse can be optimized. Also, as the result of that the laser light with the chirp state and the expansion state of the pulse being optimized is incident on the semiconductor optical amplifier having the layered structure body including the group III-V nitride-based semiconductor layer, the laser light output from the semiconductor optical amplifier can be amplified and also compressed. The peak power can be markedly effectively increased. Hence, since the pulse compressor is no longer arranged downstream of the semiconductor optical amplifier, the semiconductor-laser-device assembly can be increased in efficiency and decreased in size.

Regarding the laser light that is output from the semiconductor optical amplifier, the envelop of intensity is changed with time, and the refractive index in the third compound semiconductor layer (active layer) is actively changed by self-phase modulation. The change in refractive index with time becomes a factor of expanding the optical spectrum width of the laser light output from the semiconductor optical amplifier. If the laser light amplified by the semiconductor optical amplifier has a pulse time width in the picosecond order, in related art, it is considered that saturation of a gain of the semiconductor optical amplifier is dominant in the self-phase modulation effect. In this case, the expansion of the optical spectrum found in output laser light of the semiconductor optical amplifier is observed mainly at the long-wavelength side.

Figure 18:
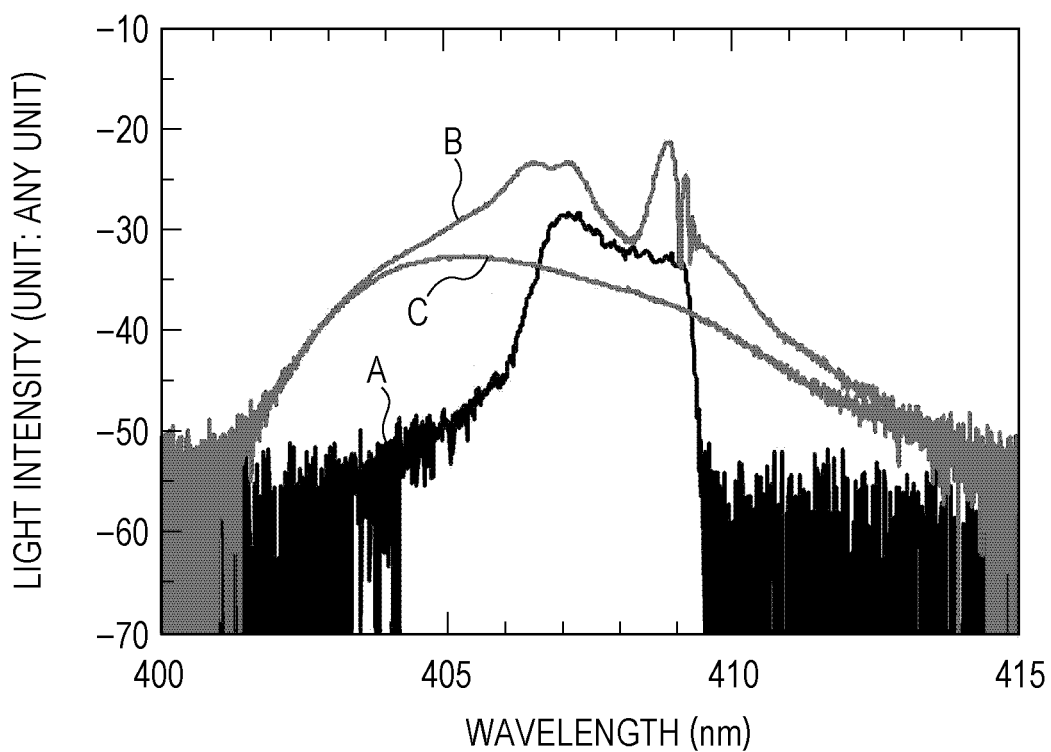
FIG. 18 is an illustration showing optical spectrum components of laser light output from the semiconductor optical amplifier included in the semiconductor-laser-device assembly of Embodiment 1.
Figure 19A:
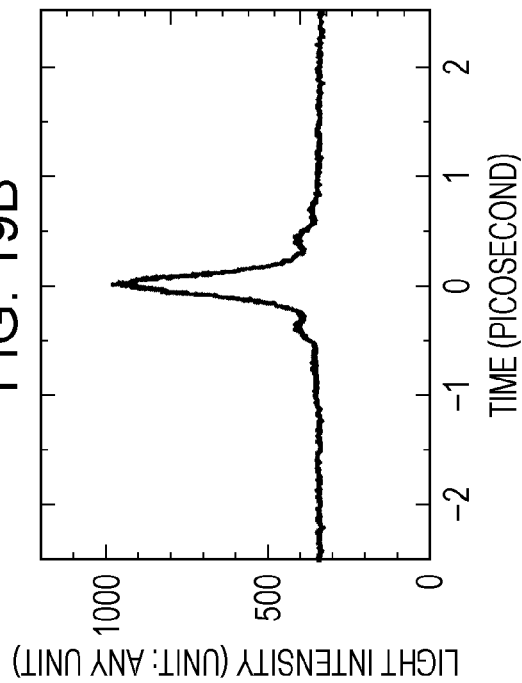
FIGS. 19A to 19D are illustrations each showing the dependence on a driving current density of pulsed laser light output from a semiconductor optical amplifier included in a semiconductor-laser-device assembly of Embodiment 2.
Figure 19B:
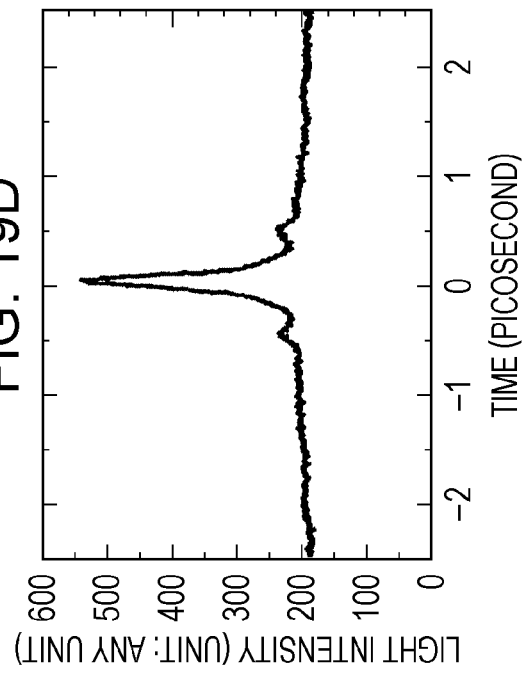
Figure 19C:
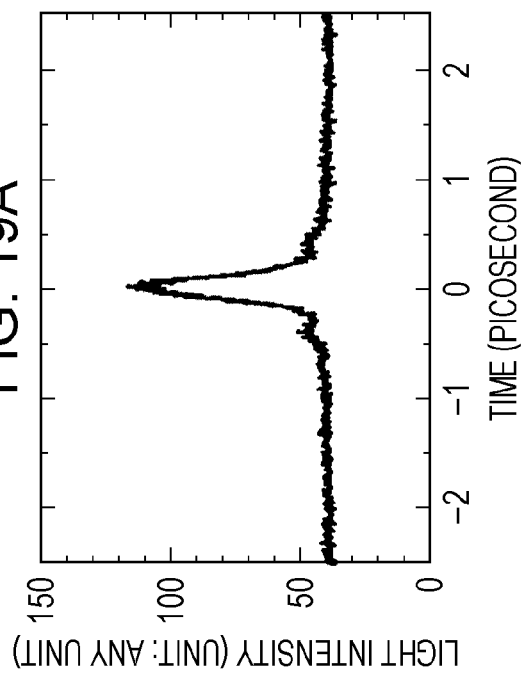
Figure 19D:
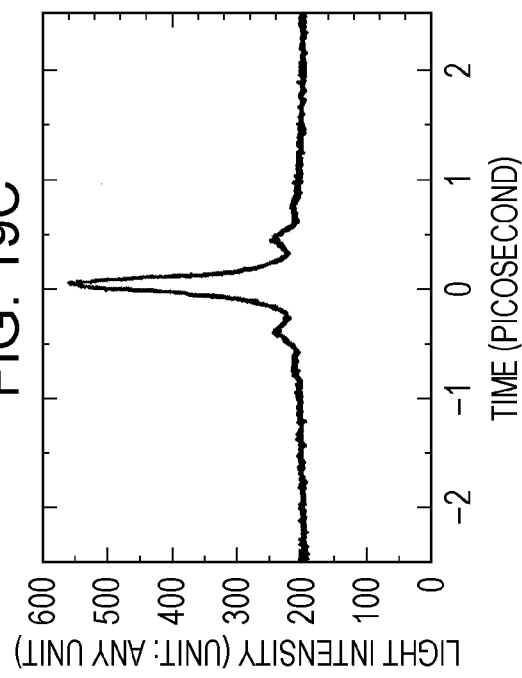

In Embodiment 1, the optical spectrum component of the output laser light of the semiconductor optical amplifier is expanded at also the short-wavelength side in addition to the long-wavelength side with respect to the optical spectrum of the incident laser light as shown in FIG. 18. In FIG. 18, "A" represents an optical spectrum component of the laser light incident on the semiconductor optical amplifier, "B" represents an optical spectrum component of the output laser light of the semiconductor optical amplifier, and "C" represents an ASE (amplified spontaneous emission) spectrum. The driving current value of the driving current flowing to the second electrode of the semiconductor optical amplifier is 2.2 amperes. Expansion of the optical spectrum by self-phase modulation depends on not only a change in refractive index by gain saturation of the semiconductor optical amplifier, but also nonlinear refractive-index time response of the semiconductor optical amplifier with respect to the incident laser light. That is, the situation in which the expansion of the optical spectrum is observed at the short-wavelength side suggests that the nonlinear refractive-index time response of the semiconductor optical amplifier having the layered structure body including the group III-V nitride-based semiconductor layer is sufficiently fast with respect to the pulse time width of the laser light incident on the semiconductor optical amplifier. Referring to S. Hughes and T. Kobayashi, Semiconductor Science and Technology, vol. 12, p 733 (1997), the intraband relaxation time of GaN for the carrier density around the threshold that causes laser oscillation is evaluated as 15 femtoseconds, and is reported as being short as compared with GaAs. Such a high-speed relaxation time may generate an anti-Stokes component by self-phase modulation without gain saturation, and the anti-Stokes component may contribute to the observed optical spectrum component at the short-wavelength side. This is considered as the reason of that the pulse amplification and compression by the semiconductor optical amplifier simultaneously occur as the characteristic effects of the semiconductor optical amplifier having the layered structure body including the group III-V nitride-based semiconductor layer.

Meanwhile, as described above, the second electrode 62 having a separation resistance value of $1 \times 10^2 \Omega$ or higher is preferably formed on the second compound semiconductor layer 50. In case of the GaN-based semiconductor laser element, unlike a GaAs-based semiconductor laser element of related art, mobility in the compound semiconductor having the p-type conductivity time is small. Hence, by separating the second electrode 62 formed thereon by the separation groove 62C without an increase in resistance of the second compound semiconductor layer 50 having the p-type conductivity type by ion injection etc., the electrical resistance value between the first portion 62A and the second portion 62B of the second electrode 62 can be 10 times or larger the electrical resistance value between the second electrode 62 and the first electrode 61, or the electrical resistance value between the first portion 62A and the second portion 62B of the second electrode 62 can be $1 \times 10^2 \Omega$ or larger.

Herein, the characteristics desired for the second electrode 62 are as follows.

(1) The second electrode 62 has a function as an etching mask when the second compound semiconductor layer 50 is etched.

(2) The second electrode 62 is available for wet etching without deterioration in optical and electrical characteristics of the second compound semiconductor layer 50.

(3) The second electrode 62 has a contact specific resistance value of $10^{-2} \, \Omega \cdot cm^2$ or lower when being formed on the second compound semiconductor layer 50.

(4) In case of the layered structure, a material forming a lower metal layer has a large work function, a low contact specific resistance value with respect to the second compound semiconductor layer 50, and is available for wet etching.

(5) In case of the layered structure, a material forming an upper metal layer is resistant against etching when the ridge-stripe structure is formed (for example, $Cl_2$ gas used by reactive ion etching (RIE)), and is available for wet etching.

In Embodiment 1 or any of Embodiment 2 to Embodiment 15 (described later), the second electrode 62 is formed of a Pd monolayer with a thickness of 0.1 μm.

The p-type GaN/AlGaN superlattice cladding layer 53 having the superlattice structure, in which the p-type GaN layers and the p-type AlGaN layers are alternately stacked, has a thickness of 0.7 μm or smaller, or specifically, 0.4 μm. The p-type GaN layer forming the superlattice structure has a thickness of 2.5 nm. The p-type AlGaN layer forming the superlattice structure has a thickness of 2.5 nm. The total number of layers of the p-type GaN layers and the p-type AlGaN layers is 160 layers. Also, the distance from the third compound semiconductor layer 40 to the second electrode 62 is 1 μm or smaller, or specifically, 0.5 μm. Further, Mg is doped in the p-type AlGaN electronic barrier layer 52, the p-type GaN/AlGaN superlattice cladding layer 53, and the p-type GaN contact layer 54 forming the second compound semiconductor layer 50, by $1 \times 10^{19}$ cm$^{-3}$ or more (specifically, $2 \times 10^{19}$ cm$^{-3}$). The absorption coefficient of the second compound semiconductor layer 50 for the light with the wavelength of 405 nm is at least 50 cm$^{-1}$, or specifically, 65 cm$^{-1}$. Also, while the second compound semiconductor layer 50 includes the non-doped GaInN optical guide layer 51 and the p-type compound semiconductor layer arranged from the third-compound-semiconductor-layer side, the distance (d) from the third compound semiconductor layer 40 to the p-type compound semiconductor layer (specifically, the p-type AlGaN electronic barrier layer 52) is $1.2\times10^{-7}$ m or smaller, or specifically, 100 nm.

Hereinafter, a manufacturing method of the mode-locked semiconductor laser element according to Embodiment 1 etc. is described with reference to FIGS. 43A, 43B, 44A, 44B, and 45. FIGS. 43A, 43B, 44A, and 44B are schematic partial cross-sectional views when the substrate etc. is cut along the YZ plane. FIG. 45 is a schematic partial end view when the substrate etc. is cut along the XZ plane.

[Step-100]

Figure 43A:
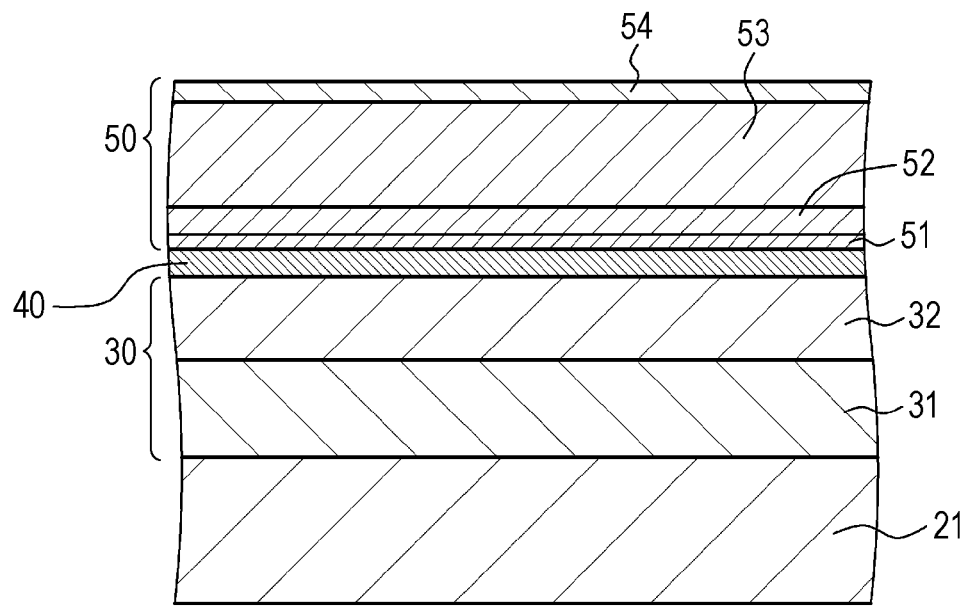
FIGS. 43A and 43B are schematic partial cross-sectional views of a substrate etc. for explaining a manufacturing method of the mode-locked semiconductor laser element of Embodiment 1.
Figure 43B:
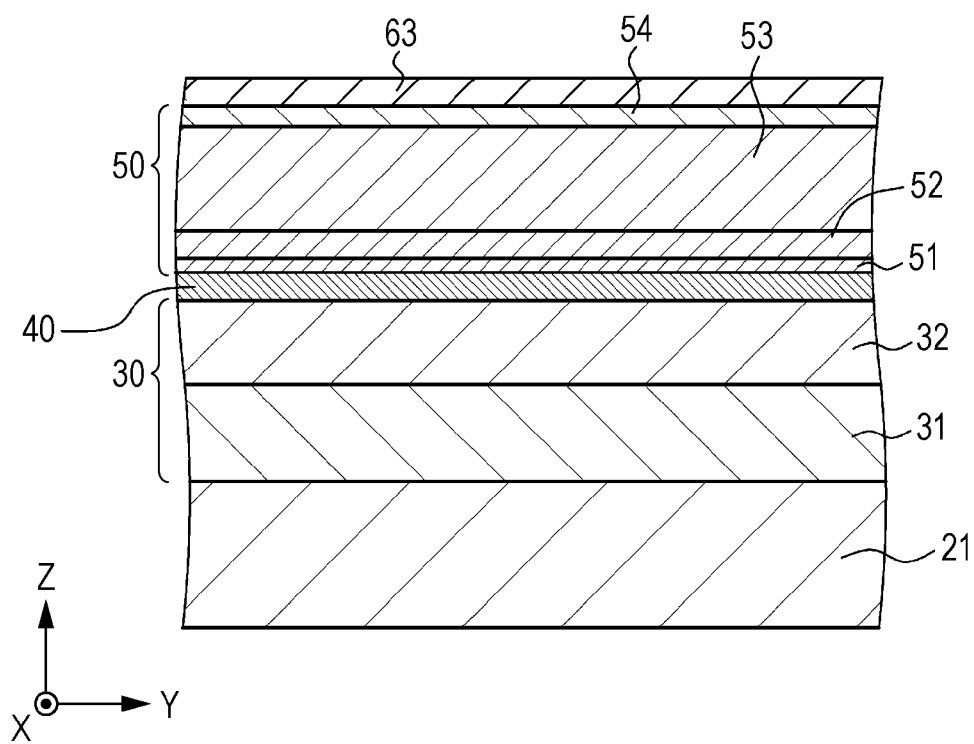
Figure 44A:
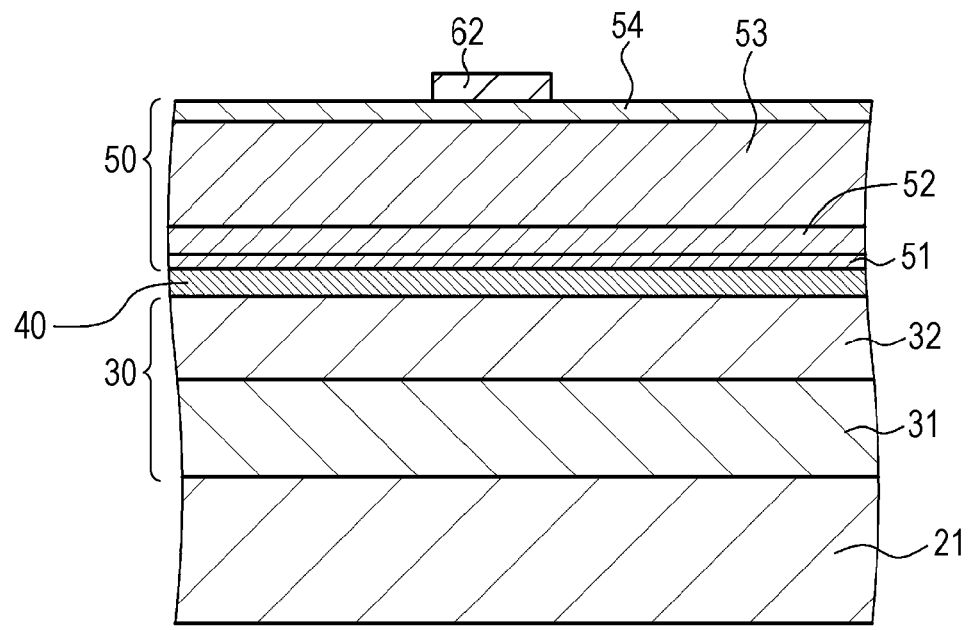
FIGS. 44A and 44B are schematic partial cross-sectional views of the substrate etc. for explaining the manufacturing method of the mode-locked semiconductor laser element of Embodiment 1 continued from FIG. 43B.
Figure 44B:
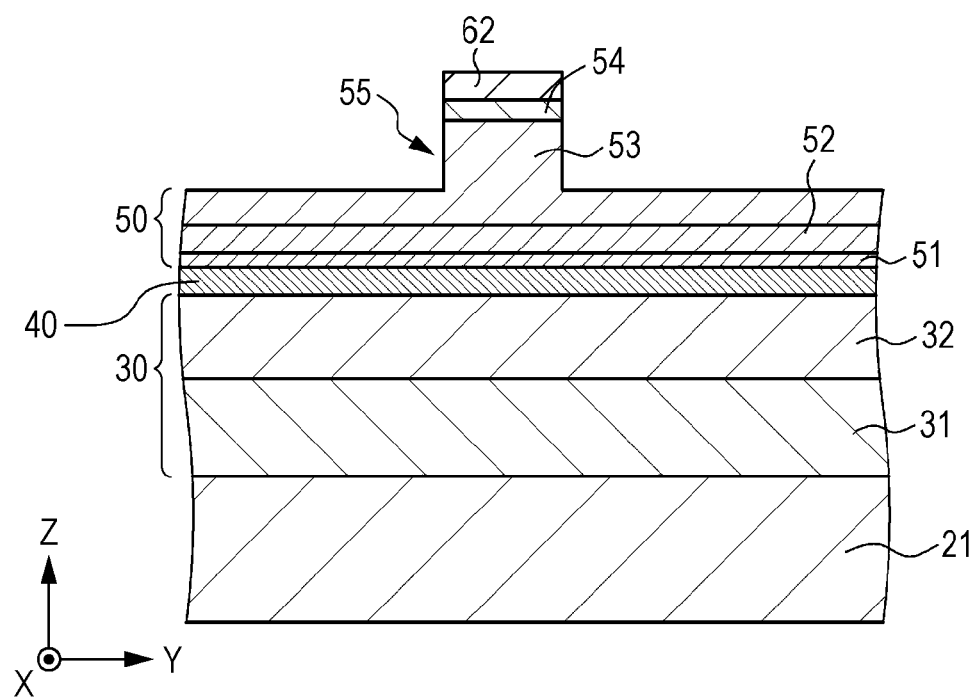

The layered structure body, in which the first compound semiconductor layer 30 having the first conductivity type (the n-type conductivity type) and made of the GaN-based compound semiconductor, the third compound semiconductor layer (active layer) 40 made of the GaN-based compound semiconductor and forming the emitting region (gain region) 41 and the saturable absorption region 42, and the second compound semiconductor layer 50 having the second conductivity type (specifically, the p-type conductivity type) different from the first conductivity type and made of the GaN-based compound semiconductor are successively stacked, is formed on the base member, or specifically, on the (0001) surface of the n-type GaN substrate 21 by existing MOCVD (see FIG. 43A).

[Step-110]

Then, the strip-shaped second electrode 62 is formed on the second compound semiconductor layer 50. Specifically, a Pd layer 63 is formed on the entire surface by vacuum deposition (see FIG. 43B), and then a strip-shaped etching resist layer is formed on the Pd layer 63 by photolithography. Then, by using aqua regia, the Pd layer 63 not covered with the etching resist layer is removed, and then the etching resist layer is removed. Hence, a structure shown in FIG. 44A can be obtained. Alternatively, the strip-shaped second electrode 62 may be formed on the second compound semiconductor layer 50 by lift-off.

[Step-120]

Then, at least a portion of the second compound semiconductor layer 50 is etched while the second electrode 62 is used as an etching mask (specifically, a portion of the second compound semiconductor layer 50 is etched), and hence the ridge-stripe structure is formed. Specifically, a portion of the second compound semiconductor layer 50 is etched while the second electrode 62 is used as an etching mask by RIE using $Cl_2$ gas. Hence, a structure shown in FIG. 44B can be obtained. In this way, since the ridge-stripe structure is formed by self alignment while the second electrode 62 patterned in the strip shape is used as the etching mask, an alignment shift is not generated between the second electrode 62 and the ridge-stripe structure.

[Step-130]

Then, a resist layer 64 for forming the separation groove in the second electrode 62 is formed (see FIG. 45). Reference sign 65 denotes an opening provided in the resist layer 64 for forming the separation groove. Then, the separation groove 62C is formed in the second electrode 62 by wet etching while the resist layer 64 is used as a wet etching mask. Thus, the second electrode 62 is separated into the first portion 62A and the second portion 62B by the separation groove 62C. Specifically, aqua regia is used as an etching solution, and the entire structure is dipped in the aqua regia for about 10 seconds. Accordingly, the separation groove 62C is formed in the second electrode 62. Then, the resist layer 64 is removed. Hence, the structure shown in FIGS. 2 and 3 can be obtained. In this way, since wet etching is employed, unlike dry etching, the second compound semiconductor layer 50 can be prevented from being deteriorated in terms of optical and electrical characteristics. Therefore, the light-emission characteristic of the mode-locked semiconductor laser element is not deteriorated. If dry etching is employed, the internal loss $\alpha_c$ of the second compound semiconductor layer 50 may be increased, the threshold voltage may be increased, and the optical output may be decreased. Herein, an expression is established as follows:

$ER_0/ER_1 \approx 1\times10^2$, where $ER_0$ is an etching rate of the second electrode 62 and $ER_1$ is an etching rate of the layered structure body.

In this way, since there is a high etching selectivity between the second electrode 62 and the second compound semiconductor layer 50, the second electrode 62 can be reliably etched without etching the layered structure body (or even if the layered structure body is etched, the amount is very small). Preferably $ER_0/ER_1 \geq 1\times10$, or more preferably, $ER_0/ER_1 \geq 1\times10^2$ is satisfied.

The second electrode may have a layered structure including a lower metal layer made of palladium (Pd) with a thickness of 20 nm, and an upper metal layer made of nickel (Ni) with a thickness of 200 nm. Herein, in case of wet etching with aqua regia, the etching rate of nickel is about 1.25 times the etching rate of palladium.

[Step-140]

Then, the n-side electrode is formed, the substrate is cleaved, and further, packaging is performed. Thus, the mode-locked semiconductor laser element 10 can be manufactured.

The electrical resistance value between the first portion 62A and the second portion 62B of the mode-locked semiconductor laser element 10 was measured by four probe method. As the result, when the width of the separation groove 62C is 20 μm, the electrical resistance value between the first portion 62A and the second portion 62B of the second electrode 62 was 15 M. Also, in the manufactured mode-locked semiconductor laser element 10, by causing a direct current to flow from the first portion 62A of the second electrode 62 through the emitting region 41 to the first electrode 61 to provide the forward bias state, and by applying the electric field to the saturable absorption region 42 by applying the reverse bias voltage $V_{sa}$ between the first electrode 61 and the second portion 62B of the second electrode 62, self pulsation operation could be provided. That is, the electrical resistance value between the first portion 62A and the second portion 62B of the second electrode 62 is 10 times or larger the electrical resistance value between the second electrode 62 and the first electrode 61, or alternatively, $1\times10^2 \Omega$ or higher. Hence, the flow of leaked current from the first portion 62A to the second portion 62B of the second electrode 62 could be reliably restricted. As the result, the emitting region 41 could be in the forward bias state, and the saturable absorption region 42 could be reliably in the reverse bias state. Single-mode self pulsation operation could be reliably generated.

Embodiment 2

Embodiment 2 is a modification of Embodiment 1. For pulse amplification of laser light by the semiconductor optical amplifier, saturation energy of a gain is desirable to be large to obtain large energy. Owing to this, it is effective to decrease the optical confinement factor corresponding to the ratio of the volume of the active layer to the volume occupied by a light mode in an optical waveguide. In Embodiment 2, the optical confinement factor of the semiconductor optical amplifier is decreased. In particular, in Embodiment 2, the semiconductor optical amplifier is specifically a semiconductor optical amplifier using a slab-coupled optical waveguide amplifier (SCOWA) structure. While the optical confinement factor in Embodiment 1 is 2.6%, the optical confinement factor is 0.8% in Embodiment 2.

In the semiconductor optical amplifier with the SCOWA structure, a rod-shaped optical waveguide is coupled to a slab-shaped (plate-shaped) two-dimensional optical waveguide, and light is weakly confined in a coupling portion of the slab and the rod. Since the third compound semiconductor layer (active layer) is provided in the rod-shaped optical waveguide, the volume occupied by the active layer to the mode field of laser light can be decreased, and hence the semiconductor optical amplifier having a low optical confinement factor can be provided. The detailed configuration and structure of the semiconductor optical amplifier with the SCOWA structure are described later in detail in Embodiment 11.

The amplification characteristic when laser light is amplified by the semiconductor optical amplifier of Embodiment 2 with SCOWA is described below. The laser light emitted from the mode-locked semiconductor-laser-element assembly like Embodiment 1 is incident on the semiconductor optical amplifier of Embodiment 2. The dispersion compensation amount in the dispersion compensation optical system 110 is negative. The gain current I, which flows to the second electrode of the mode-locked semiconductor laser element 10, was 100 milliamperes and the reverse bias voltage $V_{sa}$ was −11 volts. A band pass filter with transmission band $\Delta\lambda=1.3$ nm was used as the optical spectrum shaping means and hence an optical spectrum was shaped. Consequently, laser light with a pulse time width of 380 femtoseconds and an average power of 0.82 milliwatts could be obtained. Also, the pulse repetition frequency generated from this mode-locked semiconductor laser element was 413 MHz. This value is a fundamental frequency that is determined in accordance with the length of the external resonator. In the semiconductor optical amplifier of Embodiment 2 having the low optical confinement factor, since the ASE spectrum is decreased, the recovery time of the carrier is increased. Hence, it is advantageous that the time interval of incident pulses is the nanosecond order or higher, to obtain a large pulse energy.

Figure 20A:
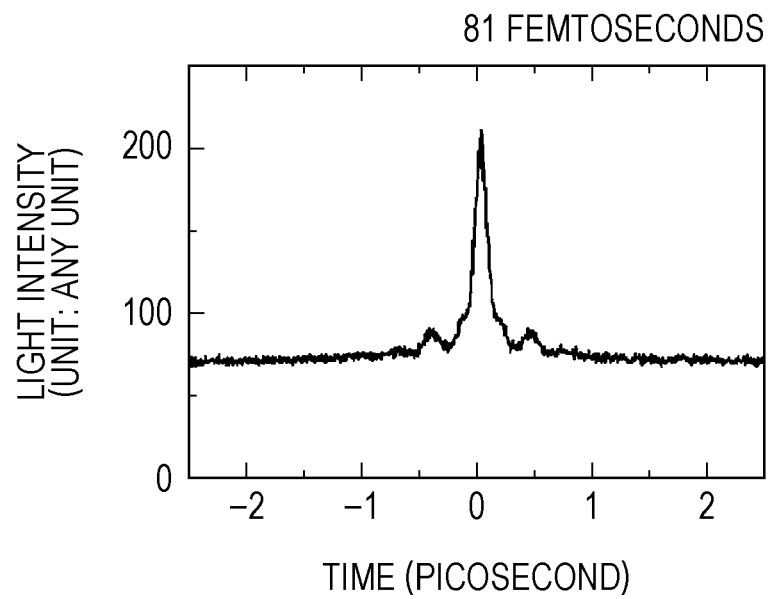
FIGS. 20A and 20B are illustrations showing a correlated waveform (time waveform) and an optical spectrum of laser light output from the semiconductor optical amplifier included in the semiconductor-laser-device assembly of Embodiment 2.
Figure 20B:
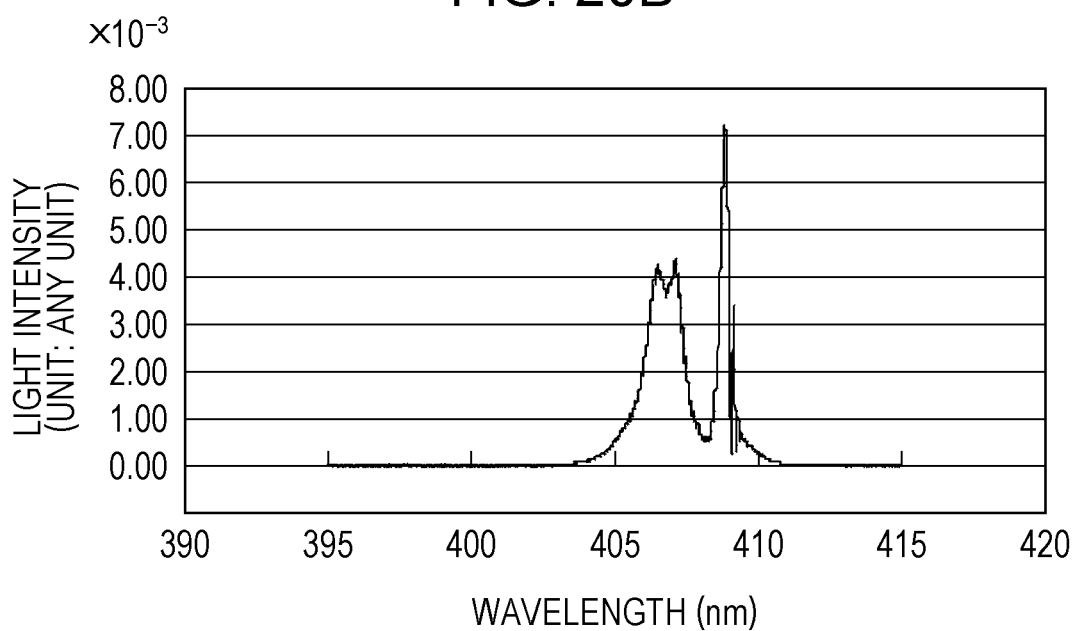
Figure 21A:
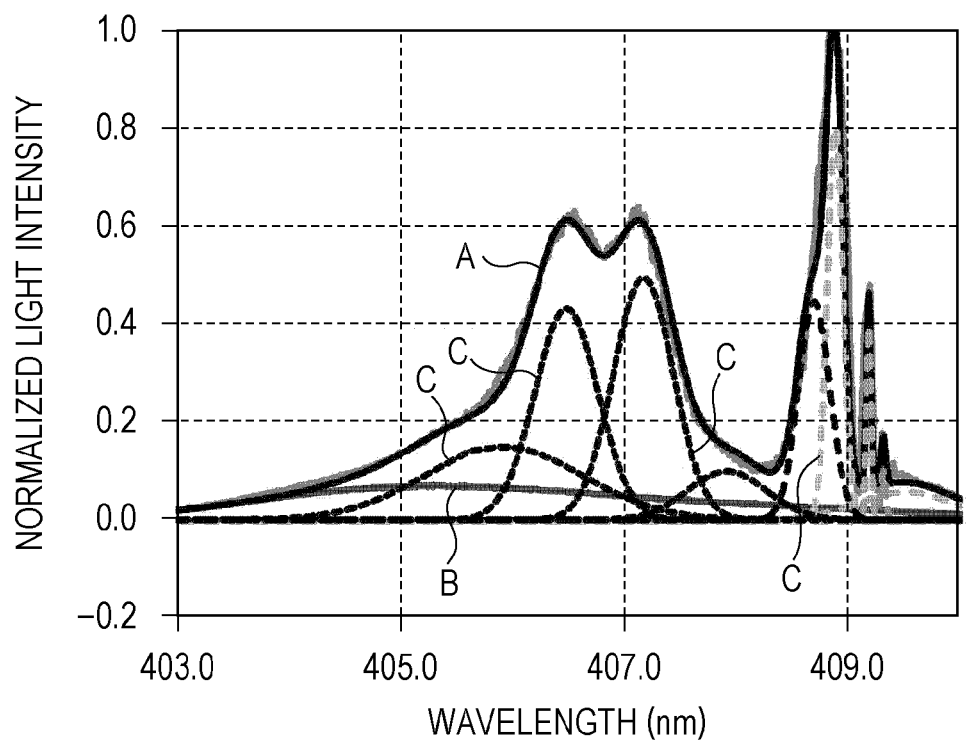
FIGS. 21A and 21B are an illustration showing an optical spectrum analysis result of laser light output from the semiconductor optical amplifier included in the semiconductor-laser-device assembly of Embodiment 2, and an illustration showing comparison between a correlated waveform (time waveform) and a pulse theoretical shape by a Gaussian function.
Figure 21B:
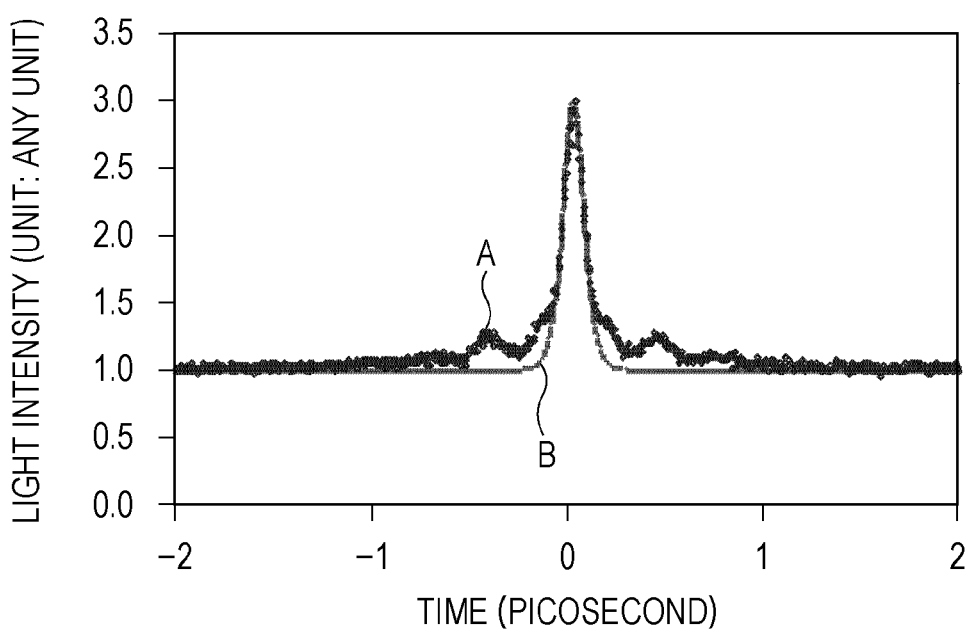

Then, amplified laser light output obtained when the pulsed laser light is incident on the semiconductor optical amplifier of Embodiment 2 is described. FIGS. 19A to 19D show dependencies of pulsed laser light output from the semiconductor optical amplifier of Embodiment 2 on driving current densities. Data in FIGS. 19A to 19D are data under driving conditions A, B, C, and D in Table 5 (described later). Table 5 shows various data (driving current (unit: ampere)) obtained under these driving conditions, pulse time widths (unit: femtosecond) of laser light output from the semiconductor optical amplifier, and characteristics of pulsed laser light after amplification output form the semiconductor optical amplifier depending on the respective driving current densities. In Table 5, first-row data to fourth-row data are data at a temperature of 15° C., and fifth-row data is data at a temperature of 20° C. In any case, it was observed that the pulse time width of the laser light output from the semiconductor optical amplifier was smaller than the pulse time width of the incident laser light. Also, the pulse time width decreased as the driving current density increased. In particular, when the driving current value was 2.2 amperes, if the driving temperature of the semiconductor optical amplifier was 20° C., the pulse energy increased because the ASE spectrum was lowered, and the peak power became maximum because the pulse time width became narrow. FIG. 20A shows a correlated waveform (time waveform), and FIG. 20B shows an optical spectrum at this time. The pulse time width is 81 femtoseconds, the pulse energy is 162 picojoules, and the peak power corresponds to 1.5 kilowatts. To calculate the pulse energy, optical spectrum analysis shown in FIG. 21A was executed, the output of the semiconductor optical amplifier was separated into an ASE spectrum and a pulse component, and a component that contributes to generation of a light pulse was identified. The value was 80%. In FIG. 21A, "A" represents the output laser light intensity of the semiconductor optical amplifier, "B" represents the ASE spectrum, and a plurality of "Cs" represent optical spectra when the output laser light intensity of the semiconductor optical amplifier was dissolved. Also, in the correlated waveform, small side-pulses are observed with the center large peak. As shown in FIG. 21B, based on comparison between the correlated waveform (time waveform) indicated by "A" and the pulse theoretical shape by a Gaussian function, the pulse energy can be estimated as about 75% of the output laser light intensity of the semiconductor optical amplifier. When the energy assigned to the side-pulses is obtained in this way, the final peak power of 1.5 kilowatts can be obtained. That is, in the SCOWA semiconductor optical amplifier with the optical confinement factor decreased, it was recognized that the optical spectrum component at the short-wavelength side was markedly increased. To decrease the optical confinement factor, for example, a semiconductor optical amplifier with a strong waveguide structure may be employed instead of SCOWA.

TABLE 5

| | | SOA | | | | | | | |
|---|---|---|---|---|---|---|---|---|---|
| Driving condition | Driving current mA | Driving current density kA/cm² | ASE mW | SOA light output mW | Pulse width ps | Sub-pulse component | Pulse component | Pulse energy pJ | Peak power W |
| A | 1464 | 8.0 | 19.0 | 45.6 | 0.15 | 0.110 | 0.753 | 83 | 493 |
| B | 1647 | 9.0 | 28.1 | 61.1 | 0.14 | 0.095 | 0.704 | 104 | 673 |
| C | 2000 | 10.9 | 48.0 | 87.4 | 0.13 | 0.120 | 0.655 | 139 | 938 |
| D | 2200 | 12.0 | 56.9 | 98.6 | 0.104 | 0.220 | 0.549 | 131 | 983 |
| D | 2200 | 12.0 | 39.7 | 83.3 | 0.081 | 0.250 | 0.804 | 162 | 1502 |

A value obtained by subtracting a sub-pulse component from a pulse energy in Table 5 is an energy of a main pulse. The peak power can be obtained by dividing the energy of the main pulse by the pulse time width. That is, an expression is given as follows:

(peak power)=(pulse energy)×(1−sub-pulse component)/pulse width.

For example, in case of the lowermost row in Table 5, an expression is given as follows:

162 picojoules×(1−0.25)/0.081 picoseconds=1.5 kilowatts.

Embodiment 3

Embodiment 3 is a modification of any of Embodiment 1 and Embodiment 2. The configuration of the dispersion compensation optical system is changed.

Figure 22A:
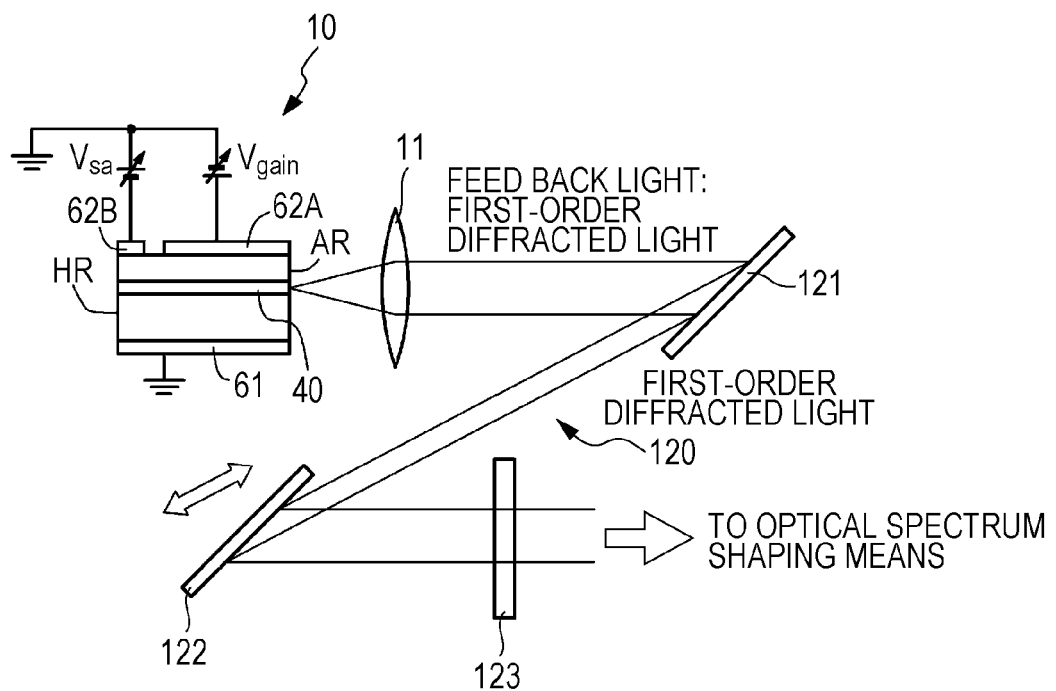
FIGS. 22A and 22B are conceptual diagrams showing a semiconductor-laser-device assembly of Embodiment 3 and a modification of Embodiment 3.

In Embodiment 3, an external resonator structure includes a dispersion compensation optical system 120 and a partially reflecting mirror 123. Specifically, as shown in a conceptual diagram of FIG. 22A, the dispersion compensation optical system 120 includes a pair of diffraction gratings 121 and 122. Pulsed laser light emitted from the mode-locked semiconductor laser element 10 collides with the first diffraction grating 121, and first-order or higher diffracted light is emitted, the light collides with the second diffraction grating 122, first-order or higher diffracted light is emitted, and the light reaches the partially reflecting mirror 123 which forms one end of the external resonator. The first diffraction grating 121 and the second diffraction grating 122 are arranged in parallel to each other. Then, part of the laser light, which has reached the partially reflecting mirror 123, passes through the partially reflecting mirror 123, and is emitted to the semiconductor optical amplifier 210. In contrast, the residual part of the laser light, which has reached the partially reflecting mirror 123, is fed back to the mode-locked semiconductor laser element 10 through the second diffraction grating 122 and the first diffraction grating 121. By changing the distance between the first diffraction grating 121 and the second diffraction grating 122, the group-velocity dispersion value in the dispersion compensation optical system 120 can be changed.

It is to be noted that the number of diffraction gratings to be used may be one. In this case, the diffracted light from the diffraction grating is incident on the partially reflecting mirror, and laser light emitted from the mode-locked semiconductor laser element is collected at the partially reflecting mirror. By feeding back the light reflected by the partially reflecting mirror to the diffraction grating through the same optical path, the same effect as the effect, which is obtained when the diffraction gratings face each other, can be obtained. The dispersion compensation amount can be changed by changing the distance between the diffraction grating and the partially reflecting mirror. In this case, since the light emitted from the partially reflecting mirror is divergent light, a portion configured to collimate light beams is preferably provided outside the resonator. Also, in Embodiment 3, a reflective diffraction grating is expected to be used. However, a transmissive diffraction grating may be used as long as an external resonator having a similar function can be formed.

Figure 22B:
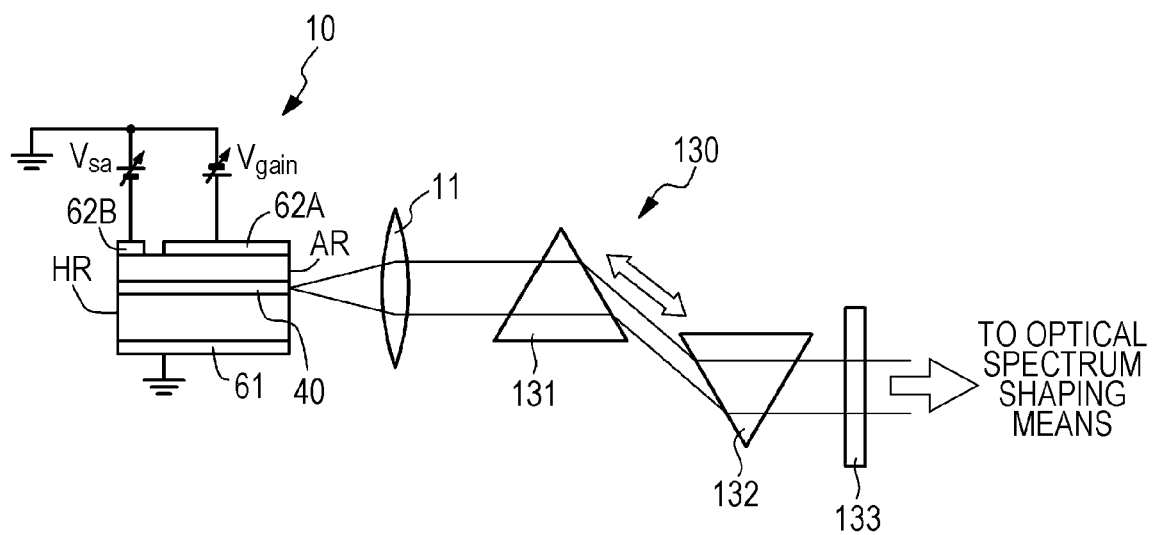

Alternatively, as shown in a conceptual diagram in FIG. 22B, a dispersion compensation optical system 130 includes a pair of prisms 131 and 132. Pulsed laser light emitted from the mode-locked semiconductor laser element 10 passes through the first prism 131, further passes through the second prism 132, and reaches a partially reflecting mirror 133 which forms one end of the external resonator. The first prism 131 and the second prism 132 are arranged in a point symmetric manner. Then, part of the laser light, which has reached the partially reflecting mirror 133, passes through the partially reflecting mirror 133, and is emitted to the semiconductor optical amplifier 210. In contrast, the residual part of the laser light, which has reached the partially reflecting mirror 133, passes through the second prism 132 and the first prism 131, and is fed back to the mode-locked semiconductor laser element 10. By changing the distance between the first prism 131 and the second prism 132, the group-velocity dispersion value in the dispersion compensation optical system 120 can be changed.

It is to be noted that the number of prisms to be used may be one. In this case, the light, which has passed through the prism, is incident on the partially reflecting mirror, and laser light emitted from the mode-locked semiconductor laser element is collected at the partially reflecting mirror. By feeding back the light reflected by the partially reflecting mirror to the prism through the same optical path, the same effect as the effect, which is obtained when the two prisms are provided, can be obtained. The dispersion compensation amount can be changed by changing the distance between the prism and the partially reflecting mirror. In this case, since the light emitted from the partially reflecting mirror is divergent light, a portion configured to collimate light beams is preferably provided outside the resonator.

Figure 23:
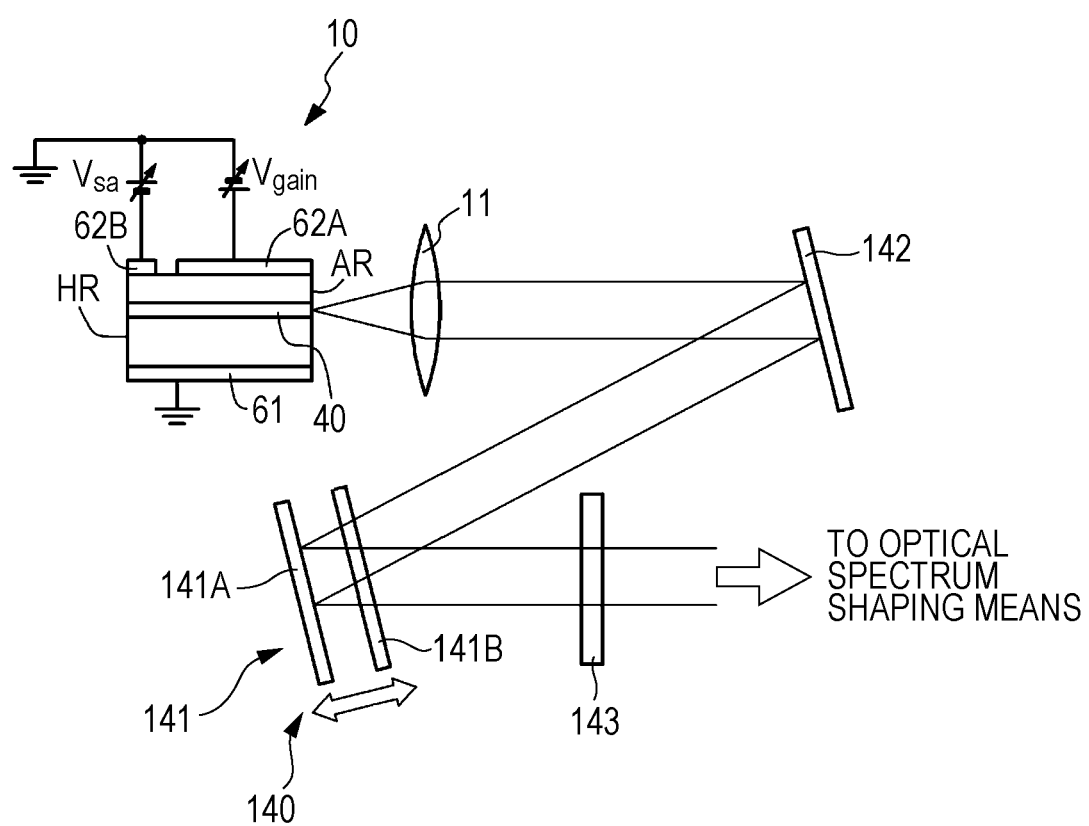
FIG. 23 is a conceptual diagram of a semiconductor-laser-device assembly of another modification of Embodiment 3.

Alternatively, as shown in a conceptual diagram in FIG. 23, a dispersion compensation optical system 140 includes a Gires-Tournois interferometer 141. The Gires-Tournois interferometer 141 includes a reflecting mirror 141A with a reflectivity of 1, and a partially reflecting mirror 141B with a reflectivity smaller than 1. By controlling the distance between the reflecting mirror 141A and the partially reflecting mirror 141B, or by adjusting the incidence angle of incident laser light, the group-velocity dispersion value in the dispersion compensation optical system 140 can be changed. Pulsed laser light emitted form the mode-locked semiconductor laser element 10 is reflected by a plane mirror 142, passes through the partially reflecting mirror 141B, is reflected by the reflecting mirror 141A, passes through the partially reflecting mirror 141B again, and reaches a partially reflecting mirror 143 which forms the external resonator. Then, part of the laser light, which has reached the partially reflecting mirror 143, passes through the partially reflecting mirror 143, and is emitted to the semiconductor optical amplifier 210. In contrast, the residual part of the laser light, which has reached the partially reflecting mirror 143, passes through the partially reflecting mirror 141B, is reflected by the reflecting mirror 141A, passes the partially reflecting mirror 141B and the plane mirror 142 again, and is fed back to the mode-locked semiconductor laser element 10.

Alternatively, the dispersion compensation optical system includes a dielectric multilayer film mirror. In this case, by adjusting the incidence angle of incident laser light, the group-velocity dispersion value in the dispersion compensation optical system can be changed.

Embodiment 4

Embodiment 4 is also a modification of any of Embodiment 1 and Embodiment 2. The configuration of the dispersion compensation optical system is changed. Hereinafter, the dispersion compensation optical device of Embodiment 4 is described; however, before this, the principle etc. of the dispersion compensation optical device of Embodiment 4 is described.

Figure 24:
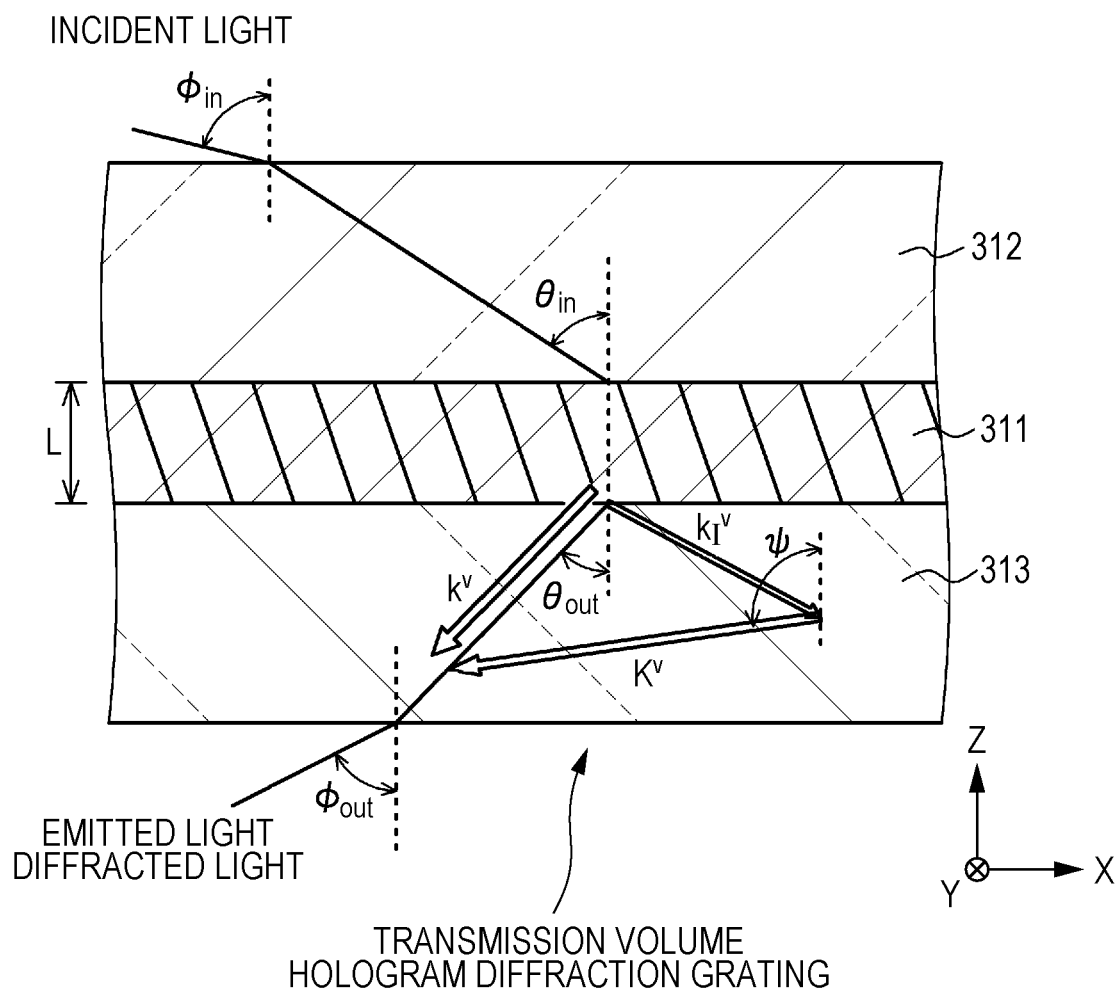
FIG. 24 is a schematic partial cross-sectional view of a transmission volume hologram diffraction grating in a semiconductor optical amplifier included in a semiconductor-laser-device assembly of Embodiment 4.

FIG. 24 is a schematic partial cross-sectional view of a transmission volume hologram diffraction grating. In the transmission volume hologram diffraction grating, a diffraction grating member (photopolymer material) 311 with a thickness L is arranged between two glass substrates 312 and 313 (refractive index: N). In the diffraction grating member 311, periodic refractive index modulation ratios Δn (indicated by thick lines in FIG. 24) are provided in parallel to each other by using two-beam interference. A condition that the incident laser light is diffracted is given by Expression (1) as follows:

$$k_1^v + m \cdot K^v = k^v \quad (1),$$

where $k_I^v$ is a wave-number vector of incident laser light, $k^v$ is a wave-number vector of diffracted light, $K^v$ is a reciprocal lattice vector of periodic modulation of a refractive index (hereinafter, called "diffraction grating vector"), and m is an integer. To express a vector, a superscript "v" is added for convenience of the description.

Herein, the wave-number vectors $k_I^v$ and $k^v$ of the incident laser light and the diffracted light are wave-number vectors of the glass substrates 312 and 313. It is assumed that $\phi_{in}$ is an incidence angle of laser light to the dispersion compensation optical device (more specifically, the glass substrate 312) and $\phi_{out}$ is an emission angle of laser light from the dispersion compensation optical device (more specifically, the glass substrate 313). The incidence angle $\phi_{in}$ and the emission angle $\phi_{out}$ are angles formed with respect to the normal to the laser light incidence surface of the transmission volume hologram diffraction grating. Herein, the diffraction grating vector $K^v$ is given by Expression (2) as follows by using a period P of the refractive-index modulation ratio Δn:

$$|K^v| = 2\pi/P \quad (2).$$

Also, the magnitude of the diffraction grating vector $K^v$ is given by Expression (3) as follows:

$$K = k[\{\sin(\theta_{in}) + \sin(\theta_{out})\}^2 \{\cos(\theta_{in}) - \cos(\theta_{out})\}^2]^{1/2} = k/2\{1 - \cos(\theta_{in} + \theta_{out})\}^{1/2} \quad (3),$$

where $\theta_{in}$ is an incidence angle of laser light to the diffraction grating member 311, $\theta_{out}$ is an emission angle (diffraction angle) of laser light from the diffraction grating member 311, and is a wavelength of the incident laser light.

Hence, the period P of the refractive-index modulation ratio Δn is given by Expression (4) as follows:

$$P = \lambda/[2\{1 - \cos(\theta_{in} + \theta_{out})\}]^{1/2} \quad (4).$$

Meanwhile, since the diffraction condition by Expression (1) keeps generality even though only a component in a diffraction grating plane of each vector (x component in FIG. 24) is considered. Thus, the diffraction condition may be rewritten by Expression (5) as follows:

$$k_{I,x}^v + m \cdot K_x^v = k_x^v \quad (5).$$

Also, based on Expression (5), if the relationship between the incidence angle $\phi_{in}$ and the emission angle (diffraction angle) $\phi_{out}$ of the laser light with respect to the transmission volume hologram diffraction grating is obtained, the relationship is given by Expression (6) as follows:

$$\sin(\phi_{in}) + m \cdot (\lambda/P) \cdot \sin(\psi) = \sin(\phi_{out}) \quad (6),$$

where ψ is an angle formed by the normal to the transmission volume hologram diffraction grating and the diffraction grating vector $K^v$. The relationship between the incidence angle $\theta_{in}$ and the diffraction angle $\theta_{out}$ with respect to the diffraction grating member 311 has a relationship of Expression (7) as follows:

$$\sin(\psi) = \{\sin(\theta_{min}) + \sin(\theta_{out})\}/[2\{1 - \cos(\theta_{in} + \theta_{out})\}]^{1/2} \quad (7).$$

Dependency of angular dispersion of diffracted light on the wavelength can be calculated, and the dependence is given by Expression (8) as follows:

$$d\phi_{out}/d\lambda = \{\sin(\theta_{in}) + \sin(\theta_{out})\}/\{N \cdot \lambda \cdot \cos(\theta_{out})\} \quad (8).$$

In the dispersion compensation optical device of Embodiment 4, the wavelength dependence of spatial dispersion represented by Expression (8) is used for compression and expansion of an ultrashort pulse. Also, a high throughput is determined by diffraction efficiency of the transmission volume hologram diffraction grating. Then, a diffraction efficiency η can be approximated by Expression (9) as follows:

$$\eta = \sin^2[(\pi \cdot \Delta n \cdot L)/2\lambda\{\cos(\theta_{min}) \cdot \cos(\theta_{out})\}^{1/2}] \cdot \text{Sin } c^2[\Delta k_z \cdot (L/2)] \quad (9).$$

Herein, the term of $\sin^2$ is the coupling constant of the incident laser light and the diffracted light determined in accordance with the refractive-index modulation ratio Δn and the thickness L of the diffraction grating member forming the transmission volume hologram diffraction grating. The term of Sin $c^2$ corresponds to a change in diffraction efficiency when the wavelength is shifted from the Bragg diffraction condition (see Tsung-Yuan Yang, et al., "Femtosecond laser pulse compression using volume phase transmission holograms", Applied Optics, 1 Jul. 1985, Vol. 24, No. 13). The band of the diffraction wavelength is determined by expansion of a reciprocal lattice vector allowed in the transmission volume hologram diffraction grating. A difference Δk of the wave-number vector caused by a change in incident wavelength is given by Expression (10) as follows:

$$\Delta k = 2\pi \cdot N\{1/(\lambda + \Delta\lambda) - 1/\lambda\} - (2\pi \cdot N)(\Delta\lambda/\lambda^2) \quad (10).$$

At this time, a wave-number vector component $\Delta k_z$ in the diffraction grating plane is given by Expression (11) as follows:

$$\Delta k_z = \Delta k\{1 - \cos(\theta_{in} + \theta_{out})\}/\cos(\theta_{out}) \quad (11).$$

If Expression (11) is used, diffraction efficiency for a wavelength band for pulse compression can be approximated by Expression (12) as follows:

$$\eta = \sin^2[(\pi \cdot \Delta n \cdot L)/2\lambda\{\cos(\theta_{min}) \cdot \cos(\theta_{out})\}^{1/2}] \cdot \text{Sin } c^2[\pi \cdot N \cdot L \cdot (\Delta\lambda/\lambda^2)\{1 - \cos(\theta_{in} + \theta_{out})\}/\cos(\phi_{out})] \quad (12).$$

Then, conditions of the transmission volume hologram diffraction grating satisfying requirements are obtained. Herein, Expression (12) is described as a product of two functions, and includes a term proportional to $\sin^2$ indicating the diffraction efficiency in accordance with the refractive-index modulation ratio Δn, and a term proportional to Sin $c^2$ depending on the difference between the wave-number vector of the incident laser light and the wave-number vector of the diffracted light.

The dispersion compensation optical device of Embodiment 4 satisfies requirements as follows:

(A) a high throughput of 90% or higher, and (B) a large spatial dispersion, and in the dispersion compensation optical device according to the first form, (C) the sum of the incidence angle $\phi_{in}$ of the laser light and the emission angle $\phi_{out}$ of the first-order diffracted light is 90 degrees.

(A) Regarding Provision of High Throughput

To provide a high throughput, a diffraction efficiency, which is as high as possible in the wavelength band to be used, has to be provided. In Expression (12), only the term of Sin $c^2$ depends on the wavelength band. If it is assumed that the term of $\sin^2$ is "1" under a certain condition, Expression (13) is given as follows:

$$\eta \approx \text{inc}^2[\pi \cdot N \cdot L \cdot (\Delta\lambda/\lambda^2)\{1-\cos(\theta_{in}+\theta_{out})\}/\cos(\theta_{out})] \quad (13).$$

With Expression (13), to satisfy $\eta \geq 90\%$, Expression (14) has to be satisfied as follows:

$$|\pi \cdot N \cdot L \cdot (\Delta\lambda/\lambda^2)\{1-\cos(\theta_{in}+\theta_{out})\}/\cos(\theta_{out})| \leq 0.553 \quad (14).$$

Herein, "0.553" is a value to cause the term of Sin $c^2$ becomes 0.9 or larger. Accordingly, the conditions of the thickness L and the refractive index N of the diffraction grating member forming the transmission volume hologram diffraction grating for satisfying the band (the optical spectrum width of laser light subjected to pulse compression/expansion) $\Delta\lambda$ with a wavelength $\lambda$ to be used are derived by Expression (15) or Expression (A) as follows:

$$|1-\cos(\theta_{in}+\theta_{out})|/\cos(\theta_{out})| \leq \{0.553/(\pi \cdot N \cdot L)\}(\lambda^2/\Delta\lambda) \quad (15)/(A).$$

Expression (15) can be also written with the pulse time width $\Delta\tau$ of the laser light pulse subjected to compression/expansion. The pulse time width $\Delta\tau$ and the frequency width $\Delta\nu$ of the light pulse which may be compressed by the dispersion compensation optical device have the following relationship if the light pulse waveform is a Gaussian function as follows, while, for a Fourier limit pulse, the relationship becomes an equation:

$$\Delta\tau \cdot \Delta\nu \leq 0.441 \quad (16).$$

Also, the frequency width $\Delta\nu$ can be approximated as Expression (17) as follows by using the wavelength $\lambda$, the wavelength width $\Delta\lambda$, and the light speed $C_0$ ($2.99792458 \times 10^8$ m/second) and if $\lambda >> \Delta\lambda$:

$$\Delta\nu = C_0\{1/\lambda - 1/(\lambda+\Delta\lambda)\} \approx C_0(\Delta\lambda/\lambda^2) \quad (17).$$

When Expression (17) is used, the inequality of the time band width product can be rewritten as Expression (18) as follows by using the light speed and the wavelength band:

$$\Delta\tau \leq (0.441/\Delta\nu) \approx 0.441\{\lambda^2/(C_0 \cdot \Delta\lambda)\} \quad (18).$$

When Expression (18) is used, the condition relating to the thickness L of the diffraction grating member can be rewritten as Expression (19) as follows by using the minimum pulse time width $\Delta\tau$ that allows pulse compression:

$$|\{1-\cos(\theta_{in}+\theta_{out})\}/\cos(\theta_{out})| \leq (0.553 \cdot \Delta\tau \cdot C_0)/(0.441\pi \cdot N \cdot L) \quad (19).$$

In this case, since the Gaussian function is assumed as the pulse waveform, "0.441" is used as the minimum value of the time band width product. However, other pulse waveform may be assumed. For example, in case of the Sech$^2$ function, "0.315" may be used as the minimum value of the time band width product.

(B) Regarding Large Spatial Dispersion

To form a small dispersion compensation optical device, angular dispersion by the transmission volume hologram grating has to be increased. To increase the angular dispersion, angular-dispersion dependence on the wavelength given by Expression (8) has to be increased. The angular dispersion of a ruling diffraction grating having the same ruling as the period P of the refractive-index modulation ratio $\Delta n$ is given by Expression (20) as follows:

$$d\phi_{out}/d\lambda = 1/\{P\cos(\theta_{out})\} \leq 2/\{\lambda\cos(\theta_{out})\} \quad (20).$$

When Expression (20) is compared with Expression (8), it is found that the angular dispersion of the transmission volume hologram grating is decreased by about $1/(2N)$. Hence, as a condition that can provide the spatial dispersion of about ⅓ as compared with the ruling diffraction grating, a condition is considered as follows:

$$\sin(\theta_{in})+\sin(\phi_{out}) \geq 1.$$

If the condition of the angle is converted into the following condition:

$$\{1-\cos(\theta_{in}+\theta_{out})\}/\cos(\theta_{out}),$$

the condition can be approximated as Expression (21):

$$\{1-\cos(\theta_{in}+\theta_{out})\}/\cos(\theta_{out}) > 0.3 \quad (21).$$

When the condition is caused to correspond to Expression (15) or Expression (19), as the condition for the thickness L of the diffraction grating member forming the transmission volume hologram grating, Expression (22) can be obtained based on the description of the wavelength band, and Expression (23) can be obtained based on the description of the pulse time width, while the condition is for the pulse time width and the thickness L in the Sin $c^2$ term:

$$L \leq \{0.553/(0.3 \cdot \pi \cdot N)\}(\lambda^2/\Delta\lambda) \quad (22), \text{ and}$$

$$L \leq (0.553 \cdot \Delta\tau \cdot C_0)/(0.3 \times 0.441 \cdot \pi \cdot N) \quad (23).$$

Further, the condition for maximizing the $\sin^2$ term is given by Expression (24) as follows:

$$L = \{(1+2m) \cdot \lambda/\Delta n\} \cdot \{\cos(\theta_{in}) \cdot \cos(\theta_{out})\}^{1/2} \quad (24).$$

Then, based on Expression (24), the condition for causing the diffraction efficiency to be 90% or higher is given by Expression (25) or Expression (B) as follows:

$$\{(0.8+2m) \cdot \lambda/\Delta n\} \cdot \{\cos(\theta_{in}) \cdot \cos(\theta_{out})\}^{1/2} \leq L \leq \{(1.2+2m) \cdot \lambda/\Delta n\} \cdot \{\cos(\theta_{in}) \cdot \cos(\theta_{out})\}^{1/2} \quad (25)/(B).$$

If the refractive-index modulation ratio $\Delta n$ of the diffraction grating member 311 is a predetermined value, the thickness L of the diffraction grating member has to satisfy the above-described condition. Since the refractive-index modulation ratio $\Delta n$ depends on an exposure time of two-beam interference, the refractive-index modulation ratio $\Delta n$ is difficult to be uniquely determined. However, the upper limit is determined by the property of the diffraction grating member 311. Hence, the requirement for determining the thickness L of the diffraction grating member from the refractive-index modulation ratio $\Delta n$ was described.

(C) Consideration about Case when Sum of Incidence Angle $\phi_{in}$ of Laser Light and Emission Angle $\phi_{out}$ of First-Order Diffracted Light is 90 Degrees To form the dispersion compensation optical device available for easy optical-axis adjustment, the following equation has to be satisfied:

$$\phi_{in}+\phi_{out}=90 \text{ degrees}.$$

Figure 25:
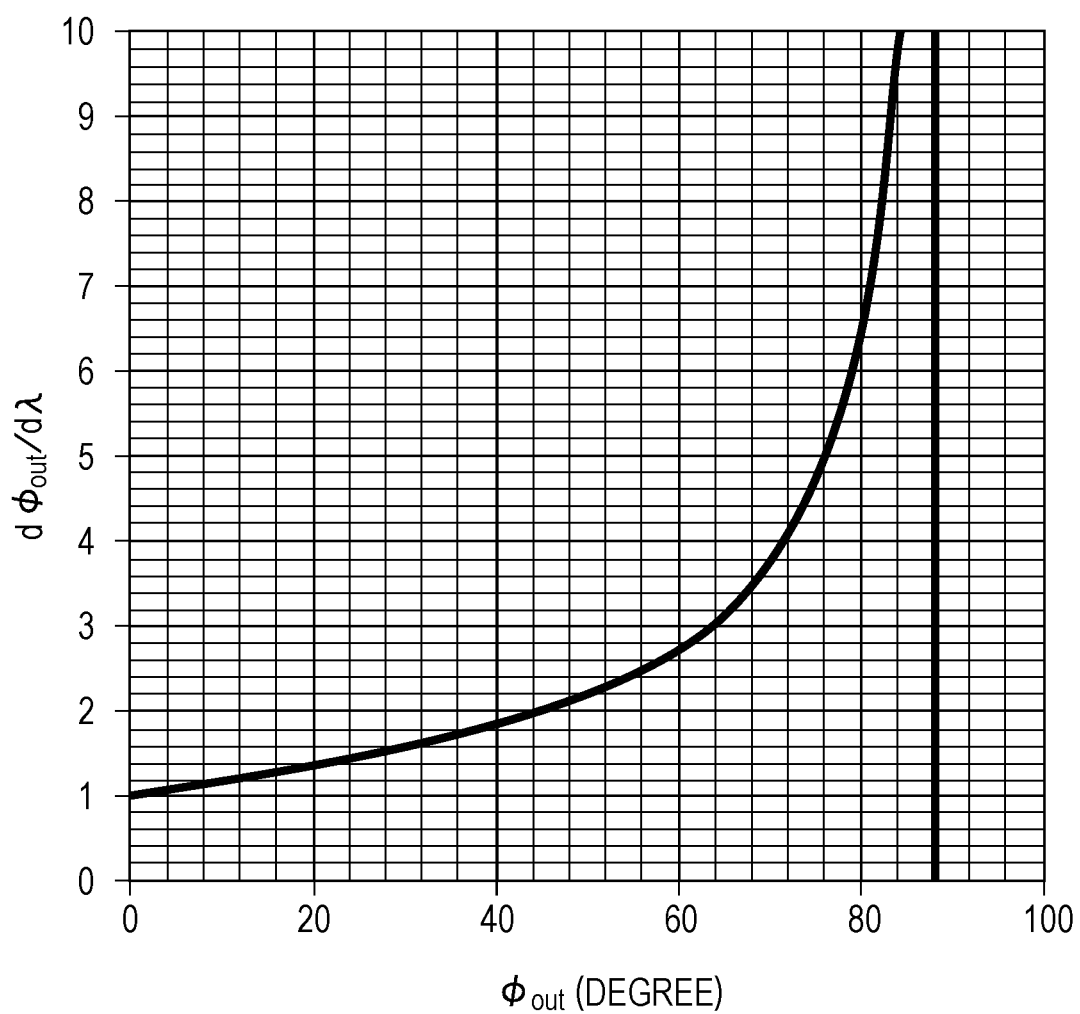
FIG. 25 is a graph showing a dependence d□out/d□ of spatial dispersion on an emission angle (diffraction angle) □out of first-order diffracted light in the transmission volume hologram diffraction grating.

In particular, if $\phi_{out} > \phi_{in}$, the angular dispersion in Expression (8) can be large. FIG. 25 shows a dependence $d\phi_{out}/d\lambda$ of spatial dispersion with respect to $\phi_{out}$.

Hereinafter, a calculation example for the diffraction efficiency of the transmission volume hologram grating if $\phi_{in} \approx \phi_{out}$ and $\theta_{in} \approx \theta_{out}$ is given.

Figure 26:
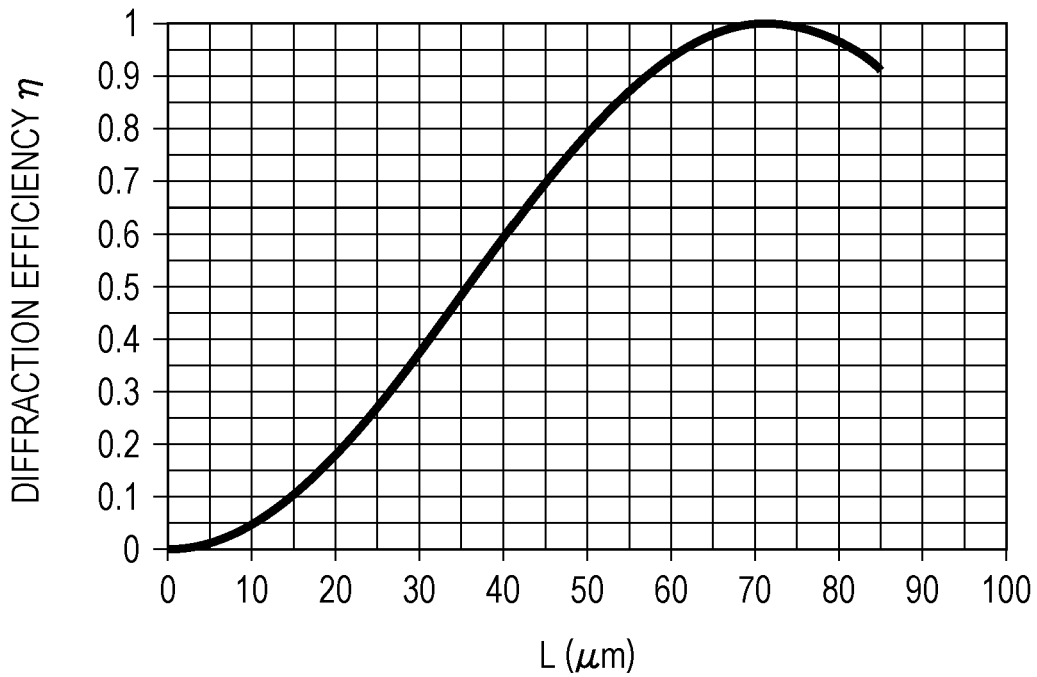
FIG. 26 is a graph showing a result of calculation of a term of sin 2 depending on a refractive-index modulation ratio □n in Expression (12)

FIG. 26 shows a result of calculation of the term of $\sin^2$ depending on the refractive-index modulation ratio $\Delta n$. For the calculation, the wavelength is fixed in Expression (12), and the term proportional to the $\sin^2$ term is extracted. Also, the following values are used. When L=70 μm, the term proportional to the $\sin^2$ term becomes the maximum.

Figure 27:
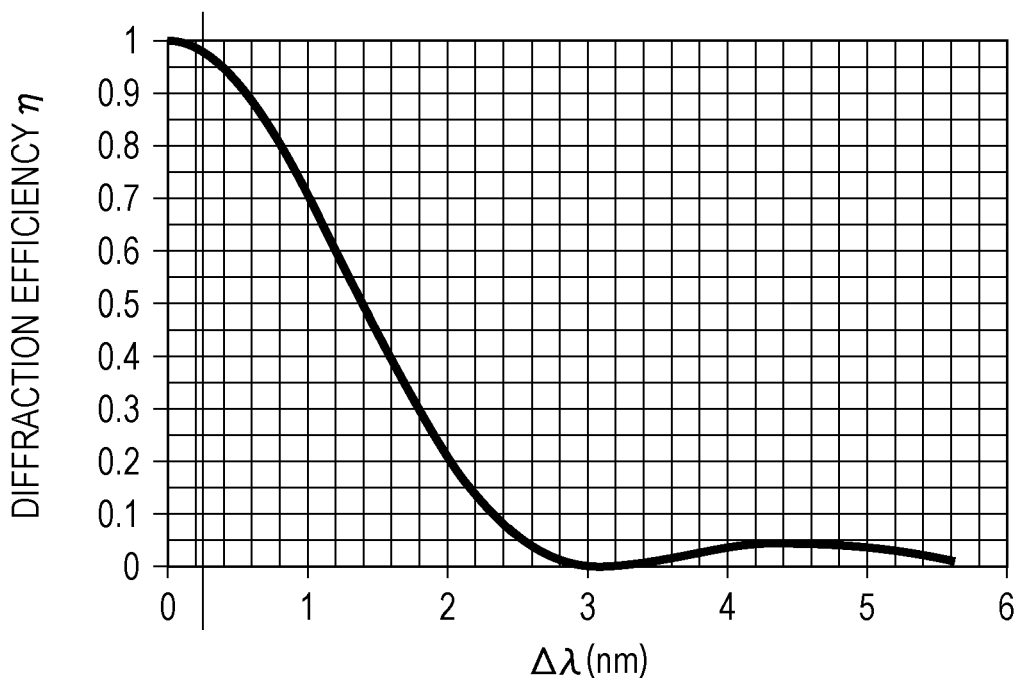
FIG. 27 is a graph showing a change in diffraction efficiency □ when an optical spectrum width of incident laser light is changed while conditions of a thickness L, a refractive-index modulation ratio □n, and a wavelength □ of a diffraction grating member included in a dispersion compensation optical device are fixed.

Refractive-index modulation ratio Δn=0.005
Wavelength λ=405 nm
Incidence angle $\theta_{in}$ on diffraction grating member=28 degrees Next, FIG. 27 shows a change in diffraction efficiency when the optical spectrum width of the incident laser light is changed while the conditions of L=70 refractive-index modulation ratio Δn=0.005, and wavelength λ=405 nm are fixed. Noticeable wavelength dependence is observed; however, wavelength expansion indicating 95% or higher of diffraction efficiency is about ±0.2 nm with respect to the light with the wavelength of 405 nm. The wavelength expansion corresponds to the pulse time width with about 0.6 picoseconds for the ultrashort pulse at the Fourier conversion limit, and is a wavelength band that can be applied to the ultrashort pulse with a larger time width than the pulse time width. Hence, application is available to the laser light pulse generated by the mode-locked semiconductor laser element made of the InGaN-based compound semiconductor layer.

By properly selecting the condition of the refractive-index modulation ratio Δn as described above, the transmission volume hologram grating with the diffraction efficiency of 90% or higher at a desirable diffraction angle of a desirable wavelength can be provided. Then, by using this, the entire throughput of the dispersion compensation optical device described in the following embodiment can be 80% or higher.

Figure 28:
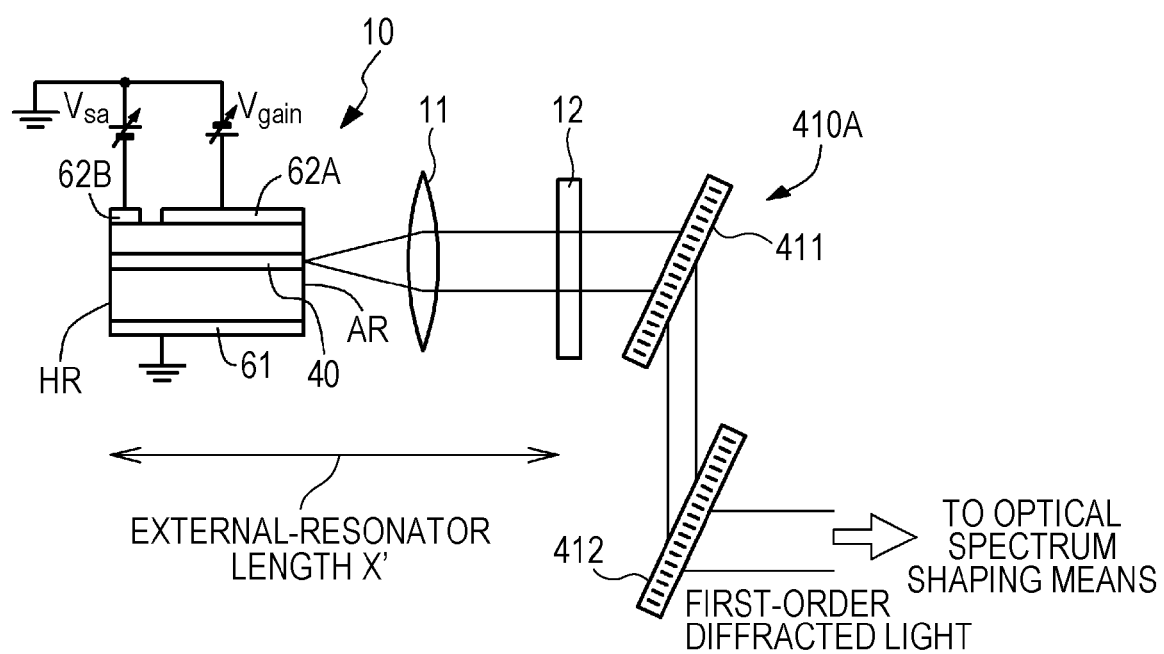
FIG. 28 is a conceptual diagram of a portion of the semiconductor-laser-device assembly of Embodiment 4.

Embodiment 4 relates to the dispersion compensation optical device according to the first form, or more specifically to the dispersion compensation optical device etc.-A. FIG. 28 is a conceptual diagram of a portion of the semiconductor-laser-device assembly of Embodiment 4. The schematic partial cross-sectional view of the transmission volume hologram diffraction grating is shown in FIG. 24. Also, the schematic end view along the extending direction of the resonator of the mode-locked semiconductor laser element 10 is shown in FIG. 2. The schematic cross-sectional view along the direction orthogonal to the extending direction of the resonator of the mode-locked semiconductor laser element is shown in FIG. 3.

A dispersion compensation optical device 410A of Embodiment 4 includes two transmission volume hologram diffraction gratings (first transmission volume hologram diffraction grating 411 and second transmission volume hologram diffraction grating 412) arranged to face each other. In each of the transmission volume hologram diffraction gratings 411 and 412, the sum of the incidence angle $\phi_{in}$ of laser light and the emission angle $\phi_{out}$ of first-order diffracted light is 90 degrees. That is, $\phi_{in}+\phi_{out}=90$ degrees is established.

By adjusting the distance between the first transmission volume hologram diffraction grating 411 and the second transmission volume hologram diffraction grating 412, the group-velocity dispersion value (dispersion compensation amount) by the dispersion compensation optical device can be controlled. Meanwhile, if the value of $(\phi_{in}+\phi_{out})$ is not 90 degrees, when the distance between the first transmission volume hologram diffraction grating 411 and the second transmission volume hologram diffraction grating 412 is increased, the emission position of the first-order diffracted light from the dispersion compensation optical device is changed accordingly. Hence, if the group-velocity dispersion value (dispersion compensation amount) is changed, the optical system has to be adjusted accordingly. However, by setting the value of $(\phi_{in}+\phi_{out})$ at 90 degrees, the emission position of the first-order diffracted light from the dispersion compensation optical device is not changed, and the adjustment for the group-velocity dispersion value (dispersion compensation amount) becomes easy.

The first transmission volume hologram diffraction grating 411 and the second transmission volume hologram diffraction grating 412 are arranged in parallel to each other. Also, in the dispersion compensation optical device 410A of Embodiment 4, in the first transmission volume hologram diffraction grating 411 on which the laser light is incident from the mode-locked semiconductor laser element 10, the emission angle $\phi_{out}$ of the first-order diffracted light is larger than the incidence angle $\phi_{in}$ of the laser light. That is, an expression is given as follows:

$$\phi_{out} > \phi_{in}.$$

In contrast, in the second transmission volume hologram diffraction grating 412 on which the first-order diffracted light is incident from the first transmission volume hologram diffraction grating 411, the emission angle $\phi_{out}$ of the first-order diffracted light may be smaller than the incidence angle $\phi_{in}$ of the laser light. That is, an expression is given as follows:

$$\phi_{out} < \phi_{in}.$$

Further, the incidence angle $\phi_{in}$ of the laser light at the first transmission volume hologram diffraction grating 411 is equal to the emission angle (diffraction angle) $\phi_{out}$ of the first-order diffracted light at the second transmission volume hologram diffraction grating 412, and the emission angle (diffraction angle) $\phi_{out}$ of the first-order diffracted light at the first transmission volume hologram diffraction grating 411 is equal to the incidence angle $\phi_{in}$ of the first-order diffracted light at the second transmission volume hologram diffraction grating 412.

In the dispersion compensation optical device 410A of Embodiment 4, the laser light incident on the first transmission volume hologram diffraction grating 411 is diffracted and reflected by the first transmission volume hologram diffraction grating 411, is emitted as first-order diffracted light, and the light is further incident on the second transmission volume hologram diffraction grating 412, the light is diffracted and reflected by the second transmission volume hologram diffraction grating 412, and the light is emitted to the semiconductor optical amplifier 210 as first-order diffracted light. In the dispersion compensation optical device 410A, the group-velocity dispersion value (dispersion compensation amount) is negative. The group-velocity dispersion value can be controlled by changing the distance between the first transmission volume hologram diffraction grating 411 and the second transmission volume hologram diffraction grating 412 in the dispersion compensation optical device 410A. The laser light incident on the first transmission volume hologram diffraction grating 411 and the laser light emitted from the second transmission volume hologram diffraction grating 412 are substantially parallel to each other.

An aspherical convex lens with a focal length of 4.0 mm, which serves as the collimating means 11 for collimating the laser light from the mode-locked semiconductor laser element 10, and a partially reflecting mirror 12 are arranged between the second end surface of the mode-locked semiconductor laser element 10 and the dispersion compensation optical device 410A. The first end surface of the mode-locked semiconductor laser element 10 and the partially reflecting mirror 12 form the external resonator structure. The laser light emitted from the second end surface of the mode-locked semiconductor laser element 10 collides with the partially reflecting mirror 12. Part of the laser light passes through the partially reflecting mirror 12 and is incident on the first transmission volume hologram diffraction grating 411. The residual part is fed back to the mode-locked semiconductor laser element 10.

In the dispersion compensation optical device of Embodiment 4, the sum of the incidence angle $\phi_{in}$ of the laser light and the emission angle $\phi_{out}$ of the first-order diffracted light is 90 degrees. Hence, a small dispersion compensation optical device with a high throughput by a high diffraction efficiency can be provided. Also, the dispersion compensation optical device can be decreased in size, and the degree of freedom for arrangement of optical components forming the dispersion compensation optical device is increased. Further, the angular-dispersion dependence on the wavelength given by Expression (8) can be increased. Also, since the diffraction angle can be designed at any angle, the degree of freedom for optical design of the dispersion compensation optical device can be increased, and the group-velocity dispersion value (dispersion compensation amount) in the dispersion compensation optical device can be easily adjusted. Accordingly, the high degree of freedom for arrangement of optical components forming the dispersion compensation optical device can be attained.

Embodiment 5

Figure 29A:
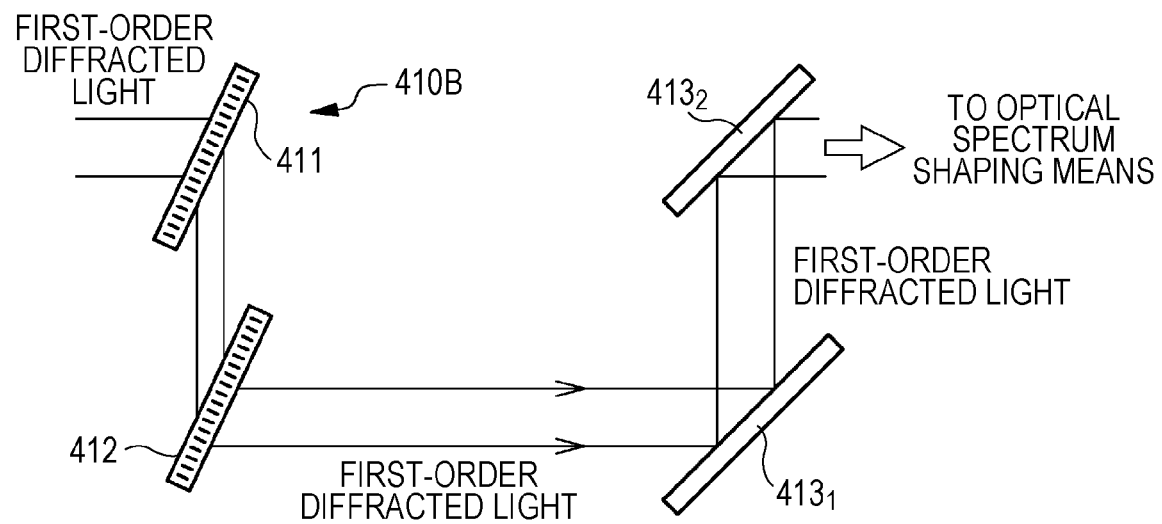
FIGS. 29A and 29B are conceptual diagrams of dispersion compensation optical devices of Embodiment 5 and Embodiment 6.

Embodiment 5 is a modification of Embodiment 4, and relates to the dispersion compensation optical device etc.-B. A dispersion compensation optical device 410B of Embodiment 5, the conceptual diagram of which is shown in FIG. 29A, forms the first transmission volume hologram diffraction grating 411 in the semiconductor-laser-device assembly, and further includes a first reflecting mirror $413_1$ and a second reflecting mirror $413_2$ arranged in parallel to each other. The laser light emitted from the second transmission volume hologram diffraction grating 412 may collide with and be reflected by the first reflecting mirror $413_1$, and then may collide with and be reflected by the second reflecting mirror $413_2$. Herein, the laser light reflected by the second reflecting mirror $413_2$ is substantially located on the extension line of the laser light incident on the first transmission volume hologram diffraction grating 411. Accordingly, the dispersion compensation optical device 410 can be easily arranged in and inserted to an existing optical system. If the distance between the first transmission volume hologram grating 411 and the second transmission volume hologram grating 412 is adjusted, the second transmission volume hologram grating 412 and the first reflecting mirror $413_1$ may be moved so that the positional relationship between the second transmission volume hologram grating 412 and the first reflecting mirror $413_1$ is not changed. In the dispersion compensation optical device 410B, the dispersion compensation amount is negative.

Except for the above-described points, the dispersion compensation optical device in Embodiment 5 has configuration and structure similar to the dispersion compensation optical device in Embodiment 4; and hence the detailed description is omitted.

Embodiment 6

Figure 29B:
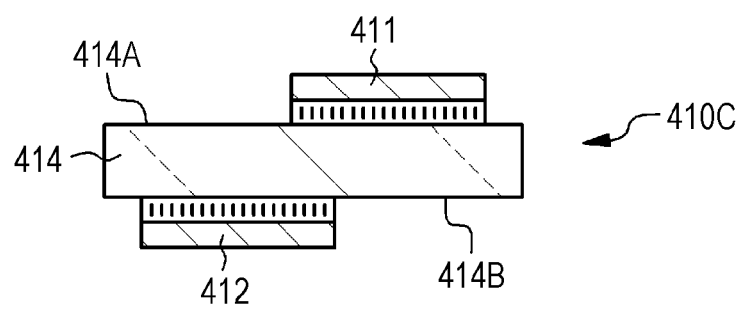

Embodiment 6 is also a modification of Embodiment 4, and relates to the dispersion compensation optical device etc.-C. A dispersion compensation optical device 410C in Embodiment 6, the conceptual diagram of which is shown in FIG. 29B, forms the first transmission volume hologram diffraction grating 411 in the semiconductor-laser-device assembly. The first transmission volume hologram diffraction grating 411 is provided on a first surface 414A of a base member 414 made of glass. The second transmission volume hologram diffraction grating 412 is provided on a second surface 414B of the base member 414, the second surface 414B being opposite to the first surface 414A. In the dispersion compensation optical device 410C in Embodiment 6, the thickness of the base member 414 may be changed to change the distance between the two transmission volume hologram diffraction gratings 411 and 412. Accordingly, the group-velocity dispersion value can be changed. In this case, the group-velocity dispersion value is negative. The laser light incident on the first transmission volume hologram diffraction grating 411 and the laser light emitted from the second transmission volume hologram diffraction grating 412 are substantially parallel to each other.

Except for the above-described points, the dispersion compensation optical device in Embodiment 6 has configuration and structure similar to the dispersion compensation optical device in Embodiment 4; and hence the detailed description is omitted.

Embodiment 7

Figure 30A:
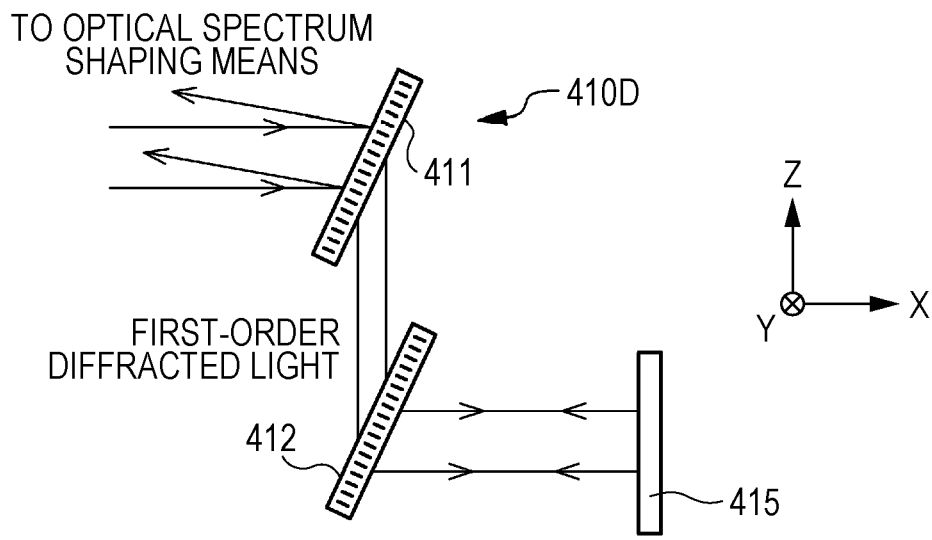
FIGS. 30A and 30B are conceptual diagrams showing a dispersion compensation optical device of Embodiment 7 and a modification of Embodiment 7.

Embodiment 7 is also a modification of Embodiment 4, and relates to the dispersion compensation optical device etc.-D. A dispersion compensation optical device 410D in Embodiment 7, the conceptual diagram of which is shown in FIG. 30A, includes the first transmission volume hologram diffraction grating 411, the second transmission volume hologram diffraction grating 412, and a reflecting mirror 415. The laser light incident on the first transmission volume hologram grating 411 is diffracted and reflected by the first transmission volume hologram grating 411, is emitted as first-order diffracted light, is further incident on the second transmission volume hologram grating 412, is diffracted and reflected by the second transmission volume hologram grating 412, is emitted as first-order diffracted light, collides with the reflecting mirror 415, and is reflected by the reflecting mirror 415. Then the laser light is incident on the second transmission volume hologram grating 412 again, is diffracted and reflected by the second transmission volume hologram grating 412, is emitted as first-order diffracted light, is further incident on the first transmission volume hologram grating 411 again, is diffracted and reflected by the first transmission volume hologram grating 411, and is emitted to the semiconductor optical amplifier 210. To cause the laser light to be emitted from the first transmission volume hologram grating 411 to the semiconductor optical amplifier 210, the angle of the reflecting mirror 415 may be slightly inclined in a direction orthogonal to the diffraction direction. That is, the reflecting mirror 415 may be slightly rotated around the z axis in FIG. 30A. Accordingly, the incident laser light and the emitted laser light can be spatially separated. In Embodiment 10 (described later), this can be applied. The group-velocity dispersion value can be controlled by changing the distance between the first transmission volume hologram diffraction grating 411 and the second transmission volume hologram diffraction grating 412 in the dispersion compensation optical device 410D. In this case, the group-velocity dispersion value is negative. The group-velocity dispersion value can be controlled by arranging light collecting means (lens) between the second transmission volume hologram diffraction grating 412 and the reflecting mirror 415, fixing the distance between the reflecting mirror 415 and the light collecting means, and changing the distance between the second transmission volume hologram diffraction grating 412 and the light collecting means.

Figure 30B:
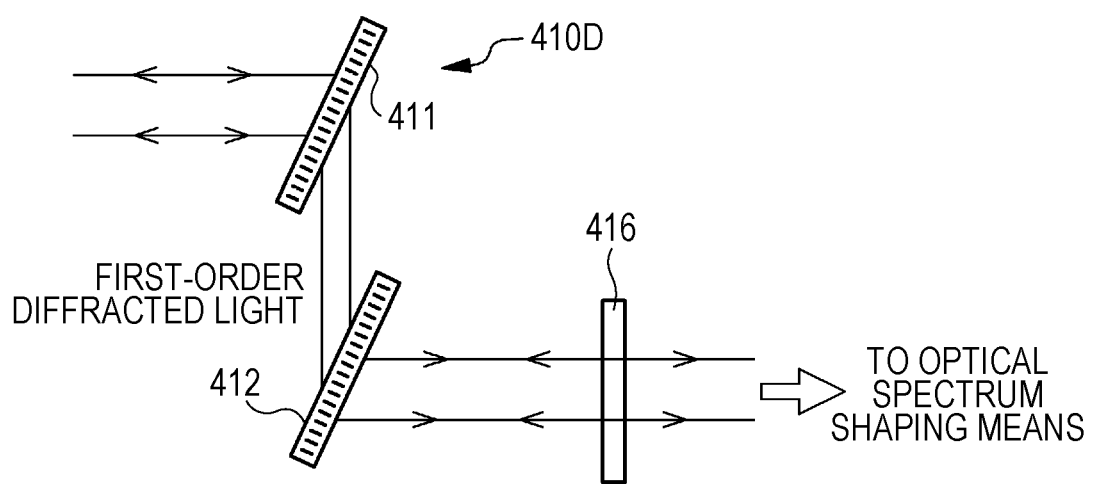

As shown in the conceptual diagram of FIG. 30B, a partially reflecting mirror 416 may be arranged instead of the reflecting mirror 415, so that the laser light incident on the first transmission volume hologram grating 411 is diffracted and reflected by the first transmission volume hologram grating 411, is emitted as first-order diffracted light, is further incident on the second transmission volume hologram grating 412, is diffracted and reflected by the second transmission volume hologram grating 412, is emitted as first-order diffracted light, collides with the partially reflecting mirror 416, part of the laser light is emitted to the semiconductor optical amplifier 210, and the residual part is reflected by the partially reflecting mirror 416. Then the laser light is incident on the second transmission volume hologram grating 412 again, is diffracted and reflected by the second transmission volume hologram grating 412, is emitted as first-order diffracted light, is further incident on the first transmission volume hologram grating 411 again, is diffracted and reflected by the first transmission volume hologram grating 411, and is fed back to the mode-locked semiconductor laser element 10. Even in this case, the dispersion compensation optical device 410D (more specifically, the partially reflecting mirror 416) and the first end surface of the mode-locked semiconductor laser element 10 form the external resonator structure, and the partially reflecting mirror 12 shown in FIG. 28 is no longer used.

Except for the above-described points, the dispersion compensation optical device in Embodiment 7 has configuration and structure similar to the dispersion compensation optical device in Embodiment 4; and hence the detailed description is omitted.

Embodiment 8

Figure 31A:
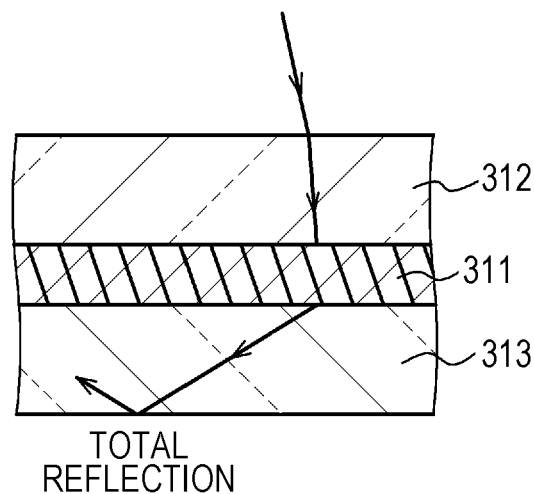
FIGS. 31A and 31B are a conceptual diagram of a dispersion compensation optical device for explaining a problem which may possibly occur in a dispersion compensation optical device, and a conceptual diagram of a dispersion compensation optical device of Embodiment 8.

Embodiment 8 is a modification of any of the Embodiment 4, Embodiment 5, and Embodiment 7. Meanwhile, the practical upper limit value of the emission angle $\phi_{out}$ of the first-order diffracted light at the first transmission volume hologram diffraction grating 411 depends on a condition that the diffracted light is emitted from the glass substrate 313 without total reflection. That is, as shown in FIG. 31A, if the diffracted light is totally reflected in the glass substrate 313, it is difficult to take the diffracted light from the first transmission volume hologram diffraction grating 411.

Figure 31B:
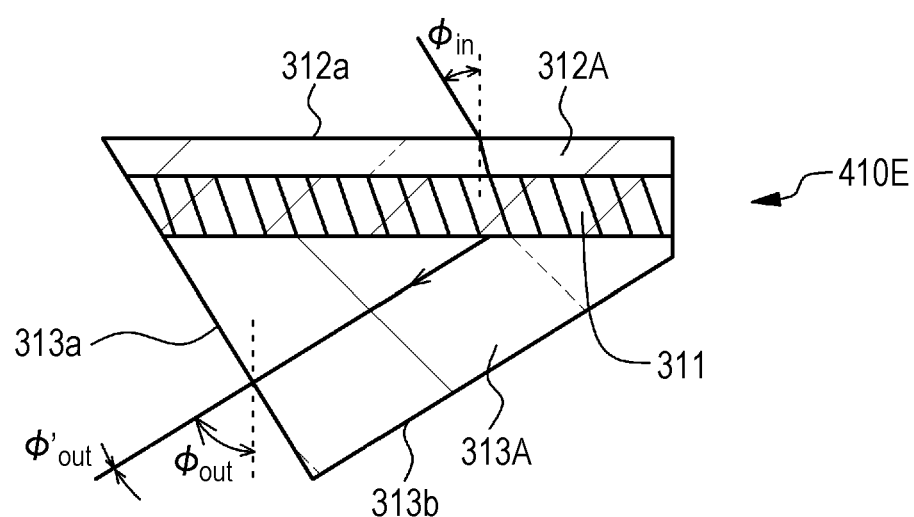

In Embodiment 8, as shown in the schematic partial cross-sectional view of FIG. 31B, an emission-side glass substrate 313A forming a transmission volume hologram diffraction grating in a dispersion compensation optical device 410E of Embodiment 8 has a prism shape with inclined surfaces 313a and 313b, and diffracted light is emitted from the inclined surface 313a of the glass substrate 313A. Accordingly, a structure in which the diffracted light is not totally reflected by the glass substrate 313A can be obtained. It is to be noted that a surface 312a of an incidence-side glass substrate 312A forming the transmission volume hologram diffraction grating is not parallel to the inclined surface 313a or 313b. The inclination angle of the inclined surface 313a is preferably set so that an emission angle $\phi_{out}'$, which is an angle formed by the normal to the inclined surface 313a and first-order diffracted light, is, for example, 0±10 degrees.

Except for the above-described points, the dispersion compensation optical device in Embodiment 8 has configuration and structure similar to the dispersion compensation optical device in any of Embodiment 4, Embodiment 5, and Embodiment 7; and hence the detailed description is omitted.

Embodiment 9

Figure 32:
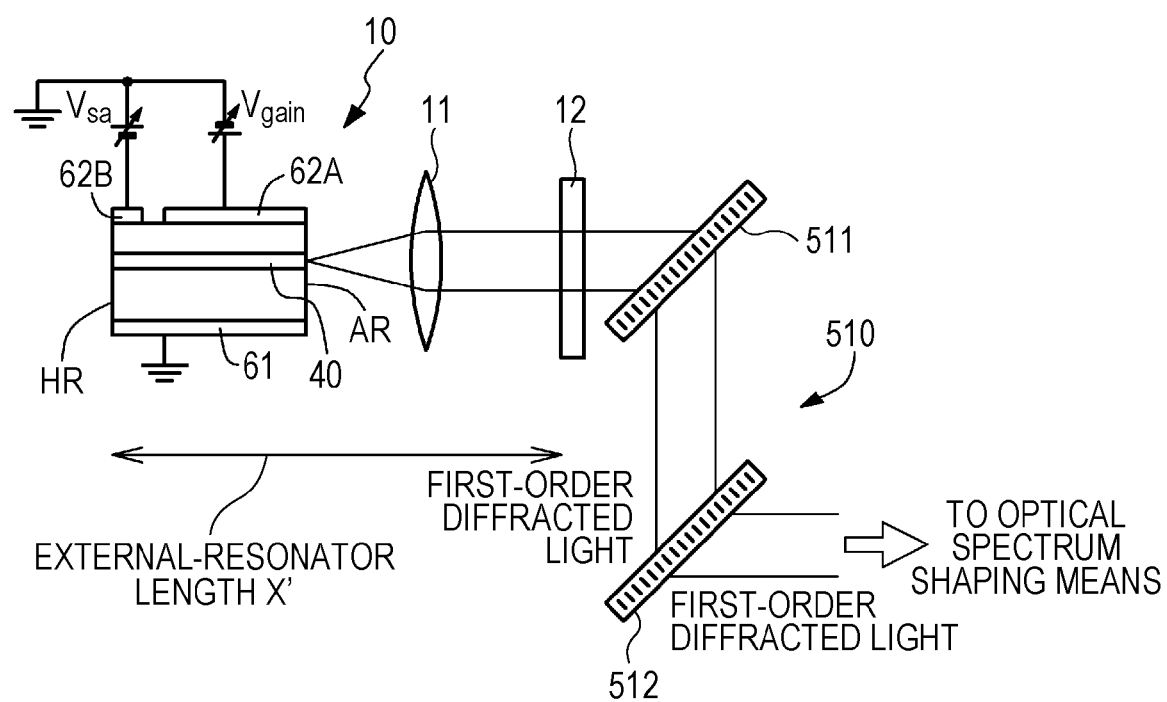
FIG. 32 is a conceptual diagram of a portion of a semiconductor-laser-device assembly of Embodiment 9.

Embodiment 9 relates to the dispersion compensation optical device according to the second form. FIG. 32 is a conceptual diagram of a portion of a semiconductor-laser-device assembly in which the dispersion compensation optical device of Embodiment 9 is installed. A dispersion compensation optical device 510 of Embodiment 9 includes two transmission volume hologram diffraction gratings (first transmission volume hologram diffraction grating 511 and second transmission volume hologram diffraction grating 512) arranged to face each other. In each of the transmission volume hologram diffraction gratings 511 and 512, the incidence angle $\phi_{in}$ of laser light is substantially equal to the emission angle $\phi_{out}$ of first-order diffracted light (specifically, equal in Embodiment 9). Also, the sum of the incidence angle $\phi_{in}$ of the laser light and the emission angle $\phi_{out}$ of the first-order diffracted light is 90 degrees. That is, $\phi_{in}=\phi_{out}=45$ degrees is established.

Except for the above-described points, the dispersion compensation optical device 510 of Embodiment 9 has configuration and structure similar to the dispersion compensation optical device 410A of Embodiment 4. Also, the dispersion compensation optical device 510 of Embodiment 9 may have configuration and structure similar to the dispersion compensation optical device in any of Embodiment 5 to Embodiment 8 except for that $\phi_{in}=\phi_{out}=45$ degrees is established. Therefore, the detailed description is omitted. The group-velocity dispersion value in the dispersion compensation optical device 510 is negative.

In the dispersion compensation optical device of Embodiment 9, the incidence angle $\phi_{in}$ of the laser light is substantially equal to the emission angle $\phi_{out}$ of the first-order diffracted light. Hence, a small dispersion compensation optical device with a high throughput by a high diffraction efficiency can be provided. Also, the dispersion compensation optical device can be decreased in size, and the degree of freedom for arrangement of optical components forming the dispersion compensation optical device is high. Further, since the diffraction angle can be designed at any angle, the degree of freedom for optical design of the dispersion compensation optical device can be increased, and the group-velocity dispersion value (dispersion compensation amount) in the dispersion compensation optical device can be easily adjusted. Accordingly, the high degree of freedom for arrangement of optical components forming the dispersion compensation optical device can be attained.

Embodiment 10

Figure 33A:
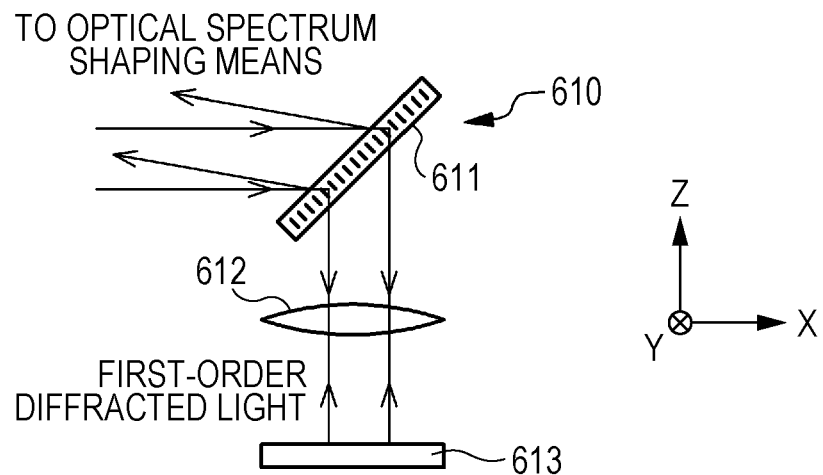
FIGS. 33A and 33B are conceptual diagrams showing a dispersion compensation optical device of Embodiment 10.

Embodiment 10 relates to the dispersion compensation optical device according to the third form. FIG. 33A shows a conceptual diagram of a dispersion compensation optical device 610 of Embodiment 10. The dispersion compensation optical device 610 of Embodiment 10 includes a transmission volume hologram diffraction grating 611 and a reflecting mirror 613, in the transmission volume hologram diffraction grating 611, the incidence angle $\phi_{in}$ of laser light is substantially equal to the emission angle $\phi_{out}$ of first-order diffracted light (specifically, being equal in Embodiment 10), and the laser light emitted from the mode-locked semiconductor laser element 10 is incident on the transmission volume hologram diffraction grating 611, is diffracted, is emitted as first-order diffracted light, collides with the reflecting mirror 613, is reflected by the reflecting mirror 613, is incident on the transmission volume hologram diffraction grating 611 again, is diffracted, and is emitted to the semiconductor optical amplifier.

Figure 33B:
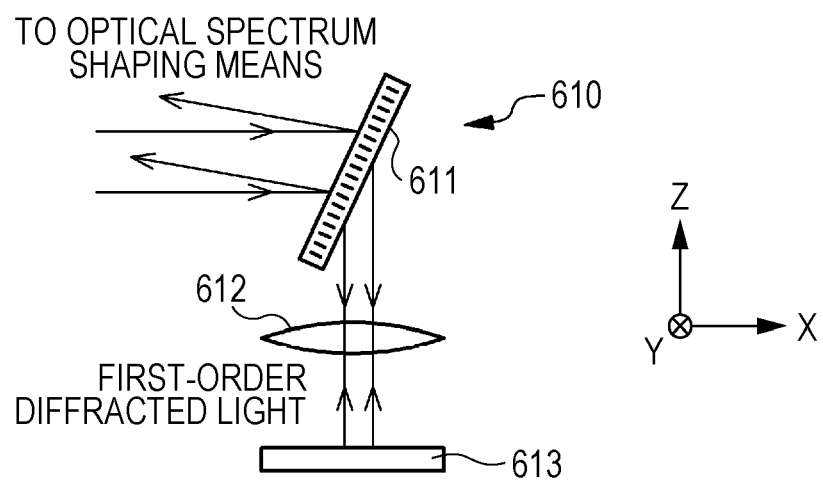

Alternatively, as shown in the conceptual diagram of FIG. 33B, the dispersion compensation optical device 610 of Embodiment 10 includes the transmission volume hologram diffraction grating 611 and the reflecting mirror 613, in the transmission volume hologram diffraction grating 611, the sum of the incidence angle $\phi_{in}$ of the laser light and the emission angle $\phi_{out}$ of the first-order diffracted light is 90 degrees, and the laser light emitted from the mode-locked semiconductor laser element 10 is incident on the transmission volume hologram diffraction grating 611, is diffracted, is emitted as first-order diffracted light, collides with the reflecting mirror 613, is reflected by the reflecting mirror 613, is incident on the transmission volume hologram diffraction grating 611 again, is diffracted, and is emitted to the semiconductor optical amplifier 210.

Also, light collecting means (lens) 612 is arranged between the transmission volume hologram diffraction grating 611 and the reflecting mirror 613. By changing the distance between the transmission volume hologram diffraction grating 611 and the reflecting mirror 613, the group-velocity dispersion value (dispersion compensation amount) is changed. Specifically, by changing the distance between the transmission volume hologram diffraction grating 611 and the light collecting means 612 while the distance between the light collecting means 612 and the reflecting mirror 613 is fixed, the group-velocity dispersion value can be changed. For example, if the distance between the transmission volume hologram diffraction grating 611 and the light collecting means 612 is equal to the focal length of the light collecting means 612, angular dispersion of laser light directed from the transmission volume hologram diffraction grating 611 to the light collecting means 612 and laser light reflected by the reflecting mirror 613 and being incident on the transmission volume hologram diffraction grating 611 through the light collecting means 612 is not changed. Hence, in this case, the dispersion compensation amount given by the dispersion compensation optical system is zero. In contrast, if the distance between the transmission volume hologram diffraction grating 611 and the light collecting means 612 is larger than the focal length of the light collecting means 612, the optical path of a long-wavelength component from among the laser light diffracted by the transmission volume hologram diffraction grating 611 becomes longer than the optical path of a short-wavelength component. In this case, negative group-velocity dispersion is formed. That is, the group-velocity dispersion value becomes negative. Also, if the distance between the transmission volume hologram diffraction grating 611 and the light collecting means 612 is smaller than the focal length of the light collecting means 612, the group-velocity dispersion value becomes positive.

In Embodiment 10, the dispersion compensation optical device 610 and the first end surface of the mode-locked semiconductor laser element 10 form the external resonator structure.

Except for the above-described points, the dispersion compensation optical device in Embodiment 10 has configuration and structure similar to the dispersion compensation optical device in Embodiment 4; and hence the detailed description is omitted.

Since the dispersion compensation optical device of Embodiment 10 includes the transmission volume hologram diffraction grating 611 and the reflecting mirror 613, a small dispersion compensation optical device having a high throughput by a high diffraction efficiency can be provided. Also, the dispersion compensation optical device can be decreased in size, and the degree of freedom for arrangement of optical components forming the dispersion compensation optical device is high. Further, since the diffraction angle can be designed at any angle, the degree of freedom for optical design of the dispersion compensation optical device can be increased, and the group-velocity dispersion value (dispersion compensation amount) in the dispersion compensation optical device can be easily adjusted. Accordingly, the high degree of freedom for arrangement of optical components forming the dispersion compensation optical device can be attained.

Embodiment 11

Embodiment 11 is a modification of any of Embodiment 1 to Embodiment 10. In Embodiment 11, the value of the optical confinement factor of the semiconductor optical amplifier forming the semiconductor-laser-device assembly is decreased. The semiconductor optical amplifier in Embodiment 11 corresponds to the semiconductor optical amplifier with the first configuration.

Figure 34:
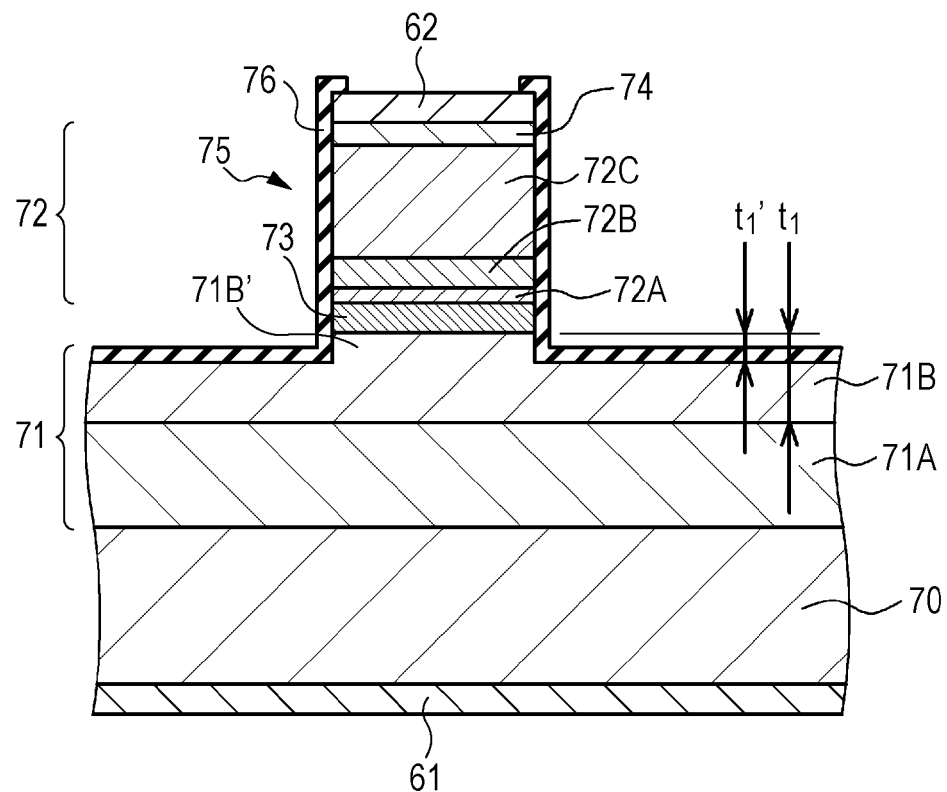
FIG. 34 is a schematic partial cross-sectional view of a semiconductor optical amplifier when the semiconductor optical amplifier is cut in an assumed plane perpendicular to the axis line of a semiconductor optical amplifier of Embodiment 11.

FIG. 34 is a schematic partial cross-sectional view of a semiconductor optical amplifier when the semiconductor optical amplifier is cut in an assumed plane perpendicular to the axis line of the semiconductor optical amplifier. As shown in FIG. 34, a layered structure body is formed by successively stacking a first compound semiconductor layer 71 having a first conductivity type, a third compound semiconductor layer (active layer, gain region) 73 made of a compound semiconductor, and a second compound semiconductor layer 72 having a second conductivity type being different from the first conductivity type, arranged successively on a base member 70. Herein, the first compound semiconductor layer 71 has a layered structure including a first cladding layer (n-type AlGaN layer) 71A and a first optical guide layer (n-type GaN layer) 71B from the base-member side. Also, an expression is satisfied as follows:

$$6 \times 10^{-7} \text{ m} < t_1,$$

or more preferably, $$8 \times 10^{-7} \text{ m} \leq t_1,$$

where $t_1$ is a thickness of the first optical guide layer 71B, and $t_1'$ is a thickness of a first optical guide layer portion 71B' forming a ridge-stripe structure 75.

Also, an expression is satisfied as follows:

$$0 \text{ (m)} < t_1' \leq 0.5 \cdot t_1,$$

or more preferably, $$0 \text{ (m)} < t_1' \leq 0.3 \cdot t_1.$$

Specifically, in Embodiment 11, expressions are given as follows:

$$t_1 = 1.25 \text{ µm, and}$$

$$t_1' = 0.15 \text{ µm.}$$

Also, the ridge-stripe structure 75 has a length and a width of 1.0 mm and 1.6 μm, respectively.

In particular, the base member 70 is made of an n-type GaN substrate, and a compound semiconductor layer is provided on a (0001) surface of the n-type GaN substrate. Also, the layered structure body including the first compound semiconductor layer 71, the active layer 73, and the second compound semiconductor layer 72 is made of a GaN-based compound semiconductor and more particularly an AlGaInN-based compound semiconductor, and more specifically, the layered structure body has a layer configuration shown in Table 6. Herein, in Table 6, a compound semiconductor layer located at the lower side is a layer close to the base member 70. A compound semiconductor forming a quantum well layer in the active layer 73 has a band gap of 3.06 eV. The active layer 73 has a quantum well structure including a quantum well layer and a barrier layer. The barrier layer has an impurity (specifically, silicon (Si)) with a doping concentration of preferably in a range from $2 \times 10^{17}$ $cm^{-3}$ to $1 \times 10^{20}$ $cm^{-3}$. Also, a layered insulating film 76 made of $SiO_2$/Si is formed on both sides of the ridge-stripe structure 75. The $SiO_2$ layer is a lower layer and the Si layer is an upper layer. Also, the second electrode (p-side ohmic electrode) 62 is formed on a p-type GaN contact layer 74 corresponding to the top surface of the ridge-stripe structure 75. In contrast, the first electrode (n-side ohmic electrode) 61 made of Ti/Pt/Au is formed on the back surface of the base member 70. In Embodiment 11, the second electrode 62 is formed of a Pd monolayer with a thickness of 0.1 μm. The p-type AlGaN electronic barrier layer 72A has a thickness of 10 nm, the second optical guide layer (p-type AlGaN layer) 72B has a thickness of 50 nm, the second cladding layer (p-type AlGaN layer) 72C has a thickness of 0.5 μm, and the p-type GaN contact layer 74 has a thickness of 100 nm. Further, Mg is doped in the p-type AlGaN electronic barrier layer 72A, the second optical guide layer 72B, the second cladding layer 72C, and the p-type GaN contact layer 74 forming the second compound semiconductor layer 72, by $1 \times 10^{19}$ $cm^{-3}$ or more (specifically, $2 \times 10^{19}$ $cm^{-3}$). Meanwhile, the first cladding layer (n-type AlGaN) 71A has a thickness of 2.5 μm. The optical guide layer (n-type GaN layer) 71B has the above-described thickness. The thickness of the first optical guide layer 71B (1.25 μm) is larger than the thickness of the second optical guide layer 72B (100 nm). Also, while the first optical guide layer 71B is made of GaN, alternatively, the first optical guide layer 71B may be made of a compound semiconductor having a larger band gap than the active layer 73 and having a smaller band gap than the first cladding layer 71A.

[Table 6]

Second compound semiconductor layer 72 p-type GaN contact layer (Mg doped) 74

Second cladding layer (p-type $Al_{0.05}Ga_{0.95}N$ layer (Mg doped)) 72C

Second optical guide layer (p-type $Al_{0.01}Ga_{0.99}N$ layer (Mg doped)) 72B p-type $Al_{0.20}Ga_{0.80}N$ electronic barrier layer (Mg doped) 72A Active layer 73

GaInN quantum well active layer 73

(Quantum well layer: $Ga_{0.92}In_{0.08}N$/barrier layer: $Ga_{0.98}In_{0.02}N$)

First compound semiconductor layer 71

First optical guide layer (n-type GaN layer) 71B

First cladding layer (n-type $Al_{0.03}Ga_{0.97}N$ layer) 71A where

Quantum layers (two layers): 10 nm [non-doped]

Barrier layers (three layers): 12 nm [doping density (Si): $2 \times 10^{18}$ $cm^{-3}$]

With the semiconductor optical amplifier of Embodiment 11, since the thickness $t_1$ of the first optical guide layer is determined, the optical confinement factor can be decreased. Also, since the peak of the optical-field intensity distribution is shifted from the active layer to the first optical guide layer, the light density at a position near the active layer can be decreased during high-output operation. An optical damage can be prevented, and the high output can be obtained. In addition, in Embodiment 11, since the thickness $t_1'$ of the portion of the first optical guide layer forming the ridge-stripe structure is determined, a light beam to be output can become a single-mode light beam. Also, since the width of a slab waveguide is substantially equal to the thickness of the first optical guide layer, a light beam cross-sectional shape approximate to the perfect circle can be obtained. A problem, in which the light collecting characteristic is decreased in application with use of a lens or an optical fiber, does not occur.

Embodiment 12

Figure 35:
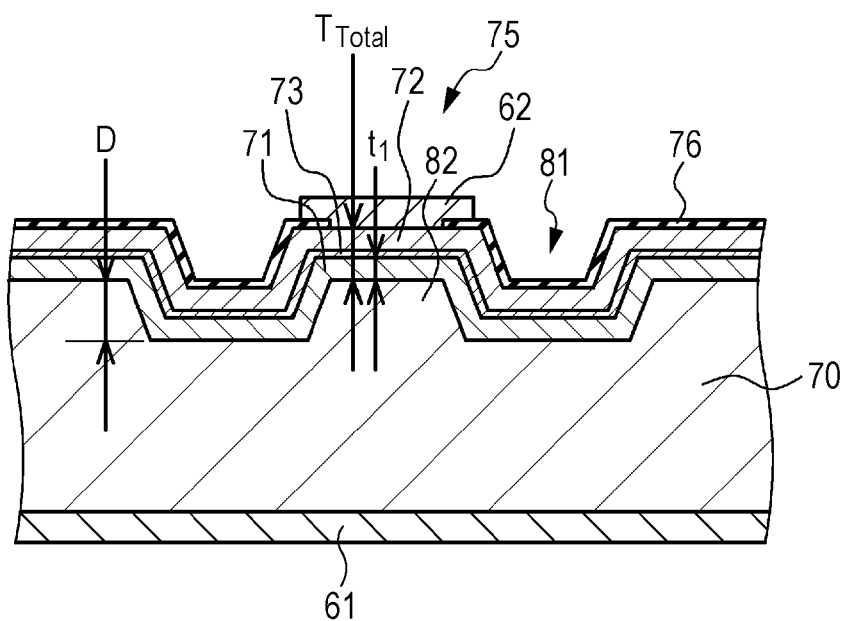
FIG. 35 is a schematic partial cross-sectional view of a semiconductor optical amplifier when the semiconductor optical amplifier is cut in an assumed plane perpendicular to the axis line of a semiconductor optical amplifier of Embodiment 12.

Embodiment 12 is a modification of the semiconductor optical amplifier of Embodiment 11. FIG. 35 is a schematic partial cross-sectional view of a semiconductor optical amplifier when the semiconductor optical amplifier is cut in an assumed plane perpendicular to the axis line of the semiconductor optical amplifier of Embodiment 12. As shown in FIG. 35, two recesses 81 extending along the axial direction of the semiconductor optical amplifier are formed in the base member 70. Also, the layered structure body described in Embodiment 11 is formed on the entire surface, that is, on the two recesses 81 and a region 82 of the base member 70 arranged between the two recesses 81. Further, the second electrode 62 is provided above the region 82 of the base member 70.

Herein, the first compound semiconductor layer 71 has a layered structure including a first cladding layer and a first optical guide layer arranged from the base-member side.

An expression is satisfied as follows:

$$6 \times 10^{-7} \, m < t_1,$$

or more preferably, $$8 \times 10^{-7} \, m \le t_1,$$

where $t_1$ is a thickness of the first optical guide layer above the region 82 of the base member 70 arranged between the two recesses 81, $T_{Total}$ is the total thickness of the layered structure body, and D is a depth of each recess 81.

Also, an expression is satisfied as follows:

$$(T_{Total} - 0.5 \cdot t_1) \le D \le T_{Total},$$

or more preferably, $$(T_{Total} - 0.3 \cdot t_1) \le D \le T_{Total}.$$

Specifically, in Embodiment 12, expressions are given as follows:

$$t_1 = 1.25 \, \mu m,$$

$$T_{Total} = 4.1 \, \mu m, \text{ and}$$

$$D = 3.7 \, \mu m.$$

Also, each recess 81 has a width of 20 μm, and the width of the region 82 of the base member 70 arranged between the two recesses 81 is 1.5 μm.

Except for the above-described points, the semiconductor optical amplifier in Embodiment 12 has configuration and structure similar to the semiconductor optical amplifier in Embodiment 11; and hence the detailed description is omitted.

In the semiconductor optical amplifier of Embodiment 12, since the thickness $t_1$ of the first optical guide layer above the region of the base member arranged between the two recesses (that is, a portion of the base member located between the recesses) is determined, the light density at a position near the active layer can be decreased during high-output operation. Not only an optical damage can be prevented, but also the saturated energy of the amplified laser light is increased, and the high output can be obtained. In addition, in the semiconductor optical amplifier of Embodiment 12, since the depth D of the recess is determined, a light beam to be output can become a single-mode light beam. Also, since the width of the slab waveguide is substantially equal to the thickness of the first optical guide layer, a light beam cross-sectional shape approximate to the perfect circle can be obtained. A problem, in which the light collecting characteristic is decreased in application with use of a lens or an optical fiber, does not occur.

Embodiment 13

Figure 36:
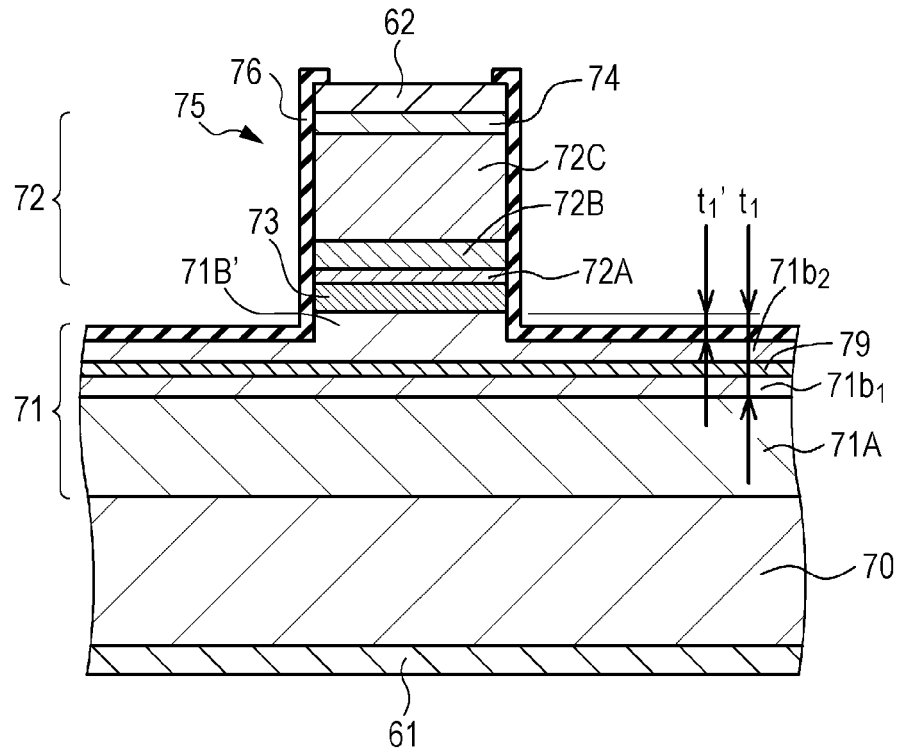
FIG. 36 is a schematic partial cross-sectional view of a semiconductor optical amplifier when the semiconductor optical amplifier is cut in an assumed plane perpendicular to the axis line of a semiconductor optical amplifier of Embodiment 13.

Embodiment 13 is a modification of any of Embodiment 11 and Embodiment 12. FIG. 36 is a schematic partial cross-sectional view. As shown in FIG. 36, in a semiconductor optical amplifier of Embodiment 13, the first semiconductor optical amplifier 71 has a layered structure including the first cladding layer 71A and first optical guide layers $71b_1$ and $71b_2$ arranged from the base-member-70 side. A high-refractive-index layer 79 is formed between the first optical guide layers $71b_1$ and $71b_2$. The high-refractive-index layer 79 is made of a compound semiconductor material having a higher refractive index than the refractive index of the compound semiconductor material forming the first compound semiconductor layer 71. Specifically, the high-refractive-index layer 79 is made of $In_{0.02}Ga_{0.98}N$ with a thickness of 50 nm. It is assumed that the distance from the interface between the active layer 73 and the upper-layer first optical guide layer $71b_2$ to the interface between the upper-layer first optical guide layer $71b_2$ and the high-refractive-index layer 79 is 0.35 μm. Herein, an expression is satisfied as follows:

$$0.01 \leq n_{HR} - n_{G-1} \leq 0.1,$$

where $n_{G-1}$ is a refractive index of the compound semiconductor layer material forming the first optical guide layers $71b_1$ and $71b_2$, $n_{HR}$ is a refractive index of the compound semiconductor layer forming the high-refractive-index layer 79, and $n_{Ac}$ is an average refractive index of the compound semiconductor material forming the active layer 73.

Also, an expression is satisfied as follows:

$$n_{HR} \leq n_{Ac}.$$

Specifically, expressions are given as follows:

$$n_{HR} = 2.547,$$

$$n_{G-1} = 2.520, \text{ and}$$

$$n_{Ac} = 2.620.$$

Embodiment 14

Embodiment 14 is also a modification of any of Embodiment 1 and Embodiment 10. In Embodiment 14, the value of the optical confinement factor of the semiconductor optical amplifier forming the semiconductor-laser-device assembly is decreased. The semiconductor optical amplifier in Embodiment 14 corresponds to the semiconductor optical amplifier with the second configuration.

Figure 37:
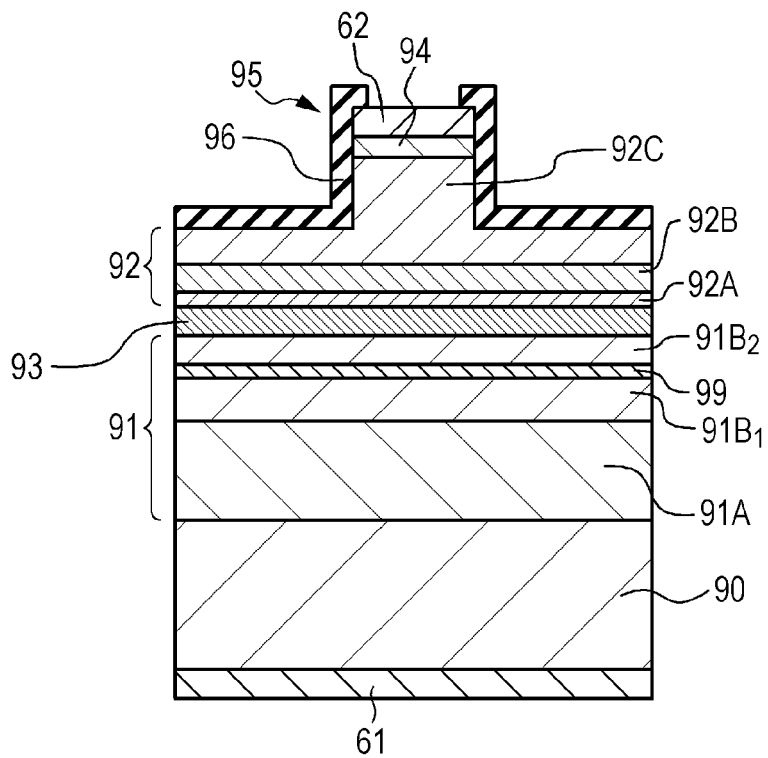
FIG. 37 is a schematic partial cross-sectional view of a semiconductor optical amplifier when the semiconductor optical amplifier is cut in an assumed plane perpendicular to the axis line of a semiconductor optical amplifier of Embodiment 14.

FIG. 37 is a schematic partial cross-sectional view. As shown in FIG. 37, in the semiconductor optical amplifier of Embodiment 14, a layered structure body has a ridge-stripe structure 95 formed of at least a portion in the thickness direction of the second compound semiconductor layer; a first compound semiconductor layer 91 has a thickness larger than 0.6 μm; and a high-refractive-index layer 99 is formed in the first compound semiconductor layer 91, the high-refractive-index layer 99 made of a compound semiconductor having a higher refractive index than the refractive index of the compound semiconductor material forming the first compound semiconductor layer 91. Specifically, the first compound semiconductor layer 91 has a layered structure including a first cladding layer 91A and a first optical guide layer 91B from the base-member side. The optical guide layer 91B has a thickness larger than 0.6 μm, and the high-refractive-index layer 99 is formed in the first optical guide layer 91B. Herein, the first optical guide layer 91B has a configuration in which a first portion (first-A optical guide layer $91B_1$), the high-refractive-index layer 99, and a second portion (first-B optical guide layer $91B_2$) are stacked.

It is assumed that the total thickness of the first optical guide layer 91B including the high-refractive-index layer 99 is 1.25 μm. Also, the distance from the interface between an active layer 93 and the first optical guide layer 91B (the interface between the active layer 93 and the first-B optical guide layer $91B_2$) to the interface between a portion of the first optical guide layer 91B located at the active-layer side (first-B optical guide layer $91B_2$) and the high-refractive-index layer 99 is 0.25 μm or larger, or specifically, 0.35 μm in Embodiment 14. That is, the first-B optical guide layer $91B_2$ has a thickness of 0.35 The high-refractive-index layer 99 is made of $In_{0.02}Ga_{0.98}N$ with a thickness of 50 nm. An expression is satisfied as follows:

$$0 < n_{HR} - n_{G-1} \leq 0.3,$$

or more preferably, $$0.02 \leq n_{HR} - n_{G-1} \leq 0.2,$$

where $n_{G-1}$ is a refractive index of the compound semiconductor layer material forming the first optical guide layers $91B_1$ and $91B_2$, $n_{HR}$ is a refractive index of the compound semiconductor layer forming the high-refractive-index layer 99, and $n_{Ac}$ is an average refractive index of the compound semiconductor material forming the active layer 93.

Also, an expression is satisfied as follows:

$$n_{HR} \leq n_{Ac}.$$

Specifically, expressions are given as follows:

$$n_{HR}=2.547,$$

$$n_{G-1}=2.520, \text{ and}$$

$$n_{Ac}=2.620.$$

Also, the ridge-stripe structure 95 has a length and a width of 1.0 mm and 1.6 µm, respectively. The semiconductor optical amplifier outputs a single-mode light beam.

In particular, a base member 90 is made of an n-type GaN substrate, and a compound semiconductor layer is provided on a (0001) surface of the n-type GaN substrate. Also, the layered structure body including the first compound semiconductor layer 91, the active layer 93, and the second compound semiconductor layer 92 is made of a GaN-based compound semiconductor, or more particularly, an AlGaInN-based compound semiconductor, and specifically, the layered structure body has a layer configuration shown in Table 7. Herein, in Table 7, a compound semiconductor layer located at the lower side is a layer close to the base member 90. A compound semiconductor forming a quantum well layer in the active layer 93 has a band gap of 3.06 eV. The active layer 93 has a quantum well structure including a quantum well layer and a barrier layer. The barrier layer has an impurity (specifically, silicon (Si)) with a doping concentration of preferably in a range from $2\times10^{17}$ cm$^{-3}$ to $1\times10^{20}$ cm$^{-3}$. Also, a layered insulating film 96 made of SiO$_2$/Si is formed on both sides of the ridge-stripe structure 95. The SiO$_2$ layer is a lower layer and the Si layer is an upper layer. Also, the second electrode (p-side ohmic electrode) 62 is formed on the p-type GaN contact layer 94 corresponding to the top surface of the ridge-stripe structure 95. In contrast, the first electrode (n-side ohmic electrode) 61 made of Ti/Pt/Au is formed on the back surface of the base member 90. In Embodiment 14, the second electrode 62 is formed of a Pd monolayer with a thickness of 0.1 The p-type AlGaN electronic barrier layer 92A has a thickness of 10 nm, the second optical guide layer (p-type AlGaN layer) 92B has a thickness of 50 nm, the second cladding layer (p-type AlGaN layer) 92C has a thickness of 0.5 µm, and the p-type GaN contact layer 94 has a thickness of about 100 nm. Further, Mg is doped in the p-type AlGaN electronic barrier layer 92A, the second optical guide layer 92B, the second cladding layer 92C, and the p-type GaN contact layer 94 forming the second compound semiconductor layer 92, by $1\times10^{19}$ cm$^{-3}$ or more (specifically, $2\times10^{19}$ cm$^{-3}$). Meanwhile, the first cladding layer (n-type AlGaN) 91A has a thickness of 2.5 µm. The total thickness of the first optical guide layer (n-type GaN layer) 91B including the high-refractive-index layer 99 is 1.25 µm as described above, and the total thickness of the first optical guide layer 91B (1.25 µm) is larger than the thickness of the second optical guide layer 92B (100 nm). Also, while the first optical guide layer 91B is made of GaN, alternatively, the first optical guide layer 91B may be made of a compound semiconductor having a larger band gap than the active layer 93 and having a smaller band gap than the first cladding layer 91A.

[Table 7]
Second compound semiconductor layer 92
p-type GaN contact layer (Mg doped) 94
Second cladding layer (p-type Al$_{0.05}$Ga$_{0.95}$N layer (Mg doped)) 92C
Second optical guide layer (p-type Al$_{0.01}$Ga$_{0.99}$N layer (Mg doped)) 92B
p-type Al$_{0.20}$Ga$_{0.80}$N electronic barrier layer (Mg doped) 92A
Active layer 93
GaInN quantum well active layer 93
(Quantum well layer: Ga$_{0.92}$In$_{0.08}$N/barrier layer: Ga$_{0.98}$In$_{0.02}$N)
First compound semiconductor layer 91
First-B optical guide layer (n-type GaN layer) 91B$_2$
High-refractive-index layer (n-type In$_{0.02}$Ga$_{0.98}$N high-refractive-index layer) 99
First-A optical guide layer (n-type GaN layer) 91B$_1$
First cladding layer (n-type Al$_{0.03}$Ga$_{0.97}$N layer) 91A
where
Quantum layers (two layers): 10 nm [non-doped]
Barrier layers (three layers): 12 nm [doping density (Si): $2\times10^{18}$ cm$^{-3}$]

Figure 38:
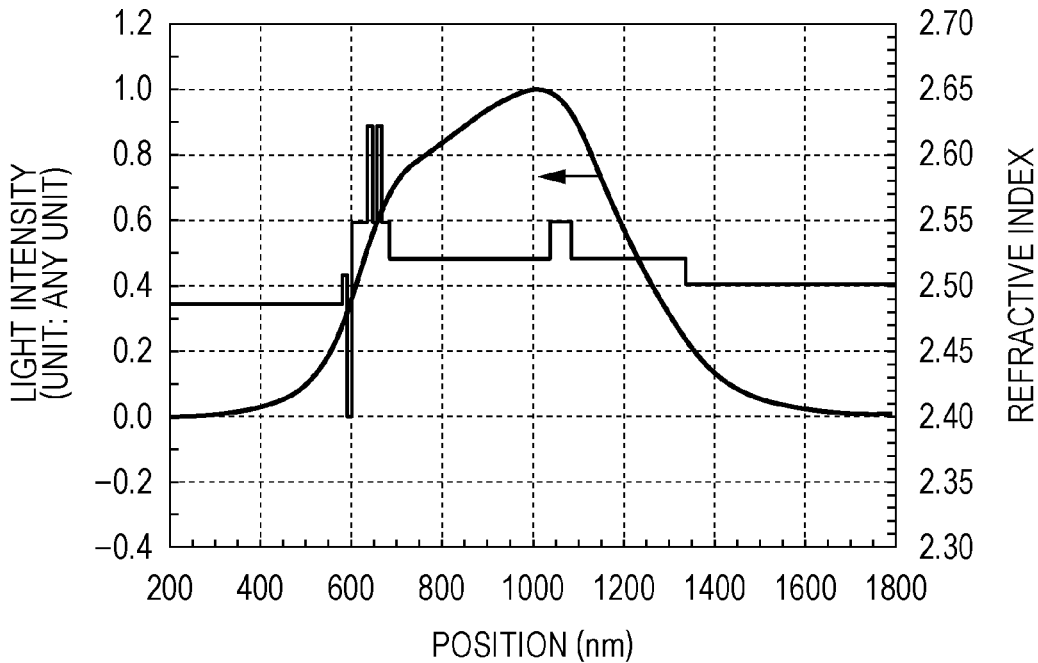
FIG. 38 is a graph showing a result of calculation of a refractive-index distribution and an optical-field intensity profile in a layered structure body forming the semiconductor optical amplifier of Embodiment 14.
Figure 39:
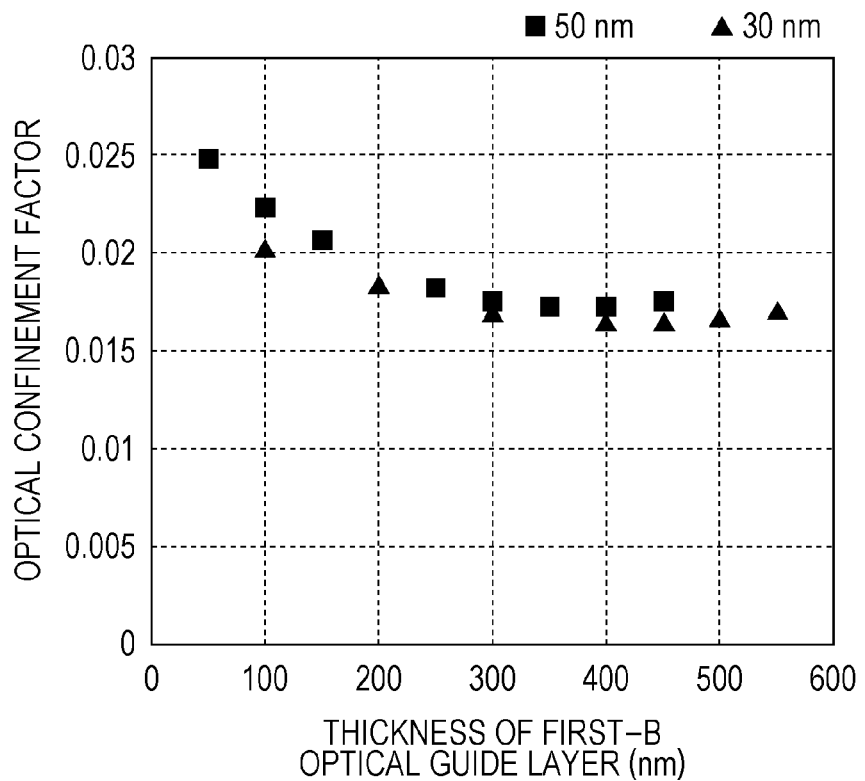
FIG. 39 is a graph showing a result when an optical confinement factor is obtained when the thickness of a high-refractive-index layer is 30 nm and 50 nm, and the thickness of a first-B optical guide layer is changed in Embodiment 14.

FIG. 38 shows a result of calculation of a refractive-index distribution and an optical-field intensity profile of the second cladding layer 92C, the second optical guide layer 92B, the p-type AlGaN electronic barrier layer 92A, the active layer 93, the first-B optical guide layer 91B$_2$, the high-refractive-index layer 99, the first-A optical guide layer 91B$_1$, and the first cladding layer 91A. Because of the presence of the high-refractive-index layer 99, the optical-field intensity is shifted toward the first-cladding-layer-91A side. The horizontal axis in FIG. 38 plots the distance from the interface between the p-type GaN contact layer (Mg doped) 94 and the second electrode 62. Also, FIG. 39 shows a result when an optical confinement factor is calculated when the thickness of the first-B optical guide layer 91B$_2$ is changed based on that the thickness of the high-refractive-index layer 99 is 30 nm and 50 nm. Referring to FIG. 39, if the thickness of the first-B optical guide layer 91B$_2$ is 0.25 µm or larger, a low optical confinement factor can be attained. Also, as the result of various analysis, it is found that the thickness of the high-refractive-index layer 99 is preferably 50 nm or smaller to reliably prevent a light beam output from the semiconductor optical amplifier from becoming a multi-beam. Also, it is found that the percentage of In atoms in the high-refractive-index layer 99 made of InGaN is preferably less than 5% to reliably prevent a light beam output from the semiconductor optical amplifier from becoming a multi-beam.

In Embodiment 14, the high-refractive-index layer is provided in the first optical guide layer; however, the high-refractive-index layer may be occasionally provided on the first cladding layer. In this case, the refractive index of the compound semiconductor material forming the high-refractive-index layer is higher than the refractive index of the compound semiconductor material forming the first cladding layer.

Embodiment 15

Embodiment 15 is a modification of the mode-locked semiconductor laser element described in any of Embodiment 1 to Embodiment 14, and relates to the mode-locked semiconductor laser element with the third configuration. In Embodiment 1, the mode-locked semiconductor laser element 10 is provided on the C surface, which is the (0001) surface of the n-type GaN substrate 21 of a crystal face having a polarity. Meanwhile, if such a substrate is used, it may be occasionally difficult to electrically control saturable absorption because of quantum-confined Stark effect (QCSE) by an internal field caused by piezoelectric polarization and spontaneous polarization at the third compound semiconductor layer (active layer) 40. That is, in some cases, it may be desirable to increase the value of the direct current which flows to the first electrode and the value of the reverse bias voltage which is applied to the saturable absorption region, to obtain self pulsation operation and mode-locking operation. Also, it is found that a sub-pulse component accompanied by a main pulse may be generated, and it may be difficult to have synchronization between an external signal and an optical pulse.

To prevent such phenomena from occurring, it is found that the thickness of the quantum well layer forming the third compound semiconductor layer (active layer) 40 is preferably optimized, and the impurity doping density in the barrier layer forming the third compound semiconductor layer 40 is preferably optimized.

Specifically, the thickness of the quantum well layer forming the GaInN quantum well active layer is preferably in a range from 1 nm to 10.0 nm, or more preferably, in a range from 1 nm to 8 nm. By decreasing the thickness of the quantum well layer, the influence of piezoelectric polarization and spontaneous polarization can be reduced. Also, the impurity doping concentration of the barrier layer is preferably in a range from $2 \times 10^{18}$ cm$^{-3}$ to $1 \times 10^{20}$ cm$^{-3}$, or more preferably, in a range from $1 \times 10^{19}$ cm$^{-3}$ to $1 \times 10^{20}$ cm$^{-3}$. Herein, the impurity may be silicon (Si) or oxygen (O). Since the impurity doping density of the barrier layer is such a density, the carrier of the active layer can be increased, and the influence of piezoelectric polarization and spontaneous polarization can be reduced.

In Embodiment 15, the third compound semiconductor layer (active layer) 40 including a GaInN quantum well active layer made of three barrier layers (made of $Ga_{0.98}In_{0.02}N$) and two quantum well layers ($Ga_{0.92}In_{0.08}N$) with the layer configuration shown in Table 3 has a configuration as shown in Table 8. Also, in a mode-locked semiconductor laser element in Reference Example 15, the configuration of the third compound semiconductor layer 40 with the layer configuration shown in Table 3 is as shown in Table 8.

TABLE 8

|  | Embodiment 15 | Reference Example 15 |
|---|---|---|
| Quantum well layer | 8 nm | 10.5 nm |
| Barrier layer | 12 nm | 14 nm |
| Impurity doping density of quantum well layer | Non-doped | Non-doped |
| Impurity doping density of barrier layer | Si: $2 \times 10^{18}$ cm$^{-3}$ | Non-doped |

In Embodiment 15, the quantum well layer has a thickness of 8 nm, Si is doped in the barrier layer by $2 \times 10^{18}$ cm$^{-3}$, and hence QCSE effect in the active layer is reduced. In contrast, in Reference Example 15, the quantum well layer has a thickness of 10.5 nm, and an impurity is not doped in the barrier layer.

Mode-locking is determined by the direct current applied to the emitting region and the reverse bias voltage $V_{sa}$ applied to the saturable absorption region, like Embodiment 1. Reverse bias voltage dependence of the relationship between injection current and light output of Embodiment 15 and Reference Example 15 is measured. Consequently, in Reference Example 15, as the reverse bias voltage $V_{sa}$ is increased, the threshold current with which laser oscillation is started gradually increases, and further, a change is generated with a lower reverse bias voltage $V_{sa}$ than that of Embodiment 15. This suggests that, in the active layer in Embodiment 15, the effect of the saturable absorption region is electrically controlled by the reverse bias voltage $V_{sa}$. Even in Reference Example 15, self pulsation operation and mode-locking (mode-lock) operation of a single mode (single fundamental transverse mode) are recognized while a reverse bias is applied to the saturable absorption region. Of course, Reference Example 15 is included in the present disclosure.

The preferable embodiments of the present disclosure are described, however, the present disclosure is not limited to the embodiments. The configurations and structures of the semiconductor-laser-device assembly, the semiconductor optical amplifier, the mode-locked semiconductor laser element, the dispersion compensation optical system, and the dispersion compensation optical device are mere examples, and may be properly modified. Also, while the embodiments provide various values, these values are also mere examples. For example, if the specifications of the mode-locked semiconductor laser element and the semiconductor optical amplifier to be used are changed, the values may be changed accordingly. For example, the axis lines of the mode-locked semiconductor laser element and the semiconductor optical amplifier may intersect with the axis line of the ridge-stripe structure at a predetermined angle, or the plan shape of the ridge-stripe structure may be tapered.

Figure 40:
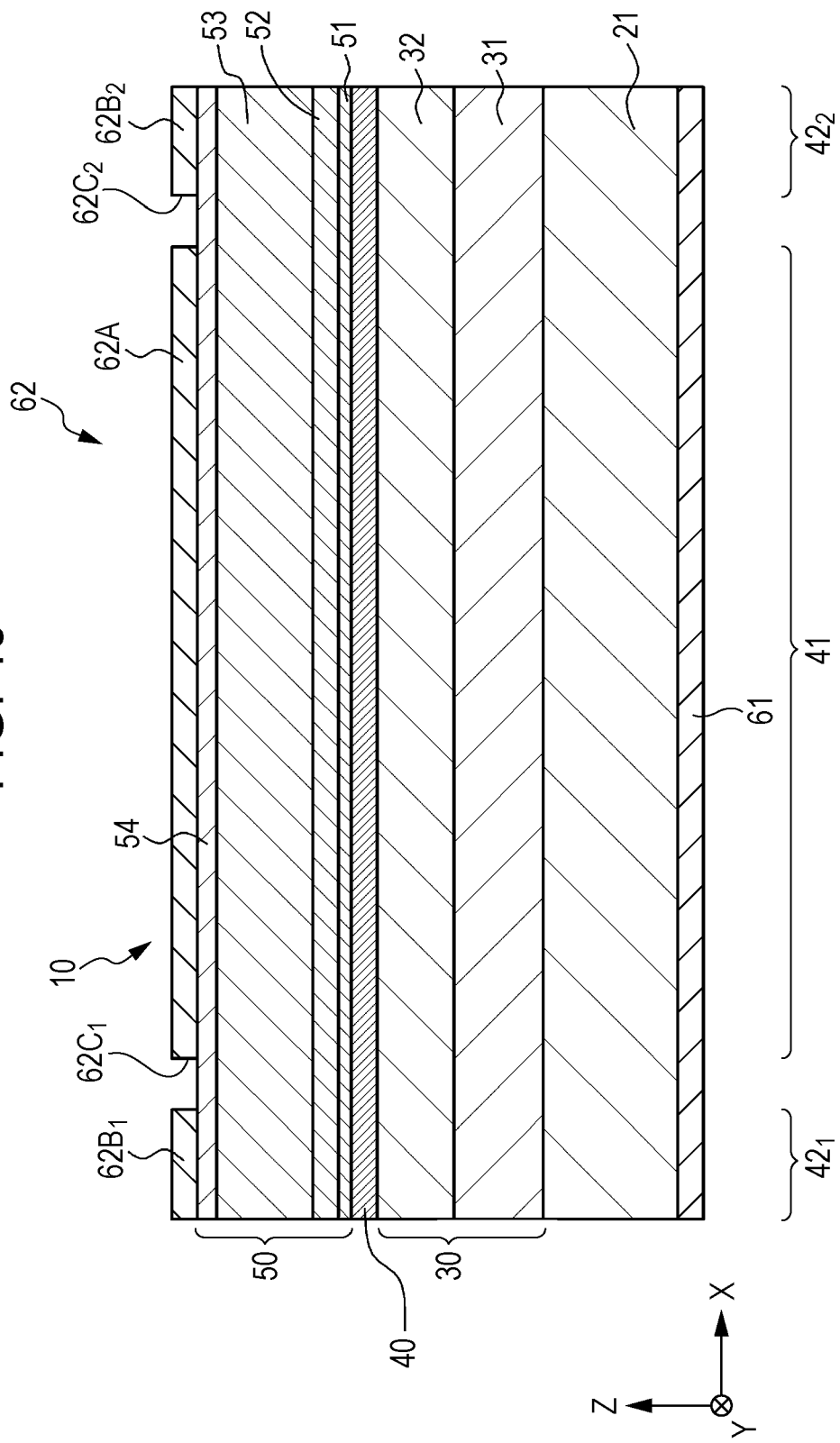
FIG. 40 is a schematic end view along an extending direction of a resonator of a modification of the mode-locked semiconductor laser element of Embodiment 1.
Figure 41:
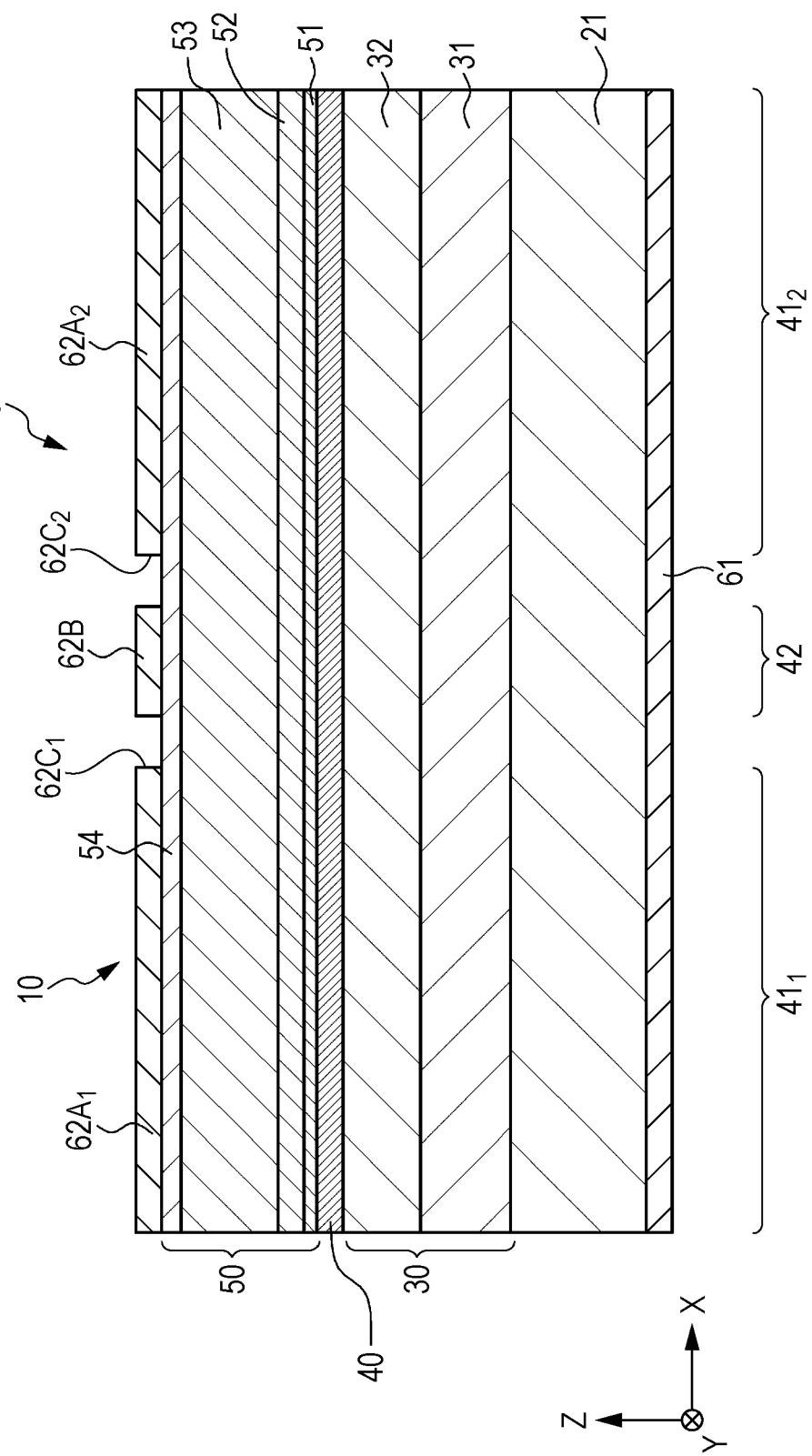
FIG. 41 is a schematic end view along an extending direction of a resonator of another modification of the mode-locked semiconductor laser element of Embodiment 1.

The number of emitting region 41 and the number of saturable absorption region 42 are not limited to 1. FIGS. 40 and 41 show schematic end views of mode-locked semiconductor laser elements (multi-section (multi-electrode) mode-locked semiconductor laser elements). FIG. 40 is a schematic end view of a mode-locked semiconductor laser element in which one end of the single first portion 62A faces the one second portion 62B$_1$ through one separating groove 62C$_1$, and the other end of the first portion 62A faces the other second portion 62B$_2$ through the other separating groove 62C$_2$. Also, the first emitting region 41 is arranged between two saturable absorption regions (42$_1$ and 42$_2$). Alternatively, FIG. 41 is a schematic end view of a mode-locked semiconductor laser element in which two first portions 62A$_1$ and 62A$_2$ of the second electrode and the single second portion 62B of the second electrode are provided. In the mode-locked semiconductor laser element, one end of the second portion 62B faces the one first portion 62A$_1$ through the one separation groove 62C$_1$, and the other end of the second portion 62B faces the other first portion 62A$_2$ through the other separation groove 62C$_2$. Also, the first saturable absorption region 42 is arranged between two saturable absorption regions 41$_1$ and 41$_2$.

Figure 42:
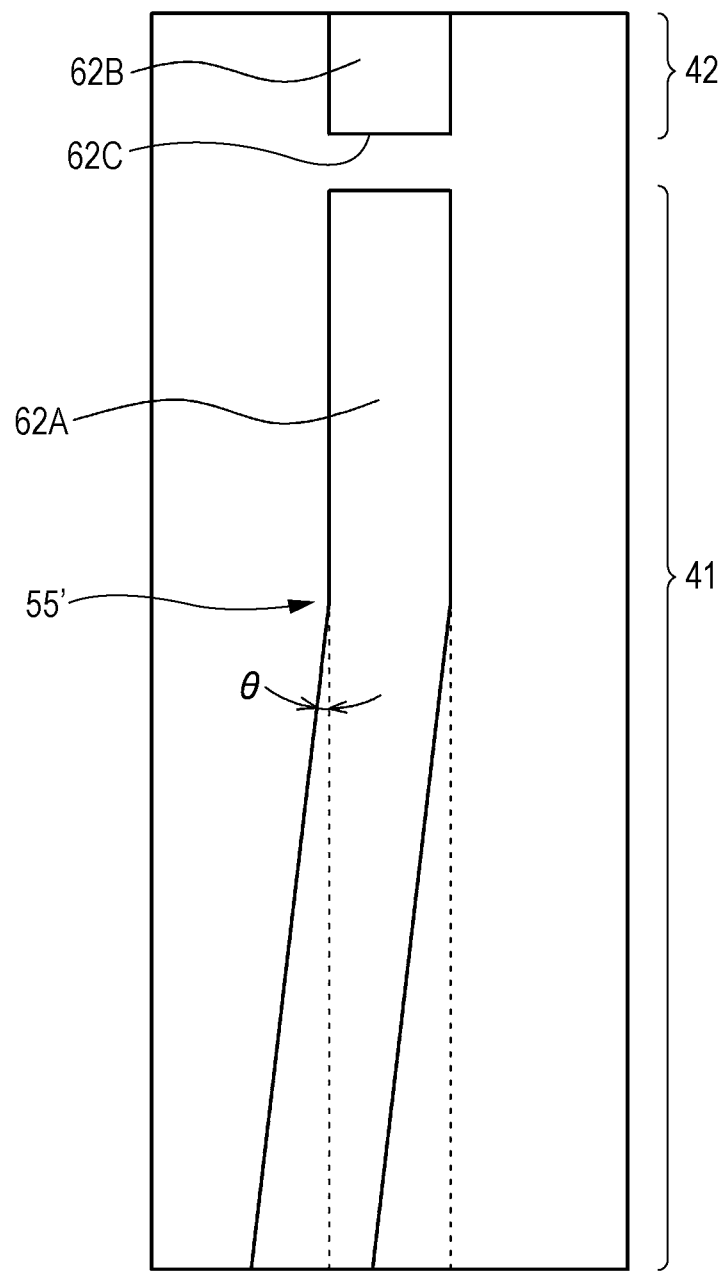
FIG. 42 is a schematic illustration of an upper side of a ridge-stripe structure according to still another modification of the mode-locked semiconductor laser element of Embodiment 1.

The mode-locked semiconductor laser element may be a semiconductor laser element having an inclined ridge-stripe separate confinement hetero structure. FIG. 42 is a schematic illustration of an upper side of a ridge-stripe structure 55' in such a mode-locked semiconductor laser element. The mode-locked semiconductor laser element preferably has a structure in which two straight-line-shaped ridge-stripe structures are combined and preferably has a value of an angle θ at which the two ridge-stripe structures intersect with each other as follows:

0<θ≤10(degrees), or more preferably,

0<θ≤6 (degrees).

Since the inclined ridge-stripe structure is employed, the reflectivity of the second end surface applied with non-reflection coating can become close to the ideal value of 0%. Consequently, generation of laser light that circulates in the mode-locked semiconductor laser element can be prevented, and generation of incidental laser light accompanied by main laser light can be restricted.

In the embodiment, the mode-locked semiconductor laser element and the semiconductor optical amplifier are provided on the C surface being the {0001} surface, which is a polar surface of the n-type GaN substrate. Alternatively, the mode-locked semiconductor laser element and the semiconductor optical amplifier may be provided on an A surface being a {11-20} surface, an M surface being a {1-100} surface, a {1-102} surface, each of which is a non-polar surface; or a {11-2n} surface including a {11-24} surface and a {11-22} surface, a {10-11} surface, and a {10-12} surface being a semi-polar surface. Accordingly, even if piezoelectric polarization and spontaneous polarization are generated in the third compound semiconductor layer (active layer) of the mode-locked semiconductor laser element and the semiconductor optical amplifier, piezoelectric polarization is not generated in the thickness direction of the third compound semiconductor layer, but piezoelectric polarization is generated in the direction orthogonal to the thickness direction of the third compound semiconductor layer. Hence, defective influence caused by piezoelectric polarization and spontaneous polarization can be eliminated. It is to be noted that the {11-2n} surface represents a non-polar surface at substantially 40 degrees with respect to the C surface. Also, if the mode-locked semiconductor laser element 10 is provided on a non-polar surface or a semi-polar surface, the limit for the thickness of the quantum well layer (from 1 nm to 10 nm) and the limit for the impurity doping density of the barrier layer (from $2 \times 10^{18}$ cm$^{-3}$ to $1 \times 10^{20}$ cm$^{-3}$) described in Embodiment 15 can be eliminated.

The present disclosure may have a configuration as follows.

[A01] <<Semiconductor-Laser-Device Assembly>>

A semiconductor-laser-device assembly includes a mode-locked semiconductor-laser-element assembly including a mode-locked semiconductor laser element, and a dispersion compensation optical system, on which laser light emitted from the mode-locked semiconductor laser element is incident and from which the laser light is emitted, and a semiconductor optical amplifier having a layered structure body including a group III-V nitride-based semiconductor layer or a layered structure body including a wide-gap semiconductor layer, the semiconductor optical amplifier configured to amplify the laser light emitted from the mode-locked semiconductor-laser-element assembly.

[A02] in the Semiconductor-Laser-Device Assembly Described in [A01], $\tau_1 > \tau_2$ is established, where $\tau_1$ is a pulse time width of the laser light incident on the semiconductor optical amplifier and $\tau_2$ is a pulse time width of the laser light output from the semiconductor optical amplifier, and a value of $\tau_2$ decreases as a driving current value of the semiconductor optical amplifier increases.

[A03] In the semiconductor-laser-device assembly described in [A01] or [A02], the laser light output from the semiconductor optical amplifier has an optical spectrum width of 4.5 THz or larger.

[A04] In the semiconductor-laser-device assembly described in any of [A01] to [A03], the semiconductor optical amplifier has a driving current density of $5 \times 10^3$ amperes/cm$^2$ or higher.

[A05] In the semiconductor-laser-device assembly described in any of [A01] to [A04], the semiconductor optical amplifier has an optical confinement factor of 3% or smaller.

[A06] In the semiconductor-laser-device assembly described in any of [A01] to [A05], an optical spectrum width of the laser light output from the semiconductor optical amplifier is increased with respect to an optical spectrum width of the laser light incident on the semiconductor optical amplifier by 2.5 THz or more.

[A07] In the semiconductor-laser-device assembly described in any of [A01] to [A06], the mode-locked semiconductor laser element is a current-injection mode-locked semiconductor laser element having a light density of a peak power of $1 \times 10^{10}$ watts/cm$^2$ or higher and a carrier density of $1 \times 10^{19}$/cm$^3$ or higher.

[A08] In the semiconductor-laser-device assembly described in any of [A01] to [A07], the dispersion compensation optical system has a group-velocity dispersion value being negative.

[A09] In the semiconductor-laser-device assembly described in any of [A01] to [A07], the semiconductor-laser-device assembly is operated with a group-velocity dispersion value that causes the pulse time width of the laser light emitted to the semiconductor optical amplifier to be a minimum value, or is operated with a value around the group-velocity dispersion value.

[A10] In the semiconductor-laser-device assembly described in any of [A01] to [A07], when a group-velocity dispersion value in the dispersion compensation optical system is monotonically changed from a first predetermined value GVD$_1$ to a second predetermined value GVD$_2$, if |GVD$_1$|<|GVD$_2$|, a pulse time width of the laser light emitted from the mode-locked semiconductor-laser-element assembly and being incident on the semiconductor optical amplifier is decreased, exceeds a minimum value PW$_{min}$, and is increased.

[A11] In the semiconductor-laser-device assembly described in [A10], an expression is satisfied as follows:

$(PW_1 - PW_{min})/|GVD_{min} - GVD_1| \geq 2 \times (PW_2 - PW_{min})/|GVD_2 - GVD_{min}|$, if $|GVD_1/GVD_{min}| = 0.5$, and $|GVD_2/GVD_{min}| = 2$, where GVD$_{min}$ is a group-velocity dispersion minimum value of the dispersion compensation optical system when the pulse time width of the laser light emitted to the semiconductor optical amplifier is the minimum value PW$_{min}$, PW$_1$ is a pulse time width of the laser light when the group-velocity dispersion value in the dispersion compensation optical system is the first predetermined value GVD$_1$ being negative, and PW$_2$ is a pulse time width of the laser light when the group-velocity dispersion value in the dispersion compensation optical system is the second predetermined value GVD$_2$ being negative.

[A12] In the semiconductor-laser-device assembly described in [A10] or [A11], the semiconductor-laser-device assembly is operated with a group-velocity dispersion minimum value GVD$_{min}$ that causes the pulse time width of the laser light emitted to the semiconductor optical amplifier to be the minimum value $PW_{min}$, or is operated with a value around the group-velocity dispersion minimum value $GVD_{min}$.

[A13] In the semiconductor-laser-device assembly described in any of [A10] to [A12], the laser light incident on the semiconductor optical amplifier has a noise component, with respect to a main oscillation frequency, of −60 dB or lower.

[A14] In the semiconductor-laser-device assembly described in any of [A01] to [A13], the laser light output from the mode-locked semiconductor-laser-element assembly has a frequency chirp being negative and a pulse time width of 0.5 picoseconds or smaller.

[A15] In the semiconductor-laser-device assembly described in any of [A01] to [A14], the mode-locked semiconductor laser element has a repetition frequency of the laser light of 1 GHz or lower.

[A16] In the semiconductor-laser-device assembly described in any of [A01] to [A15], the mode-locked semiconductor laser element has a saturable absorption region.

[A17] In the semiconductor-laser-device assembly described in any of [A01] to [A16],
the mode-locked semiconductor laser element has a layered structure body formed by successively stacking layers, the layers including
a first compound semiconductor layer made of a GaN-based compound semiconductor and having a first conductivity type,
a third compound semiconductor layer made of a GaN-based compound semiconductor, and
a second compound semiconductor layer made of a GaN-based compound semiconductor and having a second conductivity type which is different from the first conductivity type.

[A18] In the semiconductor-laser-device assembly described in any of [A01] to [A17], the laser light emitted from the mode-locked semiconductor laser element is incident on the dispersion compensation optical system, part of the laser light incident on the dispersion compensation optical system is emitted from the dispersion compensation optical system and is fed back to the mode-locked semiconductor laser element, and the residual part of the laser light incident on the dispersion compensation optical system is incident on the semiconductor optical amplifier.

[A19] The semiconductor-laser-device assembly described in any of [A01] to [A18], further includes an optical spectrum shaping portion that shapes an optical spectrum of the laser light emitted from the mode-locked semiconductor-laser-element assembly, and the laser light after shaping is incident on the semiconductor optical amplifier.

[A20] In the semiconductor-laser-device assembly described in [A19],
the optical spectrum shaping portion is formed of a band pass filter having a dielectric multilayer film, and
the laser light emitted form the mode-locked semiconductor-laser-element assembly passes through the band pass filter a plurality of times.

[A21] In the semiconductor-laser-device assembly described in [A20], the band pass filter is formed of a dielectric multilayer film resonator containing a single half-wavelength resonator.

[A22] In the semiconductor-laser-device assembly described in [A20], the band pass filter is formed of a dielectric multilayer film resonator containing a plurality of half-wavelength resonators.

[A23] In the semiconductor-laser-device assembly described in [A20], the band pass filter is formed of a dielectric multilayer film resonator containing a resonator with a wavelength that is an integral multiple of half-wavelength.

[A24] In the semiconductor-laser-device assembly described in [A20], the band pass filter is formed of a band pass filter in which a shift from a Gaussian function is 20% or less as compared with an area of an optical spectrum by the Gaussian function, for a lower optical spectrum than a half maximum of an optical spectrum peak of the laser light, which has passed through the band pass filter.

[B01]<<Dispersion Compensation Optical Device According to First Form>>
In the semiconductor-laser-device assembly described in any of [A01] to [A24],
the dispersion compensation optical system is formed of a dispersion compensation optical device including a first transmission volume hologram diffraction grating and a second transmission volume hologram diffraction grating arranged to face each other, and
in each transmission volume hologram grating, the sum of an incidence angle of laser light and an emission angle of first-order diffracted light is 90 degrees.

[B02] In the semiconductor-laser-device assembly described in [B01], in the first transmission volume hologram diffraction grating on which the laser light is incident from the mode-locked semiconductor laser element, the emission angle of the first-order diffracted light is larger than the incidence angle of the laser light.

[B03]<<Dispersion Compensation Optical Device According to Second Form>>
In the semiconductor-laser-device assembly described in any of [A01] to [A24],
the dispersion compensation optical system is formed of a dispersion compensation optical device including a first transmission volume hologram diffraction grating and a second transmission volume hologram diffraction grating arranged to face each other, and
in each transmission volume hologram grating, an incidence angle of laser light is substantially equal to an emission angle of first-order diffracted light.

[B04] In the semiconductor-laser-device assembly described in [B03], the sum of the incidence angle of the laser light and the emission angle of the first-order diffracted light is 90 degrees.

[B05] In the semiconductor-laser-device assembly described in any of [B01] to [B04], the laser light incident on the first transmission volume hologram diffraction grating is diffracted by the first transmission volume hologram diffraction grating, is emitted as first-order diffracted light, and is further incident on the second transmission volume hologram diffraction grating, is diffracted by the second transmission volume hologram diffraction grating, and is emitted as first-order diffracted light to the outside of the system.

[B06] The semiconductor-laser-device assembly described in [B05], further includes
a first reflecting mirror and a second reflecting mirror arranged in parallel to each other, and
the laser light emitted from the second transmission volume hologram diffraction grating collides with and be reflected by the first reflecting mirror, and then collides with and be reflected by the second reflecting mirror.

[B07] In the semiconductor-laser-device assembly described in [B06], the laser light reflected by the second reflecting mirror is substantially located on an extension line of the laser light incident on the first transmission volume hologram diffraction grating.

[B08] In the semiconductor-laser-device assembly described in any of [B01] to [B04], the first transmission volume hologram diffraction grating is provided on a first surface of a base member, and the second transmission volume hologram diffraction grating is provided on a second surface opposite to the first surface of the base member.

[B09] The semiconductor-laser-device assembly described in any of [B01] to [B04], further includes a reflecting mirror, the laser light incident on the first transmission volume hologram diffraction grating is diffracted by the first transmission volume hologram diffraction grating, is emitted as first-order diffracted light, is further incident on the second transmission volume hologram diffraction grating, is diffracted by the second transmission volume hologram diffraction grating, is emitted as first-order diffracted light, and collides with the reflecting mirror, and the laser light reflected by the reflecting mirror is incident on the second transmission volume hologram diffraction grating again, is diffracted by the second transmission volume hologram diffraction grating, is emitted as first-order diffracted light, is further incident on the first transmission volume hologram diffraction grating again, is diffracted by the first transmission volume hologram diffraction grating, and is emitted to the outside of the system.

[B10] The semiconductor-laser-device assembly described in any of [B01] to [B04], further includes a partially reflecting mirror, the laser light incident on the first transmission volume hologram grating is diffracted and reflected by the first transmission volume hologram grating, is emitted as first-order diffracted light, is further incident on the second transmission volume hologram grating, is diffracted by the second transmission volume hologram grating, is emitted as first-order diffracted light, collides with the partially reflecting mirror, part of the light is emitted to the outside of the system, the residual part of the light is emitted as first-order diffracted light, the light is incident on the second transmission volume hologram grating again, is diffracted by the second transmission volume hologram grating, is emitted as first-order diffracted light, is further incident on the first transmission volume hologram grating again, and is diffracted by the first transmission volume hologram grating.

[B11] In the semiconductor-laser-device assembly described in any of [B01] to [B10], the group-velocity dispersion value is changed by changing a distance between the two transmission volume hologram diffraction gratings.

[B12] <<Dispersion Compensation Optical Device According to Third Form>>

In the semiconductor-laser-device assembly described in any of [A01] to [A24], the dispersion compensation optical system is formed of a dispersion compensation optical device including a transmission volume hologram diffraction grating and a reflecting mirror, in the transmission volume hologram diffraction grating, the sum of an incidence angle of laser light and an emission angle of first-order diffracted light is 90 degrees, or the incidence angle of the laser light is substantially equal to the emission angle of the first-order diffracted light, and the laser light emitted from the semiconductor laser element is incident on the transmission volume hologram diffraction grating, is diffracted, is emitted as first-order diffracted light, collides with the reflecting mirror, is reflected by the reflecting mirror, is incident on the transmission volume hologram diffraction grating again, is diffracted, and is emitted to the outside of the system.

[B13] In the semiconductor-laser-device assembly described in [B12], the group-velocity dispersion value is changed by changing a distance between the transmission volume hologram diffraction grating and the reflecting mirror.

[B14] In the semiconductor-laser-device assembly described in any of [B01] to [B13], the transmission volume hologram diffraction grating has a structure, in which a diffraction grating member is arranged between two glass substrates, and Expression (A) is satisfied as follows:

$$|1-\cos(\theta_{in}+\theta_{out})|/\cos(\theta_{out})| \leq \{0.553/(\pi \cdot N \cdot L)\}(\lambda^2/\Delta\lambda) \quad (A)$$

where $\lambda$ is a wavelength of the laser light incident on the diffraction grating member, $\Delta\lambda$ is a laser-light spectrum width, $\theta_{in}$ is an incidence angle of the laser light incident on the diffraction grating member, $\theta_{out}$ is a diffraction angle, N is a refractive index of the glass substrates, and L is a thickness of the diffraction grating member.

[B15] In the semiconductor-laser-device assembly described in [B14],

Expression (B) is satisfied as follows:

$$\{(0.8+2m)\cdot\lambda/\Delta n\} \cdot \{\cos(\theta_{in})\cdot\cos(\theta_{out})\}^{1/2} \leq L \leq \{(1.2+2m)\cdot\lambda/\Delta n\} \cdot \{\cos(\theta_{in})\cdot\cos(\theta_{out})\}^{1/2} \quad (B)$$

where m is an integer, and $\Delta n$ is a refractive-index modulation ratio in the diffraction grating member.

[C01] <<Semiconductor Optical Amplifier with First Configuration>>

In the semiconductor-laser-device assembly described in any of [A01] to [B15], in the dispersion compensation optical system, the first compound semiconductor layer has a layered structure including a first cladding layer and a first optical guide layer staked from a base-member side, the layered structure body has a ridge-stripe structure including the second compound semiconductor layer, the third compound semiconductor layer, and a portion in a thickness direction of the first optical guide layer, and expressions are satisfied as follows:

$$6\times10^{-7} \text{ m} < t_1, \text{ and}$$

$$0 \text{ (m)} < t_1' \leq 0.5 \cdot t_1,$$

where $t_1$ is a thickness of the first optical guide layer, and $t_1'$ is a thickness of the portion of the first optical guide layer forming the ridge-stripe structure.

[C02] In the semiconductor-laser-device assembly described in [C01], an expression is satisfied as follows:

$$t_1 \leq 3\times10^{-6} \text{ m}.$$

[C03] In the semiconductor-laser-device assembly described in [C01] or [C02], the semiconductor optical amplifier outputs a single-mode light beam.

[C04] In the semiconductor-laser-device assembly described in any of [C01] to [C03], an expression is satisfied as follows:

$$0.2 \leq LB_Y/LB_X \leq 1.2,$$

where $LB_X$ is a dimension in a width direction of the ridge-stripe structure of the light beam emitted from a light-emission end surface of the layered structure body, and $LB_Y$ is a dimension in a thickness direction of the ridge-stripe structure.

[C05] In the semiconductor-laser-device assembly described in any of [C01] to [C04],
a distance $Y_{CC}$ from the central point of the active layer in the layered structure body to the central point of the light beam emitted from the layered structure body along the thickness direction of the ridge-stripe structure at the light-emission end surface of the layered structure body satisfies an expression as follows:

$$t_1' \leq Y_{CC} \leq t_1.$$

[C06] In the semiconductor-laser-device assembly described in any of [C01] to [C05], a high-refractive-index layer made of a compound semiconductor material having a higher refractive index than a refractive index of a compound semiconductor material forming the first optical guide layer is formed in the first optical guide layer.

[C07] In the semiconductor-laser-device assembly described in [C06], an expression is satisfied as follows:

$$0.0 \leq n_{HR} - n_{G-1} \leq 0.1,$$

where $n_{G-1}$ is a refractive index of the compound semiconductor material forming the first optical guide layer, and $n_{HR}$ is a refractive index of the compound semiconductor material forming the high-refractive-index layer.

[C08] In the semiconductor-laser-device assembly described in any of [C01] to [C07],
the second compound semiconductor layer has a layered structure body including a second optical guide layer and a second cladding layer staked from a base-member side, and
the first optical guide layer has a larger thickness than a thickness of the second optical guide layer.

[D01]<<Semiconductor Optical Amplifier with Second Configuration>>

In the semiconductor-laser-device assembly described in any of [A01] to [B15],
in the dispersion compensation optical system,
the layered structure body has a ridge-stripe structure including at least a portion in the thickness direction of the second compound semiconductor layer,
the first compound semiconductor layer has a thickness larger than 0.6 and
a high-refractive-index layer made of a compound semiconductor material having a higher refractive index than a refractive index of a compound semiconductor material forming the first compound semiconductor layer is formed in the first compound semiconductor layer.

[D02] In the semiconductor-laser-device assembly described in [D01],
the first compound semiconductor layer has a layered structure body including a first cladding layer and a first optical guide layer staked from a base-member side, and
the first optical guide layer has a thickness larger than 0.6 and
the high-refractive-index layer is formed in the first optical guide layer.

[D03] In the semiconductor-laser-device assembly described in [D02], a distance from the interface between an active layer and the first optical guide layer to the interface between a portion of the first optical guide layer located at an active-layer side and the high-refractive-index layer is 0.25 μm or larger.

[D04] In the semiconductor-laser-device assembly described in [D02] or [D03],
an expression is satisfied as follows:

$$0 < n_{HR} - n_{G-1} \leq 0.3,$$

where $n_{G-1}$ is a refractive index of the compound semiconductor material forming the first optical guide layer, and $n_{HR}$ is a refractive index of the compound semiconductor material forming the high-refractive-index layer.

[D05] In the semiconductor-laser-device assembly described in any of [D01] to [D04], the semiconductor optical amplifier outputs a single-mode light beam.

[D06] In the semiconductor-laser-device assembly described in any of [D02] to [D05],
the second compound semiconductor layer has a layered structure body including a second optical guide layer and a second cladding layer staked from a base-member side, and
the first optical guide layer has a larger thickness than a thickness of the second optical guide layer.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A semiconductor-laser-device assembly comprising:
    a semiconductor laser element,
    a dispersion compensation optical system configured to receive laser light emitted from the semiconductor laser element, and
    a semiconductor optical amplifier having a layered structure body including a group III-V nitride-based semiconductor layer,
    wherein the semiconductor optical amplifier is configured to receive a portion of the laser light incident on the dispersion compensation optical system and to amplify the laser light,
    wherein the dispersion compensation optical system includes a diffraction grating.

2. The semiconductor-laser-device assembly according to claim 1,
    wherein the semiconductor laser element includes a mode-locked semiconductor laser element.

3. The semiconductor-laser-device assembly according to claim 1, further comprising a reflecting mirror, and wherein a dispersion compensation amount of the dispersion compensation optical system is configured to be changed by changing a distance between the diffraction grating and the reflecting mirror.

4. The semiconductor-laser-device assembly according to claim 1,
    wherein the diffraction grating includes a first diffraction grating and a second diffraction grating, and wherein the first diffraction grating is arranged in parallel to the second diffraction grating.

5. The semiconductor-laser-device assembly according to claim 4,
    wherein a group-velocity dispersion value of the dispersion compensation optical system is configured to be changed by changing a distance between the first diffraction grating and the second diffraction grating.

6. The semiconductor-laser-device assembly according to claim 1,
    wherein $\tau_1 > \tau_2$ is established,
    where $\tau_1$ is a pulse time width of the laser light incident on the semiconductor optical amplifier and $\tau_2$ is a pulse time width of the laser light output from the semiconductor optical amplifier, and
    wherein a value of $\tau_2$ decreases as a driving current value of the semiconductor optical amplifier increases.

7. The semiconductor-laser-device assembly according to claim 1, wherein the laser light output from the semiconductor optical amplifier has an optical spectrum width of 4.5 THz or larger.

8. The semiconductor-laser-device assembly according to claim 1, wherein the semiconductor optical amplifier has a driving current density of $5 \times 10^3$ amperes/cm$^2$ or higher.

9. The semiconductor-laser-device assembly according to claim 1, wherein the semiconductor optical amplifier has an optical confinement factor of 3% or smaller.

10. The semiconductor-laser-device assembly according to claim 1, wherein the laser light output from the semiconductor-laser-element assembly includes a frequency chirp being negative and a pulse time width of 0.5 picoseconds or smaller.

11. The semiconductor-laser-device assembly according to claim 1, wherein the laser light includes a repetition frequency of 1 GHz or lower.

12. A semiconductor-laser-device assembly comprising:
   a semiconductor laser element,
   a dispersion compensation optical system configured to receive laser light emitted from the semiconductor laser element, and
   a semiconductor optical amplifier having a layered structure body including a group III-V nitride-based semiconductor layer,
   wherein the semiconductor optical amplifier is configured to receive a portion of the laser light incident on the dispersion compensation optical system and to amplify the laser light,
   wherein the dispersion compensation optical system includes a prism.

13. The semiconductor-laser-device assembly according to claim 12, further comprising a reflecting mirror, and wherein a dispersion compensation amount of the dispersion compensation optical system is configured to be changed by changing a distance between the prism and the reflecting mirror.

14. The semiconductor-laser-device assembly according to claim 12,
   wherein the prism includes a first prism and a second prism, and wherein the first prism and the second prism are arranged in a point symmetric manner.

15. The semiconductor-laser-device assembly according to claim 14,
   wherein a group-velocity dispersion value of the dispersion compensation optical system is configured to be changed by changing a distance between the first prism and the second prism.

16. The semiconductor-laser-device assembly according to claim 12, wherein the laser light output from the semiconductor optical amplifier has an optical spectrum width of 4.5 THz or larger.

17. A semiconductor-laser-device assembly comprising:
   a semiconductor laser element,
   a dispersion compensation optical system configured to receive laser light emitted from the semiconductor laser element, and
   a semiconductor optical amplifier having a layered structure body including a group III-V nitride-based semiconductor layer,
   wherein the semiconductor optical amplifier is configured to receive a portion of the laser light incident on the dispersion compensation optical system and to amplify the laser light,
   wherein the dispersion compensation optical system includes a Gires-Tournois interferometer.

18. The semiconductor-laser-device assembly according to claim 17, wherein the Gires-Tournois interferometer includes a reflecting mirror with a reflectivity of 1 and a partially reflecting mirror with a reflectivity smaller than 1.

19. The semiconductor-laser-device assembly according to claim 18,
   wherein a group-velocity dispersion value of the dispersion compensation optical system is configured to be changed by changing a distance between the reflecting mirror and the partially reflecting mirror or by adjusting an incidence angle of the laser light.

20. The semiconductor-laser-device assembly according to claim 17, wherein the laser light output from the semiconductor optical amplifier has an optical spectrum width of 4.5 THz or larger.

* * * * *